United States Patent
Stuber et al.

(10) Patent No.: US 12,520,525 B2
(45) Date of Patent: *Jan. 6, 2026

(54) METHOD AND APPARATUS IMPROVING GATE OXIDE RELIABILITY BY CONTROLLING ACCUMULATED CHARGE

(71) Applicant: pSemi Corporation, San Diego, CA (US)

(72) Inventors: Michael A. Stuber, Carlsbad, CA (US); Christopher N. Brindle, Poway, CA (US); Dylan J. Kelly, San Diego, CA (US); Clint L. Kemerling, Escondido, CA (US); George P. Imthurn, San Diego, CA (US); Robert B. Welstand, San Diego, CA (US); Mark L. Burgener, San Diego, CA (US); Alexander Dribinsky, Naperville, IL (US); Tae-Youn Kim, Irvine, CA (US)

(73) Assignee: pSemi Corporation, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/439,664

(22) Filed: Feb. 12, 2024

(65) Prior Publication Data

US 2024/0266441 A1 Aug. 8, 2024

Related U.S. Application Data

(60) Continuation of application No. 17/549,839, filed on Dec. 13, 2021, now Pat. No. 11,901,459, which is a
(Continued)

(51) Int. Cl.
*H10D 30/67* (2025.01)
*H03K 17/16* (2006.01)
*H10D 86/00* (2025.01)

(52) U.S. Cl.
CPC ....... *H10D 30/6711* (2025.01); *H03K 17/162* (2013.01); *H10D 30/6739* (2025.01);
(Continued)

(58) Field of Classification Search
CPC ....... B01L 3/502707; B01L 2300/0851; B01L 2300/046; B01L 2300/0663;
(Continued)

(56) References Cited

U.S. PATENT DOCUMENTS 638,863 A 12/1899 Chatham
852,462 A 5/1907 Seubert
(Continued)

FOREIGN PATENT DOCUMENTS

CN 1256521 6/2000
DE 4236847 5/1994
(Continued)

OTHER PUBLICATIONS

U.S. Appl. No. 10/074,746, filed Sep. 11, 2018, Christopher N. Brindle.
(Continued)

*Primary Examiner* — Binh C Tat
(74) *Attorney, Agent, or Firm* — Haynes and Boone, LLP

(57) ABSTRACT

A method and apparatus are disclosed for use in improving gate oxide reliability of semiconductor-on-insulator (SOI) metal-oxide-silicon field effect transistor (MOSFET) devices using accumulated charge control (ACC) techniques. The method and apparatus are adapted to remove, reduce, or otherwise control accumulated charge in SOI MOSFETs, thereby yielding improvements in FET performance characteristics. In one embodiment, a circuit includes a MOSFET, operating in an accumulated charge regime, and means for controlling the accumulated charge. Determinations are made of effects of an uncontrolled accumulated
(Continued)

charge and a controlled accumulated charge on time dependent dielectric breakdown (TDDB) of the gate oxide. The SOI MOSFET is adapted to have a selected average time-to-breakdown, responsive to the determinations, and the circuit is operated using techniques for ACC operatively coupled to the SOI MOSFET. In one embodiment, the ACC techniques include using an accumulated charge sink operatively coupled to the SOI MOSFET body.

20 Claims, 23 Drawing Sheets

Related U.S. Application Data continuation of application No. 16/739,081, filed on Jan. 9, 2020, now Pat. No. 11,201,245, which is a continuation of application No. 15/419,898, filed on Jan. 30, 2017, now Pat. No. 10,818,796, which is a continuation of application No. 13/948,094, filed on Jul. 22, 2013, now Pat. No. 9,608,619, which is a continuation of application No. 13/028,144, filed on Feb. 15, 2011, now Pat. No. 8,954,902, which is a division of application No. 11/520,912, filed on Sep. 14, 2006, now Pat. No. 7,890,891, which is a continuation-in-part of application No. 11/484,370, filed on Jul. 10, 2006, now Pat. No. 7,910,993.

(60) Provisional application No. 60/718,260, filed on Sep. 15, 2005, provisional application No. 60/698,523, filed on Jul. 11, 2005.

(52) U.S. Cl.
CPC ..... *H10D 30/6743* (2025.01); *H10D 30/6744* (2025.01); *H10D 30/6759* (2025.01); *H10D 86/201* (2025.01)

(58) Field of Classification Search
CPC ......... B01L 2400/086; B01L 3/502761; B01L 2300/022; B01L 2300/0609; B01L 2300/0861; B01L 2300/0896; B01L 2400/0406; B01L 2400/0427; B01L 2400/0487; B01L 2400/0655; B01L 3/50255; B01L 3/50273; B01L 3/502792; B01L 3/50825; B01L 3/5453; H01L 29/78615; H01L 29/4908; H01L 29/78651; H01L 29/78654; H01L 29/78657; H01L 29/78; H01L 29/42324; H01L 2924/00; H01L 29/78684; H01L 29/78681; H01L 29/1095; H01L 2924/13091; H01L 24/82; H01L 2924/1433; H01L 24/18; H01L 23/5223; H01L 23/3192; H01L 2924/13063; G06F 1/163; G06F 3/012; G06F 3/013; H10D 30/6706; H10D 30/6741; H10D 30/675; H10D 30/6739; H10D 30/6744; H10D 30/6759; H10D 30/6891; H10D 30/711; H10D 30/6743; H10D 30/6755; H10D 30/6758; H10D 30/4755; H10D 30/6757; H10D 30/683; H10D 30/6893; H10D 30/87; H10D 30/015; H10D 30/475
USPC .......... 716/100–106; 257/345–350
See application file for complete search history.

(56) References Cited

U.S. PATENT DOCUMENTS

| | | |
|---|---|---|
| 951,847 A | 3/1910 | Seubert |
| 1,282,888 A | 10/1918 | Lippincott |
| 1,287,225 A | 12/1918 | Cheney |
| 1,487,185 A | 3/1924 | George |
| 1,494,638 A | 5/1924 | Sheldon |
| 1,507,586 A | 9/1924 | Cooper |
| 2,120,533 A | 6/1938 | Earle |
| 2,431,810 A | 12/1947 | Knaak |
| 3,124,396 A | 3/1964 | Barager |
| 3,455,616 A | 7/1969 | George |
| 3,470,443 A | 9/1969 | Berry |
| 3,646,361 A | 2/1972 | Pfiffner |
| 3,699,359 A | 10/1972 | Shelby |
| 3,731,112 A | 5/1973 | Smith |
| 3,790,239 A | 2/1974 | Laux |
| 3,843,217 A | 10/1974 | Henning |
| 3,878,450 A | 4/1975 | Greatbatch |
| 3,942,047 A | 3/1976 | Buchanan |
| 3,943,428 A | 3/1976 | Whidden |
| 3,955,353 A | 5/1976 | Astle |
| 3,975,671 A | 8/1976 | Stoll |
| 3,983,414 A | 9/1976 | Stafford |
| 3,988,727 A | 10/1976 | Scott |
| 4,047,091 A | 9/1977 | Hutchines |
| 4,053,916 A | 10/1977 | Cricchi |
| 4,061,929 A | 12/1977 | Asano |
| 4,068,295 A | 1/1978 | Portmann |
| 4,079,336 A | 3/1978 | Gross |
| 4,080,018 A | 3/1978 | Traut |
| 4,106,086 A | 8/1978 | Holbrook |
| 4,139,826 A | 2/1979 | Pradal |
| 4,145,719 A | 3/1979 | Hand |
| 4,174,141 A | 11/1979 | Reiss |
| 4,186,436 A | 1/1980 | Ishiwatari |
| 4,241,316 A | 12/1980 | Knapp |
| 4,244,000 A | 1/1981 | Ueda |
| 4,256,977 A | 3/1981 | Hendrickson |
| 4,316,101 A | 2/1982 | Minner |
| 4,317,055 A | 2/1982 | Yoshida |
| 4,321,661 A | 3/1982 | Sano |
| 4,367,421 A | 1/1983 | Baker |
| 4,390,798 A | 6/1983 | Kurafuji |
| 4,460,952 A | 7/1984 | Risinger |
| RE31,749 E | 11/1984 | Yamashiro |
| 4,485,433 A | 11/1984 | Topich |
| 4,559,709 A | 12/1985 | Beseme |
| 4,621,315 A | 11/1986 | Vaughn |
| 4,633,106 A | 12/1986 | Backes |
| 4,638,184 A | 1/1987 | Kimura |
| 4,679,134 A | 7/1987 | Bingham |
| 4,703,196 A | 10/1987 | Arakawa |
| 4,736,169 A | 4/1988 | Weaver |
| 4,739,191 A | 4/1988 | Puar |
| 4,746,960 A | 5/1988 | Valeri |
| 4,748,485 A | 5/1988 | Vasudev |
| 4,752,699 A | 6/1988 | Cranford, Jr. |
| 4,769,784 A | 9/1988 | Doluca |
| 4,777,577 A | 10/1988 | Bingham |
| 4,795,279 A | 1/1989 | Smith |
| 4,799,809 A | 1/1989 | Kuroiwa |
| 4,809,056 A | 2/1989 | Shirato |
| 4,810,911 A | 3/1989 | Noguchi |
| 4,825,145 A | 4/1989 | Tanaka |
| 4,839,787 A | 6/1989 | Kojima |
| 4,847,519 A | 7/1989 | Wahl |
| 4,849,651 A | 7/1989 | Estes, Jr. |
| 4,859,090 A | 8/1989 | Smith |
| 4,883,976 A | 11/1989 | Deane |
| 4,890,077 A | 12/1989 | Sun |
| 4,891,609 A | 1/1990 | Eilley |
| 4,893,070 A | 1/1990 | Milberger |
| 4,897,774 A | 1/1990 | Bingham |
| 4,906,587 A | 3/1990 | Blake |
| 4,929,855 A | 5/1990 | Ezzeddine |
| 4,939,485 A | 7/1990 | Eisenberg |

(56) References Cited

U.S. PATENT DOCUMENTS

| | | |
|---|---|---|
| 4,984,040 A | 1/1991 | Yap |
| 4,985,647 A | 1/1991 | Kawada |
| 4,999,585 A | 3/1991 | Burt |
| 5,001,528 A | 3/1991 | Bahraman |
| 5,012,123 A | 4/1991 | Ayasli |
| 5,023,494 A | 6/1991 | Tsukii |
| 5,029,282 A | 7/1991 | Ito |
| 5,032,799 A | 7/1991 | Milberger |
| 5,038,325 A | 8/1991 | Douglas |
| 5,041,797 A | 8/1991 | Belcher |
| 5,061,907 A | 10/1991 | Rasmussen |
| 5,061,911 A | 10/1991 | Weidman |
| 5,068,626 A | 11/1991 | Takagi |
| 5,081,371 A | 1/1992 | Wong |
| 5,081,706 A | 1/1992 | Kim |
| 5,095,348 A | 3/1992 | Houston |
| 5,107,152 A | 4/1992 | Jain |
| 5,111,375 A | 5/1992 | Marshall |
| 5,123,756 A | 6/1992 | Amen |
| 5,124,762 A | 6/1992 | Childs |
| 5,125,007 A | 6/1992 | Yamaguchi |
| 5,126,590 A | 6/1992 | Chern |
| 5,138,190 A | 8/1992 | Yamazaki |
| 5,146,178 A | 9/1992 | Nojima |
| 5,148,393 A | 9/1992 | Furuyama |
| 5,157,279 A | 10/1992 | Lee |
| 5,182,529 A | 1/1993 | Chern |
| 5,193,198 A | 3/1993 | Yokouchi |
| 5,208,557 A | 5/1993 | Kersh, III |
| 5,212,456 A | 5/1993 | Kovalcik |
| 5,272,457 A | 12/1993 | Heckaman |
| 5,274,343 A | 12/1993 | Russell |
| 5,283,457 A | 2/1994 | Matloubian |
| 5,285,367 A | 2/1994 | Keller |
| 5,306,954 A | 4/1994 | Chan |
| 5,313,083 A | 5/1994 | Schindler |
| 5,317,181 A | 5/1994 | Tyson |
| 5,319,604 A | 6/1994 | Imondi |
| 5,345,422 A | 9/1994 | Redwine |
| 5,349,306 A | 9/1994 | Apel |
| 5,350,957 A | 9/1994 | Cooper |
| 5,375,256 A | 12/1994 | Yokoyama |
| 5,375,257 A | 12/1994 | Lampen |
| 5,392,186 A | 2/1995 | Alexander |
| 5,392,205 A | 2/1995 | Zavaleta |
| 5,405,795 A | 4/1995 | Beyer |
| 5,416,043 A | 5/1995 | Burgener |
| 5,422,586 A | 6/1995 | Tedrow |
| 5,422,590 A | 6/1995 | Coffman |
| 5,442,327 A | 8/1995 | Longbrake |
| 5,446,418 A | 8/1995 | Hara |
| 5,448,207 A | 9/1995 | Kohama |
| 5,455,794 A | 10/1995 | Javanifard |
| 5,465,061 A | 11/1995 | Dufour |
| 5,477,184 A | 12/1995 | Uda |
| 5,488,243 A | 1/1996 | Tsuruta |
| 5,492,857 A | 2/1996 | Reedy |
| 5,493,249 A | 2/1996 | Manning |
| 5,519,360 A | 5/1996 | Keeth |
| 5,535,160 A | 7/1996 | Yamaguchi |
| 5,548,239 A | 8/1996 | Kohama |
| 5,553,012 A | 9/1996 | Buss |
| 5,553,295 A | 9/1996 | Pantelakis |
| 5,554,892 A | 9/1996 | Norimatsu |
| 5,559,368 A | 9/1996 | Hu |
| 5,572,040 A | 11/1996 | Reedy |
| 5,576,647 A | 11/1996 | Sutardja |
| 5,578,853 A | 11/1996 | Hayashi |
| 5,581,106 A | 12/1996 | Hayashi |
| 5,587,604 A | 12/1996 | Machesney |
| 5,589,793 A | 12/1996 | Kassapian |
| 5,594,371 A | 1/1997 | Douseki |
| 5,596,205 A | 1/1997 | Reedy |
| 5,597,739 A | 1/1997 | Sumi |
| 5,600,169 A | 2/1997 | Burgener |
| 5,600,588 A | 2/1997 | Kawashima |
| 5,610,533 A | 3/1997 | Arimoto |
| 5,629,655 A | 5/1997 | Dent |
| 5,663,570 A | 9/1997 | Reedy |
| 5,670,907 A | 9/1997 | Gorecki |
| 5,672,992 A | 9/1997 | Nadd |
| 5,677,649 A | 10/1997 | Martin |
| 5,681,761 A | 10/1997 | Kim |
| 5,689,144 A | 11/1997 | Williams |
| 5,694,308 A | 12/1997 | Cave |
| 5,698,869 A | 12/1997 | Yoshimi |
| 5,698,877 A | 12/1997 | Gonzalez |
| 5,699,018 A | 12/1997 | Yamamoto |
| 5,717,356 A | 2/1998 | Kohama |
| 5,727,721 A | 3/1998 | Guido |
| 5,729,039 A | 3/1998 | Beyer |
| 5,731,607 A | 3/1998 | Kohama |
| 5,734,291 A | 3/1998 | Tasdighi |
| 5,748,016 A | 5/1998 | Kurosawa |
| 5,748,053 A | 5/1998 | Kameyama |
| 5,753,955 A | 5/1998 | Fechner |
| 5,757,170 A | 5/1998 | Pinney |
| 5,760,652 A | 6/1998 | Maemura |
| 5,767,549 A | 6/1998 | Chen |
| 5,767,721 A | 6/1998 | Crampton |
| 5,774,411 A | 6/1998 | Hsieh |
| 5,774,792 A | 6/1998 | Tanaka |
| 5,777,530 A | 7/1998 | Nakatuka |
| 5,784,311 A | 7/1998 | Assaderaghi |
| 5,784,687 A | 7/1998 | Itoh |
| 5,786,617 A | 7/1998 | Merrill |
| 5,793,246 A | 8/1998 | Vest |
| 5,801,577 A | 9/1998 | Tailliet |
| 5,804,858 A | 9/1998 | Hsu |
| 5,807,772 A | 9/1998 | Takemura |
| 5,808,505 A | 9/1998 | Tsukada |
| 5,812,939 A | 9/1998 | Kohama |
| 5,814,899 A | 9/1998 | Okumura |
| 5,818,099 A | 10/1998 | Burghartz |
| 5,818,278 A | 10/1998 | Yamamoto |
| 5,818,283 A | 10/1998 | Tonami |
| 5,818,289 A | 10/1998 | Chevallier |
| 5,818,766 A | 10/1998 | Song |
| 5,821,769 A | 10/1998 | Douseki |
| 5,821,800 A | 10/1998 | Le |
| 5,825,227 A | 10/1998 | Kohama |
| 5,861,336 A | 1/1999 | Reedy |
| 5,863,823 A | 1/1999 | Burgener |
| 5,864,328 A | 1/1999 | Kajimoto |
| 5,874,836 A | 2/1999 | Nowak |
| 5,874,849 A | 2/1999 | Marotta |
| 5,877,978 A | 3/1999 | Morishita |
| 5,878,331 A | 3/1999 | Yamamoto |
| 5,880,620 A | 3/1999 | Gitlin |
| 5,883,396 A | 3/1999 | Reedy |
| 5,883,541 A | 3/1999 | Tahara |
| 5,889,428 A | 3/1999 | Young |
| 5,892,260 A | 4/1999 | Okumura |
| 5,892,382 A | 4/1999 | Ueda |
| 5,892,400 A | 4/1999 | van Saders |
| 5,895,957 A | 4/1999 | Reedy |
| 5,903,178 A | 5/1999 | Miyatsuji |
| 5,912,560 A | 6/1999 | Pasternak |
| 5,917,362 A | 6/1999 | Kohama |
| 5,920,093 A | 7/1999 | Huang |
| 5,920,233 A | 7/1999 | Denny |
| 5,926,466 A | 7/1999 | Ishida |
| 5,930,605 A | 7/1999 | Mistry |
| 5,930,638 A | 7/1999 | Reedy |
| 5,945,867 A | 8/1999 | Uda |
| 5,945,879 A | 8/1999 | Rodwell |
| 5,953,557 A | 9/1999 | Kawahara |
| 5,959,335 A | 9/1999 | Bryant |
| 5,969,560 A | 10/1999 | Kohama |
| 5,969,571 A | 10/1999 | Swanson |
| 5,973,363 A | 10/1999 | Staab |
| 5,973,364 A | 10/1999 | Kawanaka |
| 5,973,382 A | 10/1999 | Burgener |
| 5,973,636 A | 10/1999 | Okubo |

(56) References Cited

U.S. PATENT DOCUMENTS

| | | |
|---|---|---|
| 5,986,518 A | 11/1999 | Dougherty |
| 5,990,580 A | 11/1999 | Weigand |
| 6,020,778 A | 2/2000 | Shigehara |
| 6,020,781 A | 2/2000 | Fujioka |
| 6,020,848 A | 2/2000 | Wallace |
| 6,049,110 A | 4/2000 | Koh |
| 6,057,555 A | 5/2000 | Reedy |
| 6,057,723 A | 5/2000 | Yamaji |
| 6,061,267 A | 5/2000 | Houston |
| 6,063,686 A | 5/2000 | Masuda |
| 6,064,253 A | 5/2000 | Faulkner |
| 6,064,275 A | 5/2000 | Yamauchi |
| 6,064,872 A | 5/2000 | Vice |
| 6,066,993 A | 5/2000 | Yamamoto |
| 6,081,165 A | 6/2000 | Goldman |
| 6,081,443 A | 6/2000 | Morishita |
| 6,081,694 A | 6/2000 | Matsuura |
| 6,084,255 A | 7/2000 | Ueda |
| 6,087,893 A | 7/2000 | Oowaki |
| 6,094,088 A | 7/2000 | Yano |
| 6,100,564 A | 8/2000 | Bryant |
| 6,104,061 A | 8/2000 | Forbes |
| 6,107,885 A | 8/2000 | Miguelez |
| 6,111,778 A | 8/2000 | MacDonald |
| 6,114,923 A | 9/2000 | Mizutani |
| 6,118,343 A | 9/2000 | Winslow |
| 6,122,185 A | 9/2000 | Utsunomiya |
| 6,130,570 A | 10/2000 | Pan |
| 6,130,572 A | 10/2000 | Ghilardelli |
| 6,133,752 A | 10/2000 | Kawagoe |
| 6,137,367 A | 10/2000 | Ezzedine |
| 6,160,292 A | 12/2000 | Flaker |
| 6,169,444 B1 | 1/2001 | Thurber, Jr. |
| 6,172,378 B1 | 1/2001 | Hull |
| 6,173,235 B1 | 1/2001 | Maeda |
| 6,177,826 B1 | 1/2001 | Mashiko |
| 6,188,247 B1 | 2/2001 | Storino |
| 6,188,590 B1 | 2/2001 | Chang |
| 6,191,449 B1 | 2/2001 | Shino |
| 6,191,653 B1 | 2/2001 | Camp, Jr. |
| 6,195,307 B1 | 2/2001 | Umezawa |
| 6,201,761 B1 | 3/2001 | Wollesen |
| RE37,124 E | 4/2001 | Monk |
| 6,215,360 B1 | 4/2001 | Callaway, Jr. |
| 6,218,248 B1 | 4/2001 | Hwang |
| 6,218,890 B1 | 4/2001 | Yamaguchi |
| 6,218,892 B1 | 4/2001 | Soumyanath |
| 6,222,394 B1 | 4/2001 | Allen |
| 6,225,866 B1 | 5/2001 | Kubota |
| 6,239,649 B1 | 5/2001 | Bertin |
| 6,239,657 B1 | 5/2001 | Bauer |
| 6,249,027 B1 | 6/2001 | Burr |
| 6,249,029 B1 | 6/2001 | Bryant |
| 6,249,446 B1 | 6/2001 | Shearon |
| 6,281,737 B1 | 8/2001 | Kuang |
| 6,288,458 B1 | 9/2001 | Berndt |
| 6,297,687 B1 | 10/2001 | Sugimura |
| 6,297,696 B1 | 10/2001 | Abdollahian |
| 6,300,796 B1 | 10/2001 | Troutman |
| 6,304,110 B1 | 10/2001 | Hirano |
| 6,308,047 B1 | 10/2001 | Yamamoto |
| 6,310,508 B1 | 10/2001 | Westerman |
| 6,316,808 B1 | 11/2001 | Smith, III |
| 6,316,983 B1 | 11/2001 | Kitamura |
| 6,320,225 B1 | 11/2001 | Hargrove |
| 6,337,594 B1 | 1/2002 | Hwang |
| 6,341,087 B1 | 1/2002 | Kunikiyo |
| 6,355,957 B1 | 3/2002 | Maeda |
| 6,356,536 B1 | 3/2002 | Repke |
| 6,365,488 B1 | 4/2002 | Liao |
| 6,380,793 B1 | 4/2002 | Bancal |
| 6,380,796 B2 | 4/2002 | Sakai |
| 6,380,802 B1 | 4/2002 | Pehike |
| 6,387,739 B1 | 5/2002 | Smith, III |
| 6,392,440 B2 | 5/2002 | Nebel |
| 6,392,467 B1 | 5/2002 | Oowaki |
| 6,396,325 B2 | 5/2002 | Goodell |
| 6,396,352 B1 | 5/2002 | Muza |
| 6,400,211 B1 | 6/2002 | Yokomizo |
| 6,407,427 B1 | 6/2002 | Oh |
| 6,407,614 B1 | 6/2002 | Takahashi |
| 6,411,156 B1 | 6/2002 | Borkar |
| 6,411,531 B1 | 6/2002 | Nork |
| 6,414,353 B1 | 7/2002 | Maeda |
| 6,414,863 B1 | 7/2002 | Bayer |
| 6,429,487 B1 | 8/2002 | Kunikiyo |
| 6,429,632 B1 | 8/2002 | Forbes |
| 6,429,723 B1 | 8/2002 | Hastings |
| 6,433,587 B1 | 8/2002 | Assaderaghi |
| 6,433,589 B1 | 8/2002 | Lee |
| 6,449,465 B1 | 9/2002 | Gailus |
| 6,452,232 B1 | 9/2002 | Adan |
| 6,461,902 B1 | 10/2002 | Xu |
| 6,466,082 B1 | 10/2002 | Krishnan |
| 6,469,568 B2 | 10/2002 | Toyoyama |
| 6,486,511 B1 | 11/2002 | Nathanson |
| 6,486,729 B2 | 11/2002 | Imamiya |
| 6,496,074 B1 | 12/2002 | Sowlati |
| 6,498,058 B1 | 12/2002 | Bryant |
| 6,498,370 B1 | 12/2002 | Kim |
| 6,504,212 B1 | 1/2003 | Allen |
| 6,504,213 B1 | 1/2003 | Ebina |
| 6,509,799 B1 | 1/2003 | Franca-Neto |
| 6,512,269 B1 | 1/2003 | Bryant |
| 6,518,645 B2 | 2/2003 | Bae |
| 6,518,829 B2 | 2/2003 | Butler |
| 6,519,191 B1 | 2/2003 | Morishita |
| 6,521,959 B2 | 2/2003 | Kim |
| 6,537,861 B1 | 3/2003 | Kroell |
| 6,559,689 B1 | 5/2003 | Clark |
| 6,563,366 B1 | 5/2003 | Kohama |
| 6,573,533 B1 | 6/2003 | Yamazaki |
| 6,608,785 B2 | 8/2003 | Chuang |
| 6,608,789 B2 | 8/2003 | Sullivan |
| 6,617,933 B2 | 9/2003 | Ito |
| 6,631,505 B2 | 10/2003 | Arai |
| 6,632,724 B2 | 10/2003 | Henley |
| 6,642,578 B1 | 11/2003 | Arnold |
| 6,646,305 B2 | 11/2003 | Assaderaghi |
| 6,653,697 B2 | 11/2003 | Hidaka |
| 6,670,655 B2 | 12/2003 | Lukes |
| 6,677,641 B2 | 1/2004 | Kocon |
| 6,677,803 B1 | 1/2004 | Chiba |
| 6,684,055 B1 | 1/2004 | Blackaby |
| 6,684,065 B2 | 1/2004 | Bult |
| 6,693,326 B2 | 2/2004 | Adan |
| 6,693,498 B1 | 2/2004 | Sasabata |
| 6,698,082 B2 | 3/2004 | Crenshaw |
| 6,698,498 B1 | 3/2004 | Ziegelaar |
| 6,703,863 B2 | 3/2004 | Gion |
| 6,704,550 B1 | 3/2004 | Kohama |
| 6,711,397 B1 | 3/2004 | Petrov |
| 6,714,065 B2 | 3/2004 | Komiya |
| 6,717,458 B1 | 4/2004 | Potanin |
| 6,730,953 B2 | 5/2004 | Brindle |
| 6,762,477 B2 | 7/2004 | Kunikiyo |
| 6,769,110 B2 | 7/2004 | Katoh |
| 6,774,701 B1 | 8/2004 | Heston |
| 6,781,805 B1 | 8/2004 | Urakawa |
| 6,788,130 B2 | 9/2004 | Pauletti |
| 6,790,747 B2 | 9/2004 | Henley |
| 6,801,076 B1 | 10/2004 | Merritt |
| 6,803,680 B2 | 10/2004 | Brindle |
| 6,804,502 B2 | 10/2004 | Burgener |
| 6,804,506 B1 | 10/2004 | Freitag |
| 6,816,000 B2 | 11/2004 | Miyamitsu |
| 6,816,001 B2 | 11/2004 | Khouri |
| 6,816,016 B2 | 11/2004 | Sander |
| 6,819,938 B2 | 11/2004 | Sahota |
| 6,825,730 B1 | 11/2004 | Sun |
| 6,830,963 B1 | 12/2004 | Forbes |
| 6,831,847 B2 | 12/2004 | Perry |
| 6,833,745 B2 | 12/2004 | Hausmann |
| 6,835,982 B2 | 12/2004 | Hogyoku |

(56) References Cited

U.S. PATENT DOCUMENTS

| | | |
|---|---|---|
| 6,836,172 B2 | 12/2004 | Okashita |
| 6,870,241 B2 | 3/2005 | Nakatani |
| 6,871,059 B1 | 3/2005 | Piro |
| 6,879,502 B2 | 4/2005 | Yoshida |
| 6,882,210 B2 | 4/2005 | Asano |
| 6,891,234 B1 | 5/2005 | Connelly |
| 6,897,701 B2 | 5/2005 | Chen |
| 6,898,778 B2 | 5/2005 | Kawanaka |
| 6,901,023 B2 | 5/2005 | Kirsch |
| 6,903,596 B2 | 6/2005 | Geller |
| 6,908,832 B2 | 6/2005 | Farrens |
| 6,917,082 B1 * | 7/2005 | Loo ................ H03K 19/01707 |
| | | 257/476 |
| 6,917,258 B2 | 7/2005 | Kushitani |
| 6,933,744 B2 | 8/2005 | Das |
| 6,934,520 B2 | 8/2005 | Rozsypal |
| 6,947,720 B2 | 9/2005 | Razavi |
| 6,954,623 B2 | 10/2005 | Chang |
| 6,967,517 B2 | 11/2005 | Mizuno |
| 6,968,020 B1 | 11/2005 | Jayaraman |
| 6,969,668 B1 | 11/2005 | Kang |
| 6,975,271 B2 | 12/2005 | Adachi |
| 6,978,122 B2 | 12/2005 | Kawakyu |
| 6,978,437 B1 | 12/2005 | Rittman |
| 6,987,414 B2 | 1/2006 | Numata |
| 6,992,543 B2 | 1/2006 | Luetzelschwab |
| 7,011,980 B1 | 3/2006 | Na |
| 7,023,260 B2 | 4/2006 | Thorp |
| 7,042,245 B2 | 5/2006 | Hidaka |
| 7,045,873 B2 | 5/2006 | Chen |
| 7,056,808 B2 | 6/2006 | Henley |
| 7,057,472 B2 | 6/2006 | Fukamachi |
| 7,058,922 B2 | 6/2006 | Kawanaka |
| 7,068,096 B2 | 6/2006 | Chu |
| 7,082,293 B1 | 7/2006 | Rofougaran |
| 7,088,971 B2 | 8/2006 | Burgener |
| 7,092,677 B1 | 8/2006 | Zhang |
| 7,106,121 B2 | 9/2006 | Hidaka |
| 7,109,532 B1 | 9/2006 | Lee |
| 7,123,898 B2 | 10/2006 | Burgener |
| 7,129,545 B2 | 10/2006 | Cain |
| 7,132,873 B2 | 11/2006 | Hollmer |
| 7,138,846 B2 | 11/2006 | Suwa |
| 7,161,197 B2 | 1/2007 | Nakatsuka |
| 7,173,471 B2 | 2/2007 | Nakatsuka |
| 7,199,635 B2 | 4/2007 | Nakatsuka |
| 7,202,712 B2 | 4/2007 | Athas |
| 7,202,734 B1 | 4/2007 | Raab |
| 7,212,788 B2 | 5/2007 | Weber |
| 7,248,120 B2 | 7/2007 | Burgener |
| 7,266,014 B2 | 9/2007 | Wu |
| 7,269,392 B2 | 9/2007 | Nakajima |
| 7,307,490 B2 | 12/2007 | Kizuki |
| 7,345,342 B2 | 3/2008 | Challa |
| 7,345,521 B2 | 3/2008 | Takahashi |
| 7,355,455 B2 | 4/2008 | Hidaka |
| 7,359,677 B2 | 4/2008 | Huang |
| 7,391,282 B2 | 6/2008 | Nakatsuka |
| 7,404,157 B2 | 7/2008 | Tanabe |
| 7,405,982 B1 | 7/2008 | Hsu |
| 7,432,552 B2 | 10/2008 | Park |
| 7,457,594 B2 | 11/2008 | Theobold |
| 7,459,988 B1 | 12/2008 | Iversen |
| 7,460,852 B2 | 12/2008 | Burgener |
| 7,461,903 B2 | 12/2008 | Tewes |
| 7,515,882 B2 | 4/2009 | Kelcourse |
| 7,546,089 B2 | 6/2009 | Bellantoni |
| 7,551,036 B2 | 6/2009 | Berroth |
| 7,561,853 B2 | 7/2009 | Miyazawa |
| 7,564,103 B2 | 7/2009 | Losehand |
| 7,616,482 B2 | 11/2009 | Prall |
| 7,619,462 B2 | 11/2009 | Kelly |
| 7,659,152 B2 | 2/2010 | Gonzalez |
| 7,692,514 B2 | 4/2010 | LeToux |
| 7,710,189 B2 | 5/2010 | Toda |
| 7,719,343 B2 | 5/2010 | Burgener |
| 7,733,156 B2 | 6/2010 | Brederlow |
| 7,733,157 B2 | 6/2010 | Brederlow |
| 7,741,869 B2 | 6/2010 | Hidaka |
| 7,756,494 B2 | 7/2010 | Fujioka |
| 7,786,807 B1 | 8/2010 | Li |
| 7,796,969 B2 | 9/2010 | Kelly |
| 7,808,342 B2 | 10/2010 | Prikhodko |
| 7,817,966 B2 | 10/2010 | Prikhodko |
| 7,860,499 B2 | 12/2010 | Burgener |
| 7,868,683 B2 | 1/2011 | Ilkov |
| 7,890,891 B2 * | 2/2011 | Stuber ............... H01L 29/78657 |
| | | 716/115 |
| 7,910,993 B2 * | 3/2011 | Brindle ............... H03K 17/162 |
| | | 257/347 |
| 7,928,759 B2 | 4/2011 | Hidaka |
| 7,936,213 B2 | 5/2011 | Shin |
| 7,960,772 B2 | 6/2011 | Englekirk |
| 7,982,265 B2 | 7/2011 | Challa |
| 7,984,408 B2 | 7/2011 | Cheng |
| 8,008,988 B1 | 8/2011 | Yang |
| 8,081,928 B2 | 12/2011 | Kelly |
| 8,103,226 B2 | 1/2012 | Andrys |
| 8,111,104 B2 | 2/2012 | Ahadian |
| 8,129,787 B2 | 3/2012 | Brindle |
| 8,131,225 B2 | 3/2012 | Botula |
| 8,131,251 B2 | 3/2012 | Burgener |
| 8,159,282 B2 | 4/2012 | Katoh |
| 8,195,103 B2 | 6/2012 | Waheed |
| 8,232,627 B2 | 7/2012 | Bryant |
| 8,253,494 B2 | 8/2012 | Blednov |
| 8,330,519 B2 | 12/2012 | Lam |
| 8,350,624 B2 | 1/2013 | Lam |
| 8,405,147 B2 | 3/2013 | Brindle |
| 8,427,241 B2 | 4/2013 | Ezzeddine |
| 8,451,044 B2 | 5/2013 | Nisbet |
| 8,461,903 B1 | 6/2013 | Granger-Jones |
| 8,487,706 B2 | 7/2013 | Li |
| 8,523,451 B2 | 9/2013 | Ozu |
| 8,525,272 B2 | 9/2013 | Losehand |
| 8,527,949 B1 | 9/2013 | Pleis |
| 8,529,949 B2 | 9/2013 | Ettema |
| 8,536,636 B2 | 9/2013 | Englekirk |
| 8,559,907 B2 | 10/2013 | Burgener |
| 8,583,111 B2 | 11/2013 | Burgener |
| 8,649,741 B2 | 2/2014 | Iijima |
| 8,649,754 B2 | 2/2014 | Burgener |
| 8,669,804 B2 | 3/2014 | Ranta |
| 8,680,928 B2 | 3/2014 | Jeon |
| 8,729,948 B2 | 5/2014 | Sugiura |
| 8,729,949 B2 | 5/2014 | Nisbet |
| 8,742,502 B2 | 6/2014 | Brindle |
| 8,779,859 B2 | 7/2014 | Su |
| 8,824,974 B2 | 9/2014 | Nakajima |
| 8,954,902 B2 * | 2/2015 | Stuber ............... H01L 29/78615 |
| | | 716/101 |
| 9,087,899 B2 | 7/2015 | Brindle |
| 9,129,836 B2 | 9/2015 | Losehand |
| 9,130,564 B2 | 9/2015 | Brindle |
| 9,160,292 B2 | 10/2015 | Olson |
| 9,177,737 B2 | 11/2015 | Englekirk |
| 9,178,493 B1 | 11/2015 | Nobbe |
| 9,184,709 B2 | 11/2015 | Adamski |
| 9,219,445 B2 | 12/2015 | Nobbe |
| 9,225,378 B2 | 12/2015 | Burgener |
| 9,276,526 B2 | 3/2016 | Nobbe |
| 9,331,738 B2 | 5/2016 | Sharma |
| 9,369,087 B2 | 6/2016 | Burgener |
| 9,397,656 B2 | 7/2016 | Dribinsky |
| 9,419,560 B2 | 8/2016 | Korol |
| 9,438,196 B2 | 9/2016 | Smith |
| 9,438,223 B2 | 9/2016 | de Jongh |
| 9,467,124 B2 | 10/2016 | Crandall |
| 9,608,619 B2 * | 3/2017 | Stuber ............... H01L 29/78657 |
| 9,653,601 B2 | 5/2017 | Brindle |
| 9,673,155 B2 | 6/2017 | Smith |
| 9,755,615 B2 | 9/2017 | Ranta |
| 9,780,775 B2 | 10/2017 | Brindle |
| 9,780,778 B2 | 10/2017 | Burgener |

(56) References Cited

U.S. PATENT DOCUMENTS

| | | | |
|---|---|---|---|
| 9,786,781 B2 | 10/2017 | Brindle | |
| 9,885,385 B2 | 2/2018 | Kullin | |
| 9,887,695 B2 | 2/2018 | Dribinsky | |
| 9,948,281 B2 | 4/2018 | Ranta | |
| 9,966,988 B2 | 5/2018 | Burgener | |
| 10,818,796 B2* | 10/2020 | Stuber | H01L 29/78651 |
| 11,201,245 B2* | 12/2021 | Stuber | H01L 29/78657 |
| 11,901,459 B2* | 2/2024 | Stuber | H01L 27/1203 |
| 2001/0015461 A1 | 8/2001 | Ebina | |
| 2001/0031518 A1 | 10/2001 | Kim | |
| 2001/0040479 A1 | 11/2001 | Zhang | |
| 2001/0045602 A1 | 11/2001 | Maeda | |
| 2002/0029971 A1 | 3/2002 | Kovacs | |
| 2002/0043691 A1 | 4/2002 | Higashi | |
| 2002/0079971 A1 | 6/2002 | Vathulya | |
| 2002/0093064 A1 | 7/2002 | Inaba | |
| 2002/0115244 A1 | 8/2002 | Park | |
| 2002/0126767 A1 | 9/2002 | Ding | |
| 2002/0195623 A1 | 12/2002 | Horiuchi | |
| 2003/0002452 A1 | 1/2003 | Sahota | |
| 2003/0025159 A1 | 2/2003 | Hogyoku | |
| 2003/0032396 A1 | 2/2003 | Tsuchiya | |
| 2003/0090313 A1 | 5/2003 | Burgener | |
| 2003/0141543 A1 | 7/2003 | Bryant | |
| 2003/0160515 A1 | 8/2003 | Yu | |
| 2003/0181167 A1 | 9/2003 | Iida | |
| 2003/0201494 A1 | 10/2003 | Maeda | |
| 2003/0205760 A1 | 11/2003 | Kawanaka | |
| 2003/0222313 A1 | 12/2003 | Fechner | |
| 2003/0224743 A1 | 12/2003 | Okada | |
| 2003/0227056 A1 | 12/2003 | Wang | |
| 2004/0004247 A1 | 1/2004 | Forbes | |
| 2004/0004251 A1 | 1/2004 | Madurawe | |
| 2004/0021137 A1 | 2/2004 | Fazan | |
| 2004/0061130 A1 | 4/2004 | Morizuka | |
| 2004/0080364 A1 | 4/2004 | Sander | |
| 2004/0121745 A1 | 6/2004 | Meck | |
| 2004/0129975 A1 | 7/2004 | Koh | |
| 2004/0130380 A1 | 7/2004 | Asano | |
| 2004/0183583 A1 | 9/2004 | Mizuno | |
| 2004/0183588 A1 | 9/2004 | Chandrakasan | |
| 2004/0204013 A1 | 10/2004 | Ma | |
| 2004/0207454 A1 | 10/2004 | Hidaka | |
| 2004/0218442 A1 | 11/2004 | Kirsch | |
| 2004/0227565 A1 | 11/2004 | Chen | |
| 2004/0242182 A1 | 12/2004 | Hidaka | |
| 2005/0017789 A1 | 1/2005 | Burgener | |
| 2005/0072988 A1 | 4/2005 | Augusto | |
| 2005/0077564 A1 | 4/2005 | Forbes | |
| 2005/0079829 A1 | 4/2005 | Ogawa | |
| 2005/0104137 A1 | 5/2005 | Faulkner | |
| 2005/0121699 A1 | 6/2005 | Chen | |
| 2005/0122163 A1 | 6/2005 | Chu | |
| 2005/0127442 A1 | 6/2005 | Veeraraghavan | |
| 2005/0133858 A1 | 6/2005 | Banerjee | |
| 2005/0167751 A1 | 8/2005 | Nakajima | |
| 2005/0179093 A1 | 8/2005 | Morris | |
| 2005/0212595 A1 | 9/2005 | Kusunoki | |
| 2005/0247978 A1* | 11/2005 | Weng | H10K 71/60 |
| | | | 438/149 |
| 2005/0264341 A1 | 12/2005 | Hikita | |
| 2006/0009164 A1 | 1/2006 | Kataoka | |
| 2006/0022526 A1 | 2/2006 | Cartalade | |
| 2006/0077082 A1 | 4/2006 | Shanks | |
| 2006/0118884 A1 | 6/2006 | Losehand | |
| 2006/0160520 A1 | 7/2006 | Miyazawa | |
| 2006/0161520 A1 | 7/2006 | Brewer | |
| 2006/0194558 A1 | 8/2006 | Kelly | |
| 2006/0194567 A1 | 8/2006 | Kelly | |
| 2006/0199563 A1 | 9/2006 | Kelly | |
| 2006/0255852 A1 | 11/2006 | O'Donnell | |
| 2006/0267093 A1 | 11/2006 | Tang | |
| 2006/0270367 A1 | 11/2006 | Burgener | |
| 2006/0281418 A1 | 12/2006 | Huang | |
| 2007/0018247 A1 | 1/2007 | Brindle | |
| 2007/0023833 A1 | 2/2007 | Okhonin | |
| 2007/0045697 A1 | 3/2007 | Cheng | |
| 2007/0069291 A1 | 3/2007 | Stuber | |
| 2007/0120103 A1 | 5/2007 | Burgener | |
| 2007/0279120 A1 | 12/2007 | Brederlow | |
| 2007/0290744 A1 | 12/2007 | Adachi | |
| 2008/0034335 A1 | 2/2008 | Cheng | |
| 2008/0073719 A1 | 3/2008 | Fazan | |
| 2008/0076371 A1 | 3/2008 | Dribinsky | |
| 2008/0191788 A1 | 8/2008 | Chen | |
| 2008/0265997 A1 | 10/2008 | Berroth | |
| 2008/0303080 A1 | 12/2008 | Bhattacharyya | |
| 2009/0007036 A1 | 1/2009 | Cheng | |
| 2009/0029511 A1 | 1/2009 | Wu | |
| 2009/0117871 A1 | 5/2009 | Burgener | |
| 2009/0181630 A1 | 7/2009 | Seshita | |
| 2009/0278206 A1 | 11/2009 | Losehand | |
| 2010/0327948 A1 | 12/2010 | Nisbet | |
| 2010/0330938 A1 | 12/2010 | Yin | |
| 2011/0002080 A1 | 1/2011 | Ranta | |
| 2011/0092179 A1 | 4/2011 | Burgener | |
| 2011/0163779 A1 | 7/2011 | Hidaka | |
| 2011/0169550 A1 | 7/2011 | Brindle | |
| 2011/0227637 A1 | 9/2011 | Stuber | |
| 2011/0260780 A1 | 10/2011 | Granger-Jones | |
| 2011/0299437 A1 | 12/2011 | Mikhemar | |
| 2012/0007679 A1 | 1/2012 | Burgener | |
| 2012/0064952 A1 | 3/2012 | Iijima | |
| 2012/0169398 A1 | 7/2012 | Brindle | |
| 2012/0249227 A1 | 10/2012 | Nakayama | |
| 2012/0267719 A1 | 10/2012 | Brindle | |
| 2013/0009725 A1 | 1/2013 | Heaney | |
| 2013/0015717 A1 | 1/2013 | Dykstra | |
| 2013/0260698 A1 | 10/2013 | Nisbet | |
| 2013/0278317 A1 | 10/2013 | Iversen | |
| 2013/0288617 A1 | 10/2013 | Kim | |
| 2013/0293280 A1 | 11/2013 | Brindle | |
| 2013/0293283 A1 | 11/2013 | Jeon | |
| 2014/0001550 A1 | 1/2014 | Losehand | |
| 2014/0009248 A1 | 1/2014 | Granger-Jones | |
| 2014/0028521 A1 | 1/2014 | Bauder | |
| 2014/0085006 A1 | 3/2014 | Mostov | |
| 2014/0087673 A1 | 3/2014 | Mostov | |
| 2014/0118053 A1 | 5/2014 | Matsuno | |
| 2014/0165385 A1 | 6/2014 | Englekirk | |
| 2014/0167834 A1 | 6/2014 | Stuber | |
| 2014/0179249 A1 | 6/2014 | Burgener | |
| 2014/0179374 A1 | 6/2014 | Burgener | |
| 2014/0266415 A1 | 9/2014 | Kerr | |
| 2014/0306767 A1 | 10/2014 | Burgener | |
| 2014/0312422 A1 | 10/2014 | Brindle | |
| 2015/0015321 A1 | 1/2015 | Dribinsky | |
| 2015/0022256 A1 | 1/2015 | Sprinkle | |
| 2015/0236691 A1 | 8/2015 | Cam | |
| 2015/0381171 A1 | 12/2015 | Cebi | |
| 2016/0020815 A1 | 1/2016 | Lee | |
| 2016/0056774 A1 | 2/2016 | Ilkov | |
| 2016/0064561 A1 | 3/2016 | Brindle | |
| 2016/0069389 A1 | 3/2016 | Bell | |
| 2016/0191040 A1 | 6/2016 | Brindle | |
| 2016/0191050 A1 | 6/2016 | Englekirk | |
| 2016/0191051 A1 | 6/2016 | Burgener | |
| 2016/0226478 A1 | 8/2016 | Dribinsky | |
| 2016/0322385 A1 | 11/2016 | Fuh | |
| 2016/0329891 A1 | 11/2016 | Bakalski | |
| 2017/0012763 A1 | 1/2017 | Wu | |
| 2017/0110451 A1 | 4/2017 | Fraser | |
| 2017/0162692 A1 | 6/2017 | Brindle | |
| 2017/0201250 A1 | 7/2017 | Heaney | |
| 2017/0236946 A1 | 8/2017 | Stuber | |
| 2017/0237462 A1 | 8/2017 | Burgener | |
| 2017/0272066 A1 | 9/2017 | Scott | |
| 2018/0061985 A1 | 3/2018 | Brindle | |
| 2018/0062645 A1 | 3/2018 | Burgener | |
| 2018/0083614 A1 | 3/2018 | Brindle | |
| 2018/0091136 A1 | 3/2018 | Wang | |
| 2018/0138272 A1 | 5/2018 | Ebihara | |
| 2018/0145678 A1 | 5/2018 | Maxim | |
| 2018/0212599 A1 | 7/2018 | Dribinsky | |

(56) References Cited

U.S. PATENT DOCUMENTS

| | | |
|---|---|---|
| 2019/0058470 A1 | 2/2019 | Burgener |
| 2019/0081655 A1 | 3/2019 | Burgener |
| 2019/0088781 A1 | 3/2019 | Brindle |
| 2019/0089348 A1 | 3/2019 | Brindle |
| 2019/0097612 A1 | 3/2019 | Burgener |
| 2019/0237579 A1 | 8/2019 | Brindle |
| 2019/0238126 A1 | 8/2019 | Brindle |
| 2020/0036377 A1 | 1/2020 | Brindle |
| 2020/0036378 A1 | 1/2020 | Brindle |
| 2020/0067504 A1 | 2/2020 | Brindle |
| 2020/0076427 A1 | 3/2020 | Burgener |
| 2020/0076428 A1 | 3/2020 | Burgener |
| 2020/0112305 A1 | 4/2020 | Brindle |
| 2020/0153430 A1 | 5/2020 | Burgener |
| 2020/0295751 A1 | 9/2020 | Brindle |
| 2020/0321467 A1 | 10/2020 | Brindle |
| 2020/0335633 A1 | 10/2020 | Stuber |
| 2021/0152170 A1 | 5/2021 | Dribinsky |
| 2021/0167773 A1 | 6/2021 | Burgener |

FOREIGN PATENT DOCUMENTS

| | | |
|---|---|---|
| DE | 19832565 | 8/1999 |
| DE | 112011103554 | 9/2013 |
| DE | 102017217810 | 4/2019 |
| EP | 0385641 | 9/1990 |
| EP | 0622901 | 11/1994 |
| EP | 0625831 | 11/1994 |
| EP | 0782267 | 7/1997 |
| EP | 0788185 | 8/1997 |
| EP | 0851561 | 7/1998 |
| EP | 0913939 | 5/1999 |
| EP | 1006584 | 6/2000 |
| EP | 1451890 | 9/2004 |
| EP | 1774620 | 4/2007 |
| EP | 1902474 | 3/2008 |
| EP | 1925030 | 5/2008 |
| EP | 2348532 | 7/2011 |
| EP | 2348533 | 7/2011 |
| EP | 2348534 | 7/2011 |
| EP | 2348535 | 7/2011 |
| EP | 2348536 | 7/2011 |
| EP | 2387094 | 11/2011 |
| EP | 2884586 | 6/2015 |
| EP | 3113280 | 1/2017 |
| JP | 4183008 | 12/1899 |
| JP | 4253069 | 12/1899 |
| JP | 4659826 | 12/1899 |
| JP | 4892092 | 12/1899 |
| JP | 5215850 | 12/1899 |
| JP | 5299995 | 12/1899 |
| JP | 5575348 | 12/1899 |
| JP | 5591356 | 12/1899 |
| JP | 5678106 | 12/1899 |
| JP | 6006219 | 12/1899 |
| JP | 6112795 | 12/1899 |
| JP | 6334506 | 12/1899 |
| JP | 7046109 | 12/1899 |
| JP | 11097693 | 12/1899 |
| JP | 61502922 | 12/1899 |
| JP | S5215850 | 2/1977 |
| JP | S5575348 | 6/1980 |
| JP | S606219 | 1/1985 |
| JP | H01254014 | 10/1989 |
| JP | H028627 | 1/1990 |
| JP | H0241275 | 2/1990 |
| JP | H0255682 | 2/1990 |
| JP | H0292785 | 4/1990 |
| JP | H02161769 | 6/1990 |
| JP | H0348587 | 3/1991 |
| JP | H0363721 | 3/1991 |
| JP | H0381641 | 4/1991 |
| JP | H0386501 | 4/1991 |
| JP | H0474 | 1/1992 |
| JP | H0434980 | 2/1992 |
| JP | H0438059 | 2/1992 |
| JP | H0443738 | 2/1992 |
| JP | H0470659 | 3/1992 |
| JP | H0484114 | 3/1992 |
| JP | H0484170 | 3/1992 |
| JP | H0498493 | 3/1992 |
| JP | H04183008 | 6/1992 |
| JP | H0526642 | 2/1993 |
| JP | H05299995 | 11/1993 |
| JP | H06112795 | 4/1994 |
| JP | H06314985 | 11/1994 |
| JP | H06334506 | 12/1994 |
| JP | H0746109 | 2/1995 |
| JP | H0770245 | 3/1995 |
| JP | H07106937 | 4/1995 |
| JP | H0823270 | 1/1996 |
| JP | H0870245 | 3/1996 |
| JP | H08148949 | 6/1996 |
| JP | H08251012 | 9/1996 |
| JP | H08307305 | 11/1996 |
| JP | H08330930 | 12/1996 |
| JP | H098621 | 1/1997 |
| JP | H098627 | 1/1997 |
| JP | H0941275 | 2/1997 |
| JP | H0955682 | 2/1997 |
| JP | H0992785 | 4/1997 |
| JP | H09148587 | 6/1997 |
| JP | H09163721 | 6/1997 |
| JP | H09181641 | 7/1997 |
| JP | H09186501 | 7/1997 |
| JP | H09200021 | 7/1997 |
| JP | H09200074 | 7/1997 |
| JP | H09238059 | 9/1997 |
| JP | H09238509 | 9/1997 |
| JP | H09243738 | 9/1997 |
| JP | H09270659 | 10/1997 |
| JP | H09284114 | 10/1997 |
| JP | H09284170 | 10/1997 |
| JP | H09298493 | 11/1997 |
| JP | H09326642 | 12/1997 |
| JP | H1024277 | 1/1998 |
| JP | H1028436 | 2/1998 |
| JP | H1034247 | 2/1998 |
| JP | H1079467 | 3/1998 |
| JP | H1093471 | 4/1998 |
| JP | H10214971 | 8/1998 |
| JP | H10242477 | 9/1998 |
| JP | H10242826 | 9/1998 |
| JP | H10242829 | 9/1998 |
| JP | H10244247 | 9/1998 |
| JP | H10284736 | 10/1998 |
| JP | H10335901 | 12/1998 |
| JP | H1126776 | 1/1999 |
| JP | H11112316 | 4/1999 |
| JP | H11125188 | 5/1999 |
| JP | H11135795 | 5/1999 |
| JP | H11136111 | 5/1999 |
| JP | H11163642 | 6/1999 |
| JP | H11163704 | 6/1999 |
| JP | H11205188 | 7/1999 |
| JP | H11274804 | 10/1999 |
| JP | 2000031167 | 1/2000 |
| JP | 2000058842 | 2/2000 |
| JP | 2000058857 | 2/2000 |
| JP | 2000101093 | 4/2000 |
| JP | 2000174283 | 6/2000 |
| JP | 2000183353 | 6/2000 |
| JP | 2000188501 | 7/2000 |
| JP | 2000208614 | 7/2000 |
| JP | 2000223713 | 8/2000 |
| JP | 2000243973 | 9/2000 |
| JP | 2000277703 | 10/2000 |
| JP | 2000294786 | 10/2000 |
| JP | 2000311986 | 11/2000 |
| JP | 2001007332 | 1/2001 |
| JP | 2001089448 | 4/2001 |
| JP | 2001094114 | 4/2001 |
| JP | 2001119281 | 4/2001 |
| JP | 2001156182 | 6/2001 |

(56) References Cited

FOREIGN PATENT DOCUMENTS

| | | |
|---|---|---|
| JP | 2001157487 | 6/2001 |
| JP | 2001257360 | 9/2001 |
| JP | 2001274265 | 10/2001 |
| JP | 2002009299 | 1/2002 |
| JP | 2002016441 | 1/2002 |
| JP | 2002156602 | 5/2002 |
| JP | 2002164441 | 6/2002 |
| JP | 2002243973 | 8/2002 |
| JP | 2002290104 | 10/2002 |
| JP | 2003047553 | 2/2003 |
| JP | 2003060451 | 2/2003 |
| JP | 2003101407 | 4/2003 |
| JP | 2003143004 | 5/2003 |
| JP | 2003167615 | 6/2003 |
| JP | 2003189248 | 7/2003 |
| JP | 2003332583 | 11/2003 |
| JP | 2003347553 | 12/2003 |
| JP | 2004147175 | 5/2004 |
| JP | 2004515937 | 5/2004 |
| JP | 2004166470 | 6/2004 |
| JP | 2004199950 | 7/2004 |
| JP | 2004288978 | 10/2004 |
| JP | 2004289978 | 10/2004 |
| JP | 2005051567 | 2/2005 |
| JP | 2005515657 | 5/2005 |
| JP | 2005515687 | 5/2005 |
| JP | 2005203643 | 7/2005 |
| JP | 2005251931 | 9/2005 |
| JP | 2006339235 | 12/2006 |
| JP | 2007092983 | 4/2007 |
| JP | 2007255601 | 10/2007 |
| JP | 2009500868 | 1/2009 |
| JP | 2010506156 | 2/2010 |
| JP | 2014239233 | 12/2014 |
| JP | WO2015015720 | 3/2017 |
| KR | 940027615 | 12/1994 |
| WO | WO1986001037 | 2/1986 |
| WO | WO1995023460 | 8/1995 |
| WO | WO1998006174 | 2/1998 |
| WO | WO1999035695 | 7/1999 |
| WO | WO1999056695 | 11/1999 |
| WO | WO2002027920 | 4/2002 |
| WO | WO2003032431 | 4/2003 |
| WO | WO2006038190 | 4/2006 |
| WO | WO2007008934 | 1/2007 |
| WO | WO2007033045 | 3/2007 |
| WO | WO2007035610 | 3/2007 |
| WO | WO2009108391 | 9/2009 |
| WO | WO2012054642 | 4/2012 |

OTHER PUBLICATIONS

U.S. Appl. No. 10/122,356, filed Nov. 6, 2018, Yugo Kunishi.
U.S. Appl. No. 10/153,763, filed Dec. 11, 2018, Christopher N. Brindle.
U.S. Appl. No. 10/153,767, filed Dec. 11, 2018, Mark L. Burgener.
U.S. Appl. No. 10/320,379, filed Jun. 11, 2019, Daniel Charles Kerr.
U.S. Appl. No. 10/447,344, filed Oct. 15, 2019, Baker Scott.
U.S. Appl. No. 10/608,623, filed Mar. 31, 2020, Daniel Charles Kerr.
U.S. Appl. No. 10/622,990, filed Apr. 14, 2020, Christopher N. Brindle.
U.S. Appl. No. 10/622,993, filed Apr. 14, 2020, Mark L. Burgener.
U.S. Appl. No. 10/680,600, filed Jun. 9, 2020, Christopher N. Brindle.
U.S. Appl. No. 10/784,855, filed Sep. 22, 2020, Christopher N. Brindle.
U.S. Appl. No. 10/790,390, filed Sep. 29, 2020, Christopher N. Brindle.
U.S. Appl. No. 10/790,814, filed Sep. 29, 2020, Christopher N. Brindle.
U.S. Appl. No. 10/790,815, filed Sep. 29, 2020, Christopher N. Brindle.
U.S. Appl. No. 10/790,820, filed Sep. 29, 2020, Mark L. Burgener.
U.S. Appl. No. 10/797,172, filed Oct. 6, 2020, Christopher N. Brindle.
U.S. Appl. No. 10/797,690, filed Oct. 6, 2020, Christopher N. Brindle.
U.S. Appl. No. 10/797,691, filed Oct. 6, 2020, Christopher N. Brindle.
U.S. Appl. No. 10/797,694, filed Oct. 6, 2020, Mark L Burgener.
U.S. Appl. No. 10/804,892, filed Oct. 13, 2020, Alexander Dribinsky.
U.S. Appl. No. 10/812,068, filed Oct. 20, 2020, Mark L. Burgener.
U.S. Appl. No. 10/818,796, filed Oct. 27, 2020, Michael A. Stuber.
U.S. Appl. No. 11/011,633, filed May 18, 2021, Christopher N. Brindle.
U.S. Appl. No. 11/196,414, filed Dec. 7, 2021, Alexander Dribinsky.
"A Voltage Regulator for GaAs FETs" Microwave Journal 1995.
"An Ultra-Thin Silicon Technology that Provides Integration Solutions on Standard CMOS" Peregrine Semiconductor 1998.
"CMOS Analog Switches" Harris 1999 pp. 1-9.
"CMOS SOI RF Switch Family" Honeywell 2002 pp. 1-4.
"CMOS SOI Technology" Honeywell 2001 pp. 1-7.
"Miniature Dual Control SP4T Switches for Low Cost Multiplexing" Hittite Microwave 1995.
"Positive Bias GaAs Multi-Throw Switches with Integrated TTL Decoders" Hittite Microwave 2000.
"Radiation Hardened CMOS Dual DPST Analog Switch" Intersil Jul. 1999 pp. 1-2.
"RF & Microwave Device Overview 2003-Silicon and GaAs Semiconductors" NEC 2003.
"RF Amplifier Design Using HFA3046 HFA3096 HFA3127 HFA3128 Transistor Arrays" Intersil Corporation 1996 pp. 1-4.
"SA630 Single Pole Double Throw (SPDT) Switch" Philips Semiconductors 1997.
"Silicon Wave SiW1502 Radio Modem IC" Silicon Wave 2000 pp. 1-21.
"UPG13xG Series L-Band SPDT Switch GaAs MMIC" NEC 1996 pp. 1-30.
Abidi—"Low Power Radio Frequency IC's for Portable Communications" IEEE 1995 pp. 544-569 26 pages Doc 0213.
Adan et al. "Linearity and Low Noise Performance of SOIMOSFETs for RF Applications" IEEE International SOI Conference 2000 pp. 30-31.
Adan et al. "Off-State Leakage Current Mechanisms in BulkSi and SOI MOSFETs and Their Impact on CMOS ULSIs Standby Current" IEEE Transactions on Electron Devices vol. 48 No. Sep. 9, 2001 pp. 2050-2057.
Adan—"Linearity and Low-Noise Performance of Soi MOSFETs for RF Applications" IEEE Transactions on Electron Devices May 2002 vol. 49 No. 5 pp. 881-888 8 pages Doc 0555.
Adan—"OFF-State Leakage Current Mechanisms in BulkSi and SOI MOSFETs and Their Impact on CMOS ULSIs Standby Current" IEEE Transactions on Electron Devices vol. 48 No. Sep. 9, 2001 pp. 2050-2057 8 pages Doc 0528.
Adriaensen—"Analysis and Potential of the Bipolar-and Hybrid-Mode Thin-Film SOI MOSFETs for High-Temperature Applications" Laboratoire de Macroelectronique Universite Catholique de Louvain May 2001 5 pages Doc 0519.
Ajjkuttira—"A Fully Integrated Cmos Rfic for Bluetooth Applications" IEEE International Solid-State Circuits Conference 2001 pp. 1-3 3 pages Doc 0473.
Akarvardar et al. "Threshold Voltage Model of the SOI 4-Gate Transistor" 2004 IEEE International SOI Conference Oct. 2004 pp. 89-90.
Akarvardar—"Multi-Bias Dependence of Threshold Voltage Subthreshold Swing and Mobility in G4-FETs" Institute of Microelectronics Electromagnetism and Photonics IEEE Oct. 2003 pp. 127-130 4 pages Doc 1075.
Allen—"Characterization and Modeling of Silicon-on-Insulator Field Transistors" Department of Electrical Engineering and Computer Science Effect MIT May 20, 1999 80 pages Doc 0419.
Analog Devices—"CMOS Low Voltage RFVideo SPST Switch" Analog Devices Inc. 1999 pp. 1-10 10 pages Doc 0376.
Analog Devices—"LC2MOS High Speed Quad SPST Switch" Rev. B 8 pages Apr. 1988 Doc 1076.

(56) References Cited

OTHER PUBLICATIONS

Analog Devices—"LC2MOS Quad SPST Switch" Rev. B 6 pages Jul. 1992 Doc 1077.
Apel et al. "A GaAs MMIC Transceiver for 2.45 GHz Wireless Commercial Products" Microwave and Millimeter-Wave Monolithic Circuits Symposium 1994 pp. 15-18.
Armijos—"High Speed DMOS FET Analog Switches and Switch Arrays" Temic Semiconductors Jun. 22, 1994 pp. 1-10 10 pages Doc 0202.
Assaderaghi "DTMOS: Its Derivatives and Variations and Their Potential Applications" The 12th Int'l Conference on Microelectronics Nov. 2000 pp. 9-10.
Assaderaghi et al. "A Dynamic Threshold Voltage MOSFET (DTMOS) for Ultra-Low Voltage Operation" Int'l Electron Devices Meeting Dec. 1994 pp. 809-812.
Assaderaghi et al. "Dynamic Threshold-Voltage MOSFET (DTMOS) for Ultra-Low Voltage VLSI" IEEE Transactions on Electron vol. 44 No. Mar. 3, 1997 pp. 414-422.
Assaderaghi et al. "History Dependence of Non-Fully Depleted (NFD) Digital SOI Circuits" 1996 Symposium on VLSI Technology Digest of Technical Papers 13.1 1996 pp. 122-123.
Assaderaghi—"A Dynamic Threshold Voltage MOSFET (DTMOS) for Ultra-low Voltage Operation" 1994 IEEE pp. 33.1.1-33.1.4 4 pages Doc 0203.
Assaderaghi—"DTMOS: Its Derivatives and Variations and Their Potential Applications" The 12th Intl Conference on Microelectronics Nov. 2000 pp. 9-10 2 pages Doc 0467.
Assaderaghi—"Dynamic Threshold Voltage MOSFET (DTMOS) for Ultra Low Voltage Operation" International Electron Devices Meeting Dec. 1994 pp. 809-812 4 pages Doc 0212.
Assaderaghi—"Transient Pass-Transistor Leakage Current in SOI MOSFETs" IEEE Electron Device Letters vol. 18 No. Jun. 6, 1997 pp. 241-243 3 pages Doc 0312.
Ayasli—"A Monolithic Single-Chip X-Band Four-Bit Phase Shifter" IEEE Transactions on Microwave Theory and Techniques vol. MTT-30 No. Dec. 12, 1982 pp. 2201-2206 6 pages Doc 0159.
Ayasli—"An X-Band 10 W Monolithic Transmit-Receive GaAs FET Switch" Raytheon Research Division May 31-Jun. 11983 IEEE pp. 42-46 5 pages Doc 0155.
Ayasli—"Microwave Switching with GaAs FETs" Microwave Journal Nov. 1982 pp. 719-723 10 pages Doc 0156.
Bahl—"Lumped Elements for RF and Microwave Circuits" Artech House 2003. pp. 353-394 58 pages Doc 0563.
Baker—"Designing Nanosecond High Voltage Pulse Generators Using Power MOSFETs" Electronic Letters 1994 pp. 1634-1635 2 pages Doc 0204.
Baker—"Series Operation of Power MOSFETs for High Speed Voltage Switching Applications" American Institute of Physics 1993 pp. 1655-1656 2 pages Doc 0198.
Baker—"Stacking Power MOSFETs for Use in High Speed Instrumentation" American Institute of Physics 1992 pp. 5799-5801 3 pages Doc 0193.
Bawedin—"Unusual Floating Body Effect in Fully Depleted MOSFETs" IMEP Enserg France and Microelectronics Laboratory Universite Catholique de Louvain Belgium Oct. 2004 22 pages Doc 0614.
Bernkopf—"A High Power KKa-Band Monolithic TR Switch" 1991 IEEE IEEE 1991 Microwave and Millimeter-Wave Monolithic Circuits Symposium pp. 15-18 4 pages Doc 0186.
Bernstein et al. "Design and CAD Challenges in sub-90nm CMOS Technologies" IBM Thomas J. Watson Research Center NY Nov. 11-13, 2003 pp. 129-136.
Bernstein—"SOI Circuit Design Concepts" IBM Microelectronics 2007 239 pages Doc 0654.
Bernstein—"SOI Circuit Design Concepts" Springer Science + Business Media 2000 239 pages Doc 0427 (A-B).
Bolam et al. "Reliability Issues for Silicon-on-Insulator" 2000 IEEE IBM Microelectronics Division pp. 6.4.1-6.4.4 4 pages.
Bonkowski—"Integration of Triple Band GSM Antenna Switch Module Using SOI CMOS" IEEE Radio Frequency Integrated Circuits Symposium 2004 pp. 511-514 4 pages Doc 0598.

Botto—"Series Connected Soft Switched IGBTs for High Power High Voltage Drives Applications: Experimental Results" IEEE 1997 pp. 3-7 5 pages Doc 0271.
Brindle et al. "Method and Apparatus for use in Improving Linearity of MOSFETs using an Accumulated Charge Sink" U.S. Appl. No. 13/850,251, filed Mar. 25, 2013 112 pgs.
Burgener—"CMOS SOS Switches Offer Useful Features High Integration" CMOS SOS Switches Microwaves & RF Aug. 2001 pp. 107-118 7 pages Doc 0523.
Burghartz—"Integrated RF and Microwave Components in BiCMOS Technology" IEEE Transactions on Electron Devices 1996 pp. 1559-1570 12 pages Doc 0236.
C. F. Edwards et al.: "The Effect of Body Contact Series Resistance on SOI CMOS Amplifier Stages" IEEE Transactions on Electron Devices vol. 44 No. Dec. 12, 1997 (Dec. 1, 1997) pp. 2290-2294 XP000724138 DOI: doi: 10.110916.644655.
C. Tinella et al.: "A High-Performance CMOS-SOI Antenna Switch for the 2.5-5-GHz Band" IEEE Journal of Solid-State Circuits vol. 38 No. Jul. 7, 2003 (Jul. 1, 2003) XP001169616 DOI: doi:10.1109JSSC.2003.813289.
Carr—"Secrets of RF Circuit Design" McGraw-Hill 1997 293 pages Doc 0272 (A-D).
Casu et al. "Comparative Analysis of PD-SOI Active Body-Biasing Circuits" IEEE Int'l SOI Conference Oct. 2000 pp. 94-95.
Casu et al. "Synthesis of Low-Leakage PD-SOI Circuits with Body Biasing" Int'l Symposium on Low Power Electronics and Design Aug. 2001 pp. 287-290.
Casu Mario Roberto "High Performance Digital CMOS Circuits in PD-SOI Technology: Modeling and Design" Tesi di Dottoralo di Recerca Gennaio 2002 Politecnico di Torino Corso di Dottorato di Recerca in Ingegneria Elettronica e delle Communicazioni 200 pgs.
Casu—"Comparative Analysis of PD-SOI Active Body-Biasing Circuits" IEEE Intl SOI Conference Oct. 2000 pp. 94-95 2 pages Doc 0462.
Cathelin—"Antenna Switch Devices in RF Modules for Mobile Applications" ST Microelectronics Front-End Technology Manufacturing Crolles France Mar. 2005 42 pages Doc 0623.
Caverly "A Project Oriented Undergraduate CMOS Analog Microelectronic System Design Course" IEEE 1997 pp. 87-88.
Caverly "Development of a CMOS Cell Library for RF Wireless and Telecommunications Applications" VLSI Symposium 1998.
Caverly "Distortion in GaAs MESFET Switch Circuits" 1994.
Caverly "Distortion in Microwave Control Devices" 1997.
Caverly "Distortion Properties of Gallium Arsenide and Silicon RF and Microwave Switches" IEEE 1997 pp. 153-156.
Caverly "High Power Gallium Nitride Devices for Microwave and RF Control Applications" 1999 pp. 1-30.
Caverly "High Power Gallium Nitride Devices for Microwave and RF Control Applications" 2000 pp. 1-33.
Caverly "Linear and Nonlinear Characteristics of the Silicon CMOS Monolithic 50-Omega Microwave and RF Control Element" IEEE Journal of Solid-State Circuits 1999 pp. 124-126.
Caverly "Nonlinear Properties of Gallium Arsenide and Silicon FET-Based RF and Microwave Switches" IEEE 1998 pp. 1-4.
Caverly et al. "A Silicon CMOS Monolithic RF and Microwave Switching Element" 27th European Microwave Conference 1997 pp. 1046-1051.
Caverly et al. "CMOS RF Circuits for Integrated Wireless Systems" IEEE 1998 pp. 1-4.
Caverly et al. "Gallium Nitride-Based Microwave and RF Control Devices" 2001.
Caverly et al. "On-State Distortion in High Electron Mobility Transistor Microwave and RF Switch Control Circuits" IEEE Transactions on Microwave Theory and Techniques 2000 pp. 98-103.
Caverly et al. "Spice Modeling of Microwave and RF Control Diodes" IEEE 2000 pp. 28-31.
Caverly Robert H. "A Silicon CMOS Monolithic RF and Microwave Switching Element" 1997 European Microwave Conference Jerusalem Sep. 1987 4 pgs.
Caverly—"7Development of a CMOS Cell Library for RF Wireless and Telecommunications Applications" VLSI Symposium 1998 6 pages Doc 0329.

(56) References Cited

OTHER PUBLICATIONS

Caverly—"A Project Oriented Undergraduate CMOS Analog Microelectronic System Design Course" IEEE 1997 pp. 87-88 2 pages Doc 0274.
Caverly—"A Silicon CMOS Monolithic RF and Microwave Switching Element" 27th European Microwave Conference 1987 pp. 1046-1051 10 pages Doc 0166.
Caverly—"CMOS RF Circuits for Integrated Wireless Systems" IEEE 1998 pp. 1-4 4 pages Doc 0328.
Caverly—"Distortion in GaAs MESFET Switch Circuits" 1994 5 pages Doc 0205.
Caverly—"Distortion Properties of Gallium Arsenide and Silicon RF and Microwave Switches" IEEE 1997 pp. 153-156 4 pages Doc 0276.
Caverly—"Gallium Nitride-Based Microwave and RF Control Devices" 2001 17 pages Doc 0475.
Caverly—"High Power Gallium Nitride Devices for Microwave and RF Control Applications" 1999 pp. 1-30 30 pages Doc 0377.
Caverly—"High Power Gallium Nitride Devices for Microwave and RF Control Applications" 2000 pp. 1-33 35 pages Doc 0432.
Caverly—"Linear and Nonlinear Characteristics of the Silicon CMOS Monolithic 50-Omega Microwave and RF Control Element" IEEE Journal of Solid-State Circuits vol. 34 No. Jan. 1, 1999 pp. 124-126 3 pages Doc 0378.
Caverly—"Nonlinear Properties of Gallium Arsenide and Silicon FET-Based RF and Microwave Switches" IEEE 1998 pp. 1-4 4 pages Doc 0330.
Caverly—"On-State Distortion in High Electron Mobility Transistor Microwave and RF Switch Control Circuits" IEEE Transactions on Microwave Theory and Techniques 2000 pp. 98-103 6 pages Doc 0433.
Caverly—"Spice Modeling of Microwave and RF Control Diodes" IEEE 2000 pp. 28-31 4 pages Doc 0434.
Caverly—Distortion in Microwave Control Devices 1997 10 pages Doc 0275.
Chan et al. "Comparative Study of Fully Depleted and Body-Grounded Non Fully Depleted SOI MOSFET's for High Performance Analog and Mixed Signal Circuits" IEEE Transactions on Electron Devices vol. 42 No. Nov. 11, 1995 pp. 1975-1981.
Chan—"A Novel SOI CBiCMOS Compatible Device Structure for Analog and Mixed-Mode Circuits" Dept. of EECS University of California at Berkeley IEEE Nov. 1995 pp. 40-43 4 pages Doc 1078.
Chang—"Investigations of Bulk Dynamic Threshold-Voltage MOSFET with 65 GHz "Normal-Mode" Ft and 220GHz "Over-Drive Mode" FT for RF Applications" Institute of Electronics National Chiao-Tung University Taiwan 2001 Symposium on VLSI Technology Digest of Technical Papers pp. 89-90 2 pages Doc 0476.
Chao—"High-Voltage and High-Temperature Applications of DTMOS with Reverse Schottky Barrier on Substrate Contacts" vol. 25 No. Feb. 2, 2004 pp. 86-88 3 pages Doc 0605.
Chen et al. "Dual-Gate GaAs FET: A Versatile Circuit Component for MMICs" Microwave Journal Jun. 1989 pp. 125-135.
Chen et al. "Low Power Multi-Gigabit DRAM Cell Design Issues Using SOI Technologies" http:bwrc.eecs.berkeley.edupeoplegrad_studentschenffreports May 1999.
Chen—"G4-FET Based Voltage Reference" Masters Theses University of Tennessee Knoxville Trace: Tennessee Research and Creative Exchange May 2004 57 pages Doc 0607.
Chen—"Lower Power Multi-Gigabit DRAM Cell Design Issues Using SOI Technologies" http:bwrc.eecs.berkeley.edupeoplegrad_studentschenffreports May 14, 1999 6 pages Doc 0418.
Cheng et al. "Gate-Channel Capacitance Characteristics in the Fully-Depleted SOI MOSFET" IEEE Transactions on Electron Devices vol. 48 No. Feb. 2, 2001 pp. 388-391.
Cho—"Comparative Assessment of Adaptive Body-Bias SOI Pass-Transistor Logic" Fourth Intl Symposium on Quality Electronic Design Mar. 2003 pp. 55-60 6 pages Doc 0583.
Choumei—A High Efficiency 2V Single Supply Voltage Operation RF Front End MMIC for 1.9GHz Personal Handy Phone Systems: IEEE 1998 pp. 73-76 4 pages Doc 0331.
Chuang—"SOI for Digital Cmos Vlsi Design: Design Considerations and Advances" Proceeding of the IEEE vol. 86 No. 4 Apr. 1, 1998 pp. 689-720 32 pages Doc 1079.
Chung et al. "A New SOI Inverter for Low Power Applications" IEEE SOI Conference Oct. 1996 pp. 20-21.
Chung et al. "A New SOI Inverter Using Dynamic Threshold for Low-Power Applications" IEEE Electron Device Letters vol. 18 No. Jun. 6, 1997 pp. 248-250.
Chung et al. "A New SOI MOSFET Structure with Junction Type Body Contact" Int'l Electron Device Meeting (IEDM) Technical Digest 1999 pp. 59-62.
Chung et al. "SOI MOSFET Structure with a Junction-Type Body Contact for Suppression of Pass Gate Leakage" IEEE Transactions on Electron Devices vol. 48 No. Jul. 7, 2001 pp. 1360-1365.
Chung—"A New SOI Inverter for Low Power Applications" IEEE SOI Conference Oct. 1996 pp. 20-21 2 pages Doc 0267.
Chung—"A New SOI Inverter Using Dynamic Threshold for Low-Power Applications" IEEE Electron Device Letters vol. 18 No. Jun. 6, 1997 pp. 248-250 3 pages Doc 0313.
Chung—"A New SOI MOSFET Structure with Junction Type Body Contact" International Electron Device Meeting (IEDM) Technical Digest 1999 pp. 59-62 4 pages Doc 0379.
Colinge "Fully Depleted SOI CMOS for Analog Applications" IEEE Transactions on Electron Devices 1998 pp. 1010-1016.
Colinge Jean-Pierre "An SOI Voltage-Controlled Bipolar-MOS Device" IEEE Transactions on Electron Devices vol. ED-34 No. Apr. 4, 1987 pp. 845-849.
Colinge—"A Low Voltage Low Power Microwave SOI MOSFET" IEEE International SOI Conference 1996 pp. 128-129 2 pages Doc 0237.
Colinge—"Fully Depleted SOI CMOS for Analog Applications" IEEE Transactions on Electron Devices 1998 pp. 1010-1016 7 pages Doc 0168.
Couch—"Digital and Analog Communication Systems" 2001 Prentice-Hall 398 pages Doc 0477 (A-E).
Couch—"Modern Communication System" Prentice-Hall 1995 316 pages Doc 0214 (A-D).
Cristoloveanu—"State-of-the-art and Future of Silicon on Insulator (SOI) Technologies Materials and Devices" Microelectronics Reliability 40 (2000) pp. 771-777 7 pages Doc 0435.
Cristoloveanu—"The Four-Gate Transistor" Institute of Microelectronics Electromagnetism and Photonics ESSDERC 2001 pp. 323-326 4 pages Doc 0478.
Crols—"CMOS Wireless Transceiver Design" Kluwer Academic 1997 214 pages Doc 0277 (A-C).
Damiano et al. "Integrated Dynamic Body Contact for H Gate PD SOI MOSFETs for High PerformanceLow Power" IEEE SOI Conference Oct. 2004 pp. 115-116.
Darabi—"A 2.4GHz CMOS Transceiver for Bluetooth" IEEE 2001 pp. 89-92 3 pages Doc 0479.
Darabi—"A Dual-Mode 802.11bBluetooth Radio in 0.35-m CMOS" IEEE Journal of Solid-State Circuits vol. 40 No. Mar. 3, 2005 pp. 698-706 10 pages Doc 0624.
Das et al. "A Novel Sub-1 V High Speed Circuit Design Technique in Partially Depleted SOI-CMOS Technology with Ultra Low Leakage Power" Proceedings of the 28th European Solid-State Circuits Conference Sep. 2002 pp. 267-270.
Das—"A Novel Sub-1 V High Speed Circuit Design Technique in Partially Depleted SOI-CMOS Technology with Ultra Low Leakage Power" Proceedings of the 28th European Solid-State Circuits Conference Sep. 2002 pp. 24-26 22 pages Doc 0559.
Das—"Ultra-Low-Leakage Power Strategies for Sub-1 V Vlsi: Novel Circuit Styles and Design Methodologies for Partially Depleted Silicon-on-Insulator (PD-SOI) CMOS Technology" Proceedings of the 16th Intl. Conference on VLSI Design 2003 6 pages Doc 0564.
De Boer—"Highly Integrated X-Band Multi-Function MMIC with Integrated LNA and Driver Amplifier" TNO Physics and Electronics Laboratory 2002 pp. 1-4 4 pages Doc 0534.
De Houck—"Design of EEPROM Memory Cells in Fully Depleted CMOS SOI Technology" Universite Catholique de Louvain Faculty of Applied Science Laboratory of Electronics and Microelectronics Academic Year 2003-2004 Jan. 2003 94 pages Doc 0599.

(56) References Cited

OTHER PUBLICATIONS

De La Houssaye—"Microwave Performance of Optically Fabricated T-Gate Thin. Film Silicon on Sapphire Based MOSFETs" IEEE Electron Device Letters 1995 pp. 289-292 4 pages Doc 0215.
Defree—"Peregrine Trumpets HaRP" https:www.edn.comelectronics-news4325802Peregrine-Trumpets-HaRP Oct. 7, 2005 2 pages Doc 7000.
Dehan et al. "Alternative Architectures of SOI MOSFET for Improving DC and Microwave Characteristics" Microwave Laboratory Universite catholique de Louvain Sep. 2001 4 pgs.
Dehan et al. "Dynamic Threshold Voltage MOS in Partially Depleted SOI Technology: A Wide Frequency Band Analysis" Solid-State Electronics 49 (2005) pp. 67-72.
Dehan—"Partially Depleted SOI Dynamic Threshold MOSFET for Low-Voltage and Microwave Applications" 203rd Meeting of the Electrochemical Society—11th Int. Symp. on SOI technology and devices Paris France 2003 1 page Doc 1080.
Derossi—"A Routing Switch Based on a Silicon-on-Insulator Mode Mixer" IEEE Photonics Technology Letters 1999 pp. 194-196 3 pages Doc 0380.
Deutsche Post—Advice of delivery for Application No. EP06786943.8 dated Jul. 27, 2011 2 pages Doc2186.
Deutsche Post—Advice of delivery for Application No. EP06786943.8 dated Nov. 13, 2016 3 pages Doc 2208.
Deutsche Post—Advice of delivery for Application No. EP06786943.8 dated Nov. 18, 2011 2 pages Doc2191.
Devlin—"A 2.4 GHz Single Chip Transceiver" Microwave and Millimeter-Wave Monolithic Circuits Symposium 1993 pp. 23-26 4 pages Doc 0199.
Devlin—"The Design of Integrated Switches and Phase Shifters" Nov. 241999 15 pages Doc 0381.
Dinh Le T. International Search Report received from the USRO dated Mar. 28, 2003 for related appln No. PCTUS0232266 2 pgs.
Douseki et al. "A 0.5v SIMOX-MTMCOS Circuit with 200ps Logic Gate" IEEE Int'l Solid-State Circuits Conference 1996 pp. 84-85 423.
Douseki—"A 0.5-V MTCMOSSIMOX Logic Gate" IEEE Journal of Solid-State Circuits vol. 32 No. Oct. 10, 1997 6 pages Doc 0320.
Doyama "Class E Power Amplifier for Wireless Transceivers" University of Toronto 1999 pp. 1-9.
Drake et al. "Analysis of the Impact of Gate-Body Signal Phase on DTMOS Inverters in 0.13um PD-SOI" Department of EECS University of Michican Ann Arbor MI Sep.Oct. 2003 16 pgs.
Drake et al. "Analysis of the Impact of Gate-Body Signal Phase on DTMOS Inverters in 0.13μm PD-SOI" Department of EECS University of Michigan Ann Arbor MI Sep.Oct. 2003 4 pgs.
Drake et al. "Evaluation of Dynamic-Threshold Logic for Low-Power VLSI Design in 0.13um PD-SOI" IFIP VLSI-SoC 2003 IFIP WG 10.5 International Conference on Very Large Scale Integration of System-on-Chip Darmstadt Germany Dec. 1-3, 2003.
Drake—"Dynamic-Threshold Logic for Low Power VLSI Design" www.research.IBM.comacas 2001 5 pages Doc 0480.
Drake—"Evaluation of Dynamic-Threshold Logic for Low-Power VLSI Design in 0.13um PD-SOI" University of Michigan Ann Arbor MI Dec. 2003 29 pages Doc 0596.
Drake—Evaluation of Dynamic-Threshold Logic for Low-Power VLSI Design in 0.13 μm PD-SOI: IFIP VLSI-SoC 2003 IFIP WG 10.5 International Conference on Very Large Scale Integration of System-on-Chip Darmstadt Germany Dec. 1-3, 2003 6 pages Doc 0597.
Drozdovsky—"Large Signal Modeling of Microwave Gallium Nitride Based HFETs" Asia Pacific Microwave Conference 2001 pp. 248-251 4 pages Doc 0481.
Dufrene et al. "The G4-FET: Low Voltage to High Voltage Operation and Performance" Dept. of Electrical and Computer Engineering The University of Tennessee IEEE 2003 pp. 55-56.
Dufrene—"Investigation of the Four-Gate Action in G4-FETs" IEEE Transactions on Electron Devices vol. 51 No. Dec. 11, 2004 pp. 1931-1935 5 pages Doc 0617.

Dunga—"Analysis of Floating Body Effects in Thin Film SOI MOSFETs Using the GIDL Current Technique" Proceedings of the 8th International Symposium on Physical and Failure Analysis of Integrated Circuits 2001 pp. 254-257 4 pages Doc 0482.
Duyet—"Effects on Body Reverse Pulse Bias on Geometric Component of Charge Pumping Current in FD SOI MOSFETs" Proceedings IEEE Intl SOI Conference Oct. 5-8, 1998 pp. 79-80 2 pages Doc 0364.
Duyet—"Suppression of Geometric Component of Charge Pumping Current in Thin Film Silicon on Insulator Metal-Oxide-Semiconductor-Field-Effect Transistors" Copyright (c) 1998 The Japan Society of Applied Physics; Japanese Journal of Applied Physics vol. 37 Part 2 No. 7B pp. L855-858 Apr. 14, 1998 (Accepted for Publication May 27, 1998) 4 pages.
Eastman—"High Power Broadband Linear Solid State Amplifier" 16th Quarterly Rep. under MURI Contract No. N00014-9611223 for period Jun. 1, 2000 to Aug. 31, 2000 Sep. 2000 8 pages Doc 0459.
Ebner Von Eschenbach Jennifer Communication from the EPO dated Feb. 4, 2009 for related appln. No. 06786943.8 7 pgs.
Edwards—"The Effect of Body Contact Series Resistance on SOI CMOS Amplifier Stages" IEEE Transactions on Electron Devices vol. 44 No. Dec. 12, 1997 pp. 2290-2294 5 pages Doc 0325.
Eggert—"A SOI-RF-CMOS Technology on High Resistivity SIMOX Substrates for.Microwave Applications to 5 GHz" IEEE Transactions on Electron Devices 1997 pp. 1981-1989 9 pages Doc 0278.
Eggert—"CMOSSIMOX-RF-Frontend for 1.7 GHz" Solid State Circuits Conference 1996 4 pages Doc 0239.
Eisenberg—"High Isolation 1-20 GHz MMIC Switches with On-Chip Dryers" IEEE Microwave and Millimeter Wave Monolithic Circuits Symposium 1989 pp. 41-45 5 pages Doc 0173.
Ernst—"Detailed Analysis of Short-Channel SOI DT-MOSFET" Laboratoire de Physique des Composants a Semiconducteurs Enserg France Sep. 1999 pp. 380-383 4 pages Doc 0421.
Eron "Small and Large Signal Analysis of MESETs as Switches" Microwave Journal 1992.
Eron—"Small and Large Signal Analysis of MESETs as Switches" Microwave.Journal 1995 7 pages Doc 0216.
Ezzeddine—"The High VoltageHigh Power FET (HiVP1)" 2003 IEEE Radio Frequency Integrated Circuits Symposium 4 pages Doc 0566.
F. Assaderaghi et al. "A Dynamic Threshold Voltage MOSFET (DTMOS) for Ultra-low Voltage Operation" 1994 IEEE pp. 33.1.1-33.1.4.
F. Assaderaghi et al.: "Dynamic Threshold-voltage MOSFET (DTMOS) for Ultra-low Voltage VLSI" IEEE Transactions on Electron Devices vol. 44 No. Mar. 3, 1997 (Mar. 1, 1997) pp. 414-422 XP000688254 DOI: doi:10.110916.556151.
F. Hameau; O. Rozeau: "Radio-Frequency Circuits Integration Using CMOS SOI 0.25 urn Technology" 2002 RF IC Design Workshop Europe Mar. 19-22, 2002 Grenoble France Mar. 19, 2002 (Mar. 19, 2002).
Ferlet-Cavrois—"High Frequency Characterization of SOI Dynamic Threshold. Voltage MOS (DTMOS) Transistors" 1999 IEEE International SOI Conference Oct. 1999 pp. 24-25 2 pages Doc 0423.
Fiorenza—"RF Power Performance of LDMOSFETs on SOI: An Experimental Comparison with Bulk Si MOSFETs" IEEE Radio Frequency Integrated Circuits Symposium 2001 pp. 43-46 4 pages Doc 0483.
Flandre et al. "Design of EEPROM Memory Cells in Fully Depleted 'CMOS SOI Technology'" Catholic University of Louvain Faculty of Applied Science Laboratory of Electronics and Microelectronics Academic Year 2003-2004 94 pgs.
Flandre—"Fully Depleted SOI CMOS Technology for Low Voltage Low Power Mixed DigitalAnalogMicrowave Circuits" Analog Integrated Circuits and Signal Processing 1999 pp. 213-228 16 pages Doc 0383.
Fling et al. "Present Status and Future Direction of BSIM SOIL Model for High-PerformanceLow-PowerRF Application" IBM Microelectronics Semiconductor Research and Development Center Apr. 2002 4 pgs. REF 24.
Freeman—"Radio System Design for Telecommunications" Wiley 1997 461 pages Doc 0279 (A-F).

(56) References Cited

OTHER PUBLICATIONS

Fukuda—"SOI CMOS Device Technology" OKI Technical Review Special Edition on 21st Century Solutions 2001 pp. 54-57 4 pages Doc 0484.
Fung et al. "Frequency Dispersion in Partially Depleted SOI MOSFET Output Resistance" Proceedings 1996 IEEE International SOI Conference Oct. 1996 pp. 146-147.
Fung et al. "Present Status and Future Direction of BSIM SOIL Model for High-PerformanceLow-PowerRF Application" IBM Microelectronics Semiconductor Research and Development Center Apr. 2002 4 pgs.
Fung—"Controlling Floating-Body Effects for 0.13 μm and .10 μm SOI CMOS" IDEM 00-231-234 Dec. 10-13, 2000 IEEE 4 pages Doc 8017.
Fung—"On the Body-Source Built-In Potential Lowering of SOI MOSFETs" IEEE Electron Device Letters vol. 24 No. Feb. 2, 2003 pages Doc 8018.
Fung—"Present Status and Future Directions of BSIM SOIL Model for High-PerformanceLow-PowerRF Application" IBM Microelectronics Semiconductor Research and Development Center Apr. 2002 4 pages Doc 0554.
Fuse et al. "0.5V SOI CMOS Pass-Gate Logic" ISSCC96 Session 5 Technology Directions: High-Speed Low-Power 1998 IEEE International Solid-State Circuits Conference.
Fuse—"0.5V SOI CMOS Pass-Gate Logic" 1996 IEEE Intl. Solid-State Circuits Conference pp. 88-89 424 3 pages Doc 0257.
Fuse—"A 0.5V 200MHz 1-Stage 32b ALU Using a Body Bias Controlled SOI Pass-Gate Logic" IEEE Intl Solid-State Circuits Conference Feb. 1997 3 pages Doc 0299.
G. O. Workman; J. G. Fossum: "A Comparative Analysis of the Dynamic Behavior of BTGSOI MOSFETs and Circuits with Distributed Body Resistance" IEEE Transactions on Electron Devices vol. 45 No. 10 Oct. 1998 (Oct. 1, 1998) pp. 2138-2145 XP011016703.
Gautier—"Body Charge Related Transient Effects in Floating Body SOI NMOSFETs" IEDM Tech. Digest 1995 pp. 623-626 4 pages Doc 0217.
Gentinne—"Measurement and Two-Dimensional Simulation of Thin-Film SOI MOSFETs: Intrinsic Gate Capacitances at Elevated Temperatures" Solid-State Electronics vol. 39 No. 11 pp. 1613-1619 1996 7 pages Doc 0240.
Gibson—"The Communication Handbook" CRC Press 1997 812 pages Doc 0280 (A-R).
Giffard: "Dynamic Effects in SOI MOSFETs" IEEE SOSSOI Technology Conference Oct. 1991 pp. 160-161 2 pages Doc 0192.
Gil et al. "A High Speed and Low Power SOI Inverter Using Active Body-Bias" Proceedings Int'l Symposium on Low Power Electronics and Design Aug. 1998 pp. 59-63.
Gil et al. "A High Speed and Low Power Soi Inverter Using Active Body-Bias" Solid-State Electronics vol. 43 1999 pp. 791-799.
Giugni—"A Novel Multi-Port MicrowaveMillimeter-Wave Switching Circuit" Microwave Conference 2000 4 pages Doc 0436.
Goldman—"0.15 μm SOI DRAM Technology Incorporating Sub-Volt Dynamic Threshold Devices for Embedded Mixed-Signal & RF Circuits" Oct. 1-4, 2001 IEEE Soi Conference pp. 97-98 2 pages Doc 0531.
Goo—"History-Effect-Conscious Spice Model Extraction for PD-SOI Technology" 2004 IEEE International SOI Conference Oct. 2004 pp. 156-158 3 pages Doc 0616.
Gopinath—"GaAs FET RF Switches" IEEE Transactions on Electron Devices Jul. 1985 pp. 1272-1278 7 paegs Doc 0161.
Gould—"NMOS SPDT Switch MMIC with >48dB Isolation and 30dBm IIP3 for Applications within GSM and UMTS Bands" Bell Labs 2001 pp. 1-4 4 pages Doc 0486.
GPO—Office Action for Application No. DE112011103554.3 dated May 18, 2017 15 pages Doc 2348.
Gritsch—"Influence of GenerationRecombination Effects in Simulations of Partially Depleted SOI MOSFETs" Solid-State Electronics 45 (2001) Received Dec. 22, 2000 dated Feb. 14, 2001 pp. 621-627 7 pages Doc 0516.

Gu—"A 2.3V PHEMT Power SP3T Antenna Switch IC for GSM Handsets" IEEE GaAs Digest 2003 pp. 48-51 4 pages Doc 0561.
Gu—"A High Performance GaAs SP3T Switch for Digital Cellular Systems" IEEE MTT-S Digest 2001 pp. 241-244 4 pages Doc 0487.
Gu—"A High Power DPDT MMIC Switch for Broadband Wireless Applications" IEEE MTT-S Digest 2003 pp. 173-176 4 pages Doc 0568.
Gu—"Low Insertion Loss and High Linearity PHEMT SPDT and SP3T Switch ICS for WLAN 802.11abg Application" 2004 IEEE Radio Frequency Integrated Circuits Symposium 2004 pp. 505-508 4 pages Doc 0600.
H. Lee et al.: "Analysis of body bias effect with PD-SOI for analog and RF applications" Solid State Electron. vol. 46 2002 pp. 1169-1176 XP004365796.
Hagan (or Hagen)—Radio Frequency Electronics: Cambridge University Press 1996 194 pages Doc 0241(A-B).
Hameau—"Radio-Frequency Circuits in Integration Using CMOS SOI 0.25um Technology" 2002 RF IC Design Workshop Europe Mar. 2002 Grenoble France 6 pages Doc 0551.
Han—"A Simple and Accurate Method for Extracting Substrate Resistance of RF MOSFETs" IEEE Electron Device Letters vol. 23 No. 7 Jul. 2002 pp. 434-436 3 pages Doc 0557.
Hanzo—"Adaptive Wireless Transceivers" Wiley 2002 379 pages Doc 0535 (A-E).
Harjani—"A Prototype Framework for Knowledge Based Analog Circuit Synthesis" IEEE Design Automation Conference Jun. 28-Jul. 1, 1987 pp. 42-49 8 pages Doc 0164.
Harneau—"Radio-Frequency Circuit Integration Using CMOS SOI 0.25 μm Technology" 2002 RF IC Design Workshop Europe Mar. 19-22, 2002 Grenoble France 6 pages Doc 0552.
Harris Corporation—HI-5042 thru HI-5051 Datasheet 1999 9 pages Doc 0386.
Harris—"CMOS Analog Switches" 1999 pp. 1-9 9 pages Doc 0385.
Heller—"Cascode Voltage Switch Logic: A Different CMOS Logic Family" IEEE International Solid-State Circuits Conference Feb. 22-24, 1984 pp. 16-17 2 pages Doc 0160.
Henshaw—"Design of an RF Transceiver" IEEE Colloquium on Analog Signal Processing 1998 6 pages Doc 0332.
Hess—"Transformerless Capacitive Coupling of Gate Signals Operation of Power MOS Devices" IEEE 1999 pp. 673-675 3 pages Doc 0387.
Hickman—"Practical RF Handbook" Newnes 1997 270 pages Doc 0281 (A-D).
Hieda-Floating-Body Effect Free Concave SOI-MOSFETs (COS-MOS) ULSI Research Center Toshiba Corporation IEEE 1991 pp. 26.2.1-26.2.4 Dec. 811 1991 4 pages Doc 0187.
Hiramoto Toshiro et al. "Low Power and Low Voltage MOSFETs with Variable Threshold Voltage Controlled by Back-Bias" IEICE Trans. Electron vol. E83-C No. Feb. 2, 2000 pp. 161-169.
Hirano—"Impact of Actively Body Bias Controlled (ABC) SOI SRAM by Using Direct Body Contact Technology for Low Voltage Application" IEEE 2003 pp. 2.4.1-2.4.4 4 pages Doc 0569.
Hirota—"0.5V 320MHz 8b MultiplexerDemultiplier Chips Based on a Gate Array with Regular-Structured DRMOSSOI" Feb. 5-7, 1998 1998 IEEE International Solid-State Circuits Conference. Digest of Technical Papers ISSCC. First Edition p. 12.2-1-12.2-11 11 pages Doc 0351.
Hittite Microwave—"Miniature Dual Control SP4T Switches for Low Cost Multiplexing" Hittite Microwave 1995 5 pages Doc 0218.
Hittite Microwave—"Positive Bias GaAs Multi-Throw Switches with Integrated TTL Decoders" Hittite Microwave 2000 5 pages Doc 0438.
Hittite Microwave—"Wireless Symposium 2000 is Stage for New Product Introductions" Hittite Microwave 2000 pp. 1-8 8 pages Doc 0439.
Hittite Microwave—Floating Ground SPNT MMIC Switch Driver Techniques 2001 4 pages Doc 0488.
Honeywell "Honeywell SPDT Absorptive RF Switch" Honeywell 2002 pp. 1-6.
Honeywell "Honeywell SPDT Reflective RF Switch" Honeywell Advance Information 2001 pp. 1-3.
Honeywell—"CMOS SOI RF Switch Family" 2002 pp. 1-4 4 pages Doc 0536.

(56) References Cited

OTHER PUBLICATIONS

Honeywell—"CMOS SOI Technology" 2001 pp. 1-7 7 pages Doc 0489.
Honeywell—"Honeywell SPDT Absorptive RF Switch" Honeywell 2002 pp. 1-6 6 pages Doc 0537.
Honeywell—"Honeywell SPDT Reflective RF Switch" Honeywell Advance Information 2001 pp. 1-3 3 pages Doc 0490.
Horiuchi Masatada "A Dynamic-Threshold SOI Device with a J-FET Embedded Source Structure and a Merged Body-Bias-Control Transistor—Part II: Circuit Simulation" IEEE Transactions on Electron Devices vol. 47 No. 8 Aug. 2000 pp. 1593-1598.
Horiuchi—"A Dynamic-Threshold SOI Device with a J-FET Embedded Source Structure and a Merged Body-Bias-Control Transistor—Part I: a J-FET Embedded Source Structure Properties" IEEE Transactions on Electron Devices vol. 47 No. 8 Aug. 2000 pp. 1587-1592 6 pages Doc 0456.
Houng—"60-70 dB Isolation 2-19 GHz Switches" Raytheon Electromagnetic Systems Division 1989 IEEE GaAs IC Symposium pp. 173-176 4 pages Doc 0174.
Hsu—"Comparison of Conventional and Thermally-Stable Cascose (TSC) A;GaAsGaAs HBTs for Microwave Power Applications" Journal of Solid-State Electronics V. 43 Sep. 1999 2 pages Doc 0422.
Hu et al. "A Unified Gate Oxide Reliability Model" IEEE 99CH36296 37th Annual International Reliability Physics Symposium San Diego CA 1999 pp. 47-51.
Huang "A 0.5 um CMOS TR Switch for 900-MHz Wireless Applications"; IEEE Journal of Solid-State Circuits vol. 36 No. 3 Mar. 2001 pp. 486-492.
Huang "Schottky Clamped MOS Transistors for Wireless CMOS Radio Frequency Switch Application" University of Florida 2001 pp. 1-167.
Huang et al. "A 2.4-GHz Single-Pole Double Throw TR Switch with 0.8-dB Insertion Loss Implemented in a CMOS Process (slides)" Silicon Microwave Integrated Circuits and Systems Research 2001 pp. 1-16.
Huang et al. "A 900-MHz TR Switch with a 0.8-dB Insertion Loss Implemented in a 0.5-um CMOS Process" IEEE Custom Integrated Circuits Conference 2000 pp. 341-344.
Huang et al. "Device Physics Performance Simulations and Measured Results of SOI MOS and DTMOS Transistors and Integrated Circuits" Beijing Microelectronics Technology Institute 1998 IEEE pp. 712-715.
Huang et al. "Hot Carrier Degradation Behavior in SOI Dynamic-Threshold-Voltage nMOSFETs (n-DTMOSFET) Measured by Gated-Diode Configuration" Microelectronics Reliability 43 (2003) pp. 707-711.
Huang et al. "TFSOI Can It Meet the Challenge of Single Chip Portable Wireless Systems" IEEE International SOI Conference 1997 pp. 1-3.
Huang—"A 0.5-μm CMOS TR Switch for 900-MHz Wireless Applications" IEEE Journal of Solid-State Circuits vol. 36 No. 3 Mar. 2001 pp. 486-492 8 pages Doc 0517.
Huang—"A 2.4-GHz Single-Pole Double Throw TR Switch with 0.8-dB Insertion Loss Implemented in a CMOS Process" Silicon Microwave Integrated Circuits and Systems Research 2001 pp. 1-4 4 pages Doc 0493.
Huang—"A 900-MHz TR Switch with a 0.8-dB Insertion Loss Implemented in a 0.5-μm CMOS Process" IEEE Custom Integrated Circuits Conference 2000 pp. 341-344 4 pages Doc 0440.
Huang—"Device Physics Performance Simulations and Measured Results of SOI MOS and DTMOS Transistors and Integrated Circuits". Beijing Microelectronics Technology Institute Oct. 23, 1998 IEEE pp. 712-715 4 pages.
Huang—"Hot Carrier Degradation Behavior in SOI Dynamic-Threshold-Voltage nMOSFETs (n-DTMOSFET) Measured by Gated-Diode Configuration" Microelectronics Reliability 43 (2003) pp. 707-711 5 pages Doc 0572.
Huang—"Schottky Clamped MOS Transistors for Wireless CMOS Radio Frequency Switch Application" University of Florida 2001 pp. 1-167 167 pages Doc 0494.
Iljima M. et al. "Boosted Voltage Scheme with Active Body-Biasing Control on PD-SOI for Ultra Low Voltage Operation" IEICE Transactions on Electronics Institute of Electronics Tokyo JPO vol. E90C No. 4 Apr. 1, 2007 pp. 666-674.
Imai—"Novel High Isolation FET Switches" IEEE Transactions on Microwave Theory and Techniques 1996 pp. 685-691 7 pages Doc 0242.
Imam—"A Simple Method to Determine the Floating-Body Devices Voltage of SOI CMOS Devices" IEEE Electron Device Letters vol. 21 No. 1 Jan. 2000 pp. 21-23 3 pages.
Intersil—"Radiation Hardened CMOS Dual DPST Analog Switch" Intersil 1999 pp. 1-2 2 pages Doc 0391.
Intersil—"RF Amplifier Design Using HFA3046 HFA3096 HFA3127 HFA3128 Transistor Arrays" Intersil Corporation 1996 pp. 1-4 4 pages Doc 0243.
Ionescu—"A Physical Analysis of Drain Current Transients at Low Drain Voltage in Thin Film SOI MOSFETs" Microelectronic Engineering 28 (1995) pp. 431-434 4 pages Doc 1085.
Iperione Analia International Search Report and Written Opinion received from the EPO dated Nov. 7, 2006 for related appln. No. PCTUS2006026965 19 pgs.
Ippoushi—"SOI Structure Avoids Increases in Chip Area and Parasitic Capacitance Enables Operational Control of Transistor Threshold Voltage" Renesas Edge vol. 2004.Jul. 5, 2004 p. 15 1 page Doc 0610.
Ishida—"A Low Power GaAs Front End IC with Current Reuse Configuration Using 0.15um Gate GaAs MODFETs" IEEE 1997 pp. 669-672 4 pages Doc 0283.
Itoh—"RF Technologies for Low Power Wireless Communications" Wiley 2001 244 pages Doc 0495 (A-C).
Iwata—"Gate Over Driving CMOS Architecture for 0.5V Single Power Supply Operated Devices" IEEE 1997 pp. 290-291 473 pages Doc 0284.
Iyama—"L-Band SPDT Switch Using Si-MOSFET" IEICE Trans. Electron vol. E79-C No. May 5, 1996 pp. 636-643 8 pages Doc 0260.
J.-H. Lee et al.: "Effect of Body Structure on Analog Performance of SOI NMOSFETs" Proceedings 1998 IEEE International SOI Conference Oct. 5, 1998 (Oct. 5, 1998) pp. 61-62 XP000830646.
Jeon—"A New "Active" Predistorter with High Gain Using Cascose-FET Structures" IEEE Radio Frequency Integrated Circuits Symposium 2002 pp. 253-256 4 pages Doc 0538.
Johnson "Advanced High-Frequency Radio Communication" Artech House 1997.
Johnson "Silicon-on-Sapphire Technology for Microwave Circuit Applications" Dissertation UCSD 1997 pp. 1-184.
Johnson et al. "Advanced Thin-Film Silicon-on-Sapphire Technology: Microwave Circuit Applications" IEEE Transactions on Electron Devices vol. 45 No. May 5, 1998 pp. 1047-1054.
Johnson et al. "Silicon-On-Sapphire MOSFET TransmitReceive Switch for L and S Band Transceiver Applications" Electronic Letters 1997 pp. 1324-1326.
Johnson—"A Model for Leakage Control by MOS Transistor Stacking" ECE Technical Papers 1997 pp. 1-28 34 pages Doc 0285.
Johnson—"Advanced High-Frequency Radio Communication" Artech House 1997 205 pages Doc 0286 (A-C).
Johnson—"Advanced Thin Film Silicon-on-Sapphire Technology: Microwave Circuit Applications" IEEE Transactions on Electron Devices vol. 45 No. May 5, 1988 pp. 1047-1054 8 pages Doc 0334 (A-B).
Johnson—"Silicon-On-Sapphire MOSFET TransmitReceive Switch for L and S Band Transceiver Applications" Electronic Letters 1997 pp. 1324-1326 3 pages Doc 0287.
Johnson—"Silicon-On-Sapphire Technology for Microwave Circuit Applications" Dissertation UCSD Jan. 1997 IEEE May 1998 pp. 1-184 214 pages Doc 0288.
Kanda et al. "A Si RF Switch MMIC for the Cellular Frequency Band Using SOI-CMOS Technology" Institute of Electronics Information and Communication Engineers Technical Report vol. 100 No. 152 Jun. 2000 pp. 79-83.

(56) References Cited

OTHER PUBLICATIONS

Kanda et al. "High Performance 19GHz Band GaAs FET Switches Using LOXI (Layerd Oxide Isolation)-MESFETs" IEEE 1997 pp. 62-65.
Karandikar—"Technology Mapping for SOI Domino Logic Incorporating Solutions for the Parasitic Bipolar Effect" ACM 2001 pp. 1-14 14 pages Doc 0496.
Katzin—"High Speed 100+ W RF Switched Using GaAs MMICs" IEEE Transactions on Microwave Theory and Techniques 1992 pp. 1989-1996 8 pages Doc 0194.
Kawakyu—"A 2-V Operation Resonant Type TR Switch with Low Distortion Characteristics for 1.9GHz PHS" IEICE Trans Electron vol. E81-C No. Jun. 6, 1998 pp. 862-867 60 pages Doc 0356.
Kelly—"Integrated Ultra CMIS Designs in GSM Front End" Wireless Design Magazine 2004 pp. 18-22 4 pages Doc 0601.
Keys—"Low Distortion Mixers or RF Communications" Ph.D. Thesis University of California—Berkeley 1995 135 pages Doc 0219.
Kim—"High-Performance V-Band Cascode HEMT Mixer and Downconverter Module" IEEE Transactions on Microwave Theory and Techniques vol. 51 No. 3 p. 805-810 Mar. 2003 6 pages Doc 0584.
Koh et al. "Body-Contracted SOI MOSFET Structure and its Application to DRAM" IEEE Transactions on Electron Devices vol. 45 No. 5 May 1998 pp. 1063-1070.
Koh et al. "Low-Voltage SOI CMOS VLSI Devices and Circuits" Wiley Interscience XP001090589 New York 2001 pp. 57-60 349-354.
Koh—"1Giga Bit SOI DRAM with Fully Bulk Compatible Process and Body-Contacted SOI MOSFET Structure" IEEE 1997 pages Doc 8021.
Koh—"Body-Contacted SOI MOSFET Structure with Fully Bulk CMOS Compatible Layout and Process" IEEE Electron Device Letters vol. 18 No. 3 Mar. 1997 pp. 102-104 3 pages Doc 0305.
Koh—"Low-Voltage SOI CMOS VLSI Devices and Circuits" Wiley Interscience XP001090589 New York 2001 215 pages Doc 0497 (A-C).
Kohama et al. "High Power DPDT Antenna Switch MMIC for Digital Cellular Systems" GaAs IC Symposium 1995 pp. 75-78.
Kohama—"High Power DPDT Antenna Switch MMIC for Digital Cellular Services" IEEE Journal of Solid-State Circuits 1996 pp. 1406-1411 6 pages Doc 0244.
Kohama—"High Power DPDT Antenna Switch MMIC for Digital Cellular Systems" GaAs IC Symposium 1995 pp. 75-78 4 pages Doc 0220.
Koo—"RF Switches" Univ. Toronto Elec. And Computer Engineering Dept. 2001 12 pages Doc 0498.
Koudymov—"Low Loss High Power RF Switching Using Multifinger AlGaNGaN MOSHFETs" University of South Carolina Scholar Commons 2002 pp. 449-451 5 pages Doc 0539.
Krishnan—"Efficacy of Body Ties Under Dynamic Switching Conditions in Partially Depleted SOI CMOS Technology" Proceedings IEEE Intl SOI Conference Oct. 1997 pp. 140-141 2 pages Doc 0321.
Kt-Micro LJevices Inc. Amended Invalidity Contentions for U.S. Pat. No. 8,405,147 Dec. 10, 2013 (Civil Case #: 3:12-cv-00911-H-JLB) 362 pages Doc 8006.
Kuang et al. "A Dynamic Body Discharge Technique for SOI Circuit Applications" IEEE Int'l SOI Conference Oct. 1999 pp. 77-78.
Kuang et al. "A High-Performance Body-Charge-Modulated SOI Sense Amplifier" IEEE Int'l SOI Conference Oct. 2000 pp. 100-101.
Kuang et al. "SRAM Bitline Circuits on PD SOI: Advantages and Concerns" IEEE Journal of Solid-State Circuits vol. 32 No. 6 Jun. 1997 pp. 837-844.
Kuang et al: "A floating body charge monitoring technique for partially depleted SOI technology" Int. J. Electronics vol. 91 No. 11 Nov. 11, 2004 (Nov. 11, 2004) pp. 625-637 XP08118514.

Kuang—"A Dynamic Body Discharge Technique for SOI Circuit Applications" IEEE International SOI Conference Oct. 1999 pp. 77-78 2 pages Doc 0424.
Kuang—"A High-Performance Body-Charge-Modulated SOI Sense Amplifier" IEEE International SOI Conference Oct. 2000 pp. 100-101 2 pages Doc 0463.
Kuang—"SRAM Bitline Circuits on PD SOI: Advantages and Concerns" IEEE Journal of Solid State Circuits vol. 32 No. 6 Jun. 1997 pp. 837-844 8 pages Doc 0314.
Kuang—A Floating-Body Charge Monitoring Technique for Partially Depleted SOI Technology: International Journal of Electronics vol. 91 No. 11 2004 pp. 625-637 13 pages Doc 0618.
Kuge—"SOI-DRAM Circuit Technologies for Low Power High Speed Multigiga Scale Memories" Jun. 8-10, 1995 IEEE Journal of Solid-State Circuits vol. 31 No. 4 Apr. 1996 pp. 586-591 6 pages Doc 0259.
Kuhn—Expert Testimony of Kuhn for Application No. JP2003-535287 dated Aug. 3, 2006 12 pages Doc 2337.
Kumar—"A Simple High Performance Complementary TFSOI BiCMOS Technology with Excellent Cross-Talk Isolation" IEEE International SOI Conference 2000 pp. 142-143 2 pages Doc 0444.
Kuo et al. "Low-Voltage SOI SMOA VLSI Devices and Circuits" 2001 Wiley Interscience New York XP001090589 pp. 57-60 and 349-354.
Kuo J B Lin S-C: "Low-Voltage SOI CMOS VLSI Devices and Circuits Passage" Low-Voltage SOI CMOS VLSI Devices and Circuits Wiley New York NY US Jan. 1, 2001 (Jan. 1, 2001) US pp. 57-60+349 XP001090589.
Kuroda et al. "A 0.9-V 150-MHz 10-mW 4 mm2 2-D Discrete Cosine Transform Core Processor with Variable-Threshold-Voltage Scheme" Technical Paper 1996 IEEE International Solid-State Circuits Conference 1996 Digest of Technical Papers pp. 166-167.
Kuroda—"A 0.9-V 150-Mhz 10-mW 4 mm2 2-D Discrete Cosine Transform Core Processor with Variable-Threshold-Voltage (VT) Scheme" IEEE Journal of Solid-State Circuits vol. 31 No. 11 Nov. 1996 pp. 1770-1779 10 pages Doc 0270.
Kusunoki—"SPDT Switch MMIC Using ED Mode GaAs JFETs for Personal Communications" IEEE GaAs IC Symposium 1992 pp. 135-138 4 pages Doc 0195.
Kwok—"An X-Band SOS Resistive Gate Insulator Semiconductor (RIS) Switch" IEEE Transactions on Electron Device Feb. 1980 pp. 442-448 7 pages Doc 0154.
Larson—"Integrated Circuit Technology Options for RFICs—Present Status and Future Directions" IEEE Journal of Solid-State Circuits 1998 pp. 387-399 13 pages Doc 0335.
Larson—"RF and Microwave Circuit Design for Wireless Communications" Artech House 1996 218 pages Doc 0246 (A-C).
Lascari—"Accurate Phase Noise Prediction in PLL Synthesizers" Applied Microwave & Wireless published May 2000 pp. 90-96 4 pages Doc 0452.
Lauterbach—"Charge Sharing Concept and New Clocking Scheme for Power Efficiency and Electromagnetic Emission Improvement of Boosted Charge Pumps" IEEE Journal of Solid-State Circuits vol. 35 No. 5 May 2000 pp. 719-723 5 pages Doc 0453.
Lederer—"Frequency Degradation of SOI MOS Device Output Conductance" Microwave Laboratory of Universite Catholique de Louvain Belgium IEEE 2003 pp. 76-77 2 pages Doc 0573.
Lederer—"Frequency Degradation of SOI MOS Device Output Conductance" Microwave Laboratory of Universite Catholique de Louvain Belgium Sep.Oct. 2003 1 page Doc 0593.
Lee "CMOS RF: (Still) No Longer an Oxymoron (Invited)" IEEE Radio Frequency Integrated Circuits Symposium 1999 pp. 3-6.
Lee et al. "Effect of Body Structure on Analog Performance of SOI NMOSFETs" Proceedings 1998 IEEE International SOI Conference Oct. 5-8, 1998 pp. 61-62.
Lee et al. "Effects of Gate Structures on the RF Performance in PD SOI MOSFETs" IEEE Microwave and Wireless Components Letters vol. 15 No. 4 Apr. 2005 pp. 223-225.
Lee—"Analysis of Body Bias Effect with PD-SOI for Analog and RF Application" Solid State Electron vol. 46 2002 pp. 1169-1176 8 pages Doc 0540.

(56) References Cited

OTHER PUBLICATIONS

Lee—"CMOS RF: (Still) No Longer an Oxymoron (Invited)" IEEE Radio Frequency Integrated Circuits Symposium 1999 pp. 3-6 4 pages Doc 0392.
Lee—"Effects of Gate Structures on the RF Performance in PD SOI MESFETs" IEEE Microwave and Wireless Components Letters vol. 15 No. 4 Apr. 2005 pp. 223-225 3 pages Doc 0625.
Lee—"Harmonic Distortion Due to Narrow Width Effects in Deep Submicron SOI-CMOS Device for Analog RF Applications" 2002 IEEE International SOI Conference Oct. 2002 pp. 83-85 3 pages Doc 0445.
Leenaerts—"Circuits Design for RF Transceivers" Kluwer Academic 2001 179 pages Doc 0501 (A-B).
Li—"Suppression of Geometric Component of Charge Pumping Current SOIMOSFETs" Proc. Int. Symp. VLSI Technology Systems & Applications May 31-Jun. 2, 1995 (IEEE 1995) pp. 144-148 5 pages.
Lim—"Partial SOI LDMOSFETs for High-Side Switching" Dept. of Engineering University of Cambridge Oct. 5-9, 1999 IEEE 1 pp. 149-152 4 pages Doc 0393.
Lindert—"Dynamic Threshold Pass-Transistor Logic for Improved Delay at Lower Power Supply Voltages" IEEE Journal of Solid-State Circuits vol. 34 No. 1 Jan. 1999 pp. 85-89 5 pages Doc 0394.
Linear Systems—"High-Speed DMOS FET Analog Switches and Switch Arrays" 11 pages Doc 1082.
Linear Technology—"LTC1550LLTC1551L: Low Noise Charge Pump Inverters in MS8 Shrink Cell Phone Designs" published Dec. 1998 pp. 1-2 2 pages Doc. 0372.
Lossee—"RF Systems Components and Circuits Handbook" Artech House 1997 314 pages Doc 0290 (A-D).
Lovelace—"Silicon MOSFET Technology for RF Ics" IEEE 1995 pp. 1238-1241 4 pages Doc 0221.
Lu—"Floating Body Effects in Partially Depleted SOI CMOS Circuits" ISPLED Aug. 1996 pp. 1-6 6 pages Doc 0266.
M. Willert-Porada "Advances in Microwave and Radio Frequency Processing" 8th International Conference in Microwave and High-Frequency Heating Oct. 2009 408 pgs.
Maas—"The RF and Microwave Circuit Design Cookbook" Artech House 1998 149 pages Doc 0336 (A-B).
Madihan—"A 2-V 1-10GHz BiCMOS Transceiver Chip for Multimode Wireless Communications Networks" IEEE 1997 pp. 521-525 5 pages Doc 0291.
Madihian et al. "CMOS RF ICs for 900MHz-2.4GHz Band Wireless Communication Networks" IEEE Radio Frequency Integrated Circuits Symposium 1999 pp. 13-16.
Madihian—"A High Speed Resonance Type FET Transceiver Switch for Millimeter Wave Band Wireless Networks" 26th EuMC 1996 pp. 941-944 4 pages Doc 1084.
Maeda—"A Highly Reliable .35 μm Field Body-Tied SOI Gate Array for Substrate-Bias-Effect Free Operation" 1997 Symposium on VLSI Technology Digest of Technical Papers Jun. 10-12, 1997 2 pages Doc 8020.
Maeda—"Substrate Bias Effect and Source Drain Breakdown Characteristics in Body Tied Short Channel SOI MOSFETs" IEEE Transactions on Electron Devices vol. 46 No. 1 Jan. 1999 pp. 151-158 8 pages Doc 0397.
Makioka—"Super Self Aligned GaAs RF Switch IC with 0.25dB Extremely Low Insertion Loss for Mobile Communication Systems" IEEE Transactions on Electron Devices vol. 48 No. 8 Aug. 2001 pp. 1510-1514 2 pages Doc 0525.
Marenk—"Layout Optimization of Cascode RF SOI Transistors" IEEE International SOI Conference 2001 pp. 105-106 2 pages Doc 0502.
Marks—"SOI for Frequency Synthesis in RF Integrated Circuits" Thesis submitted to North Carolina State University May 2003 155 pages Doc 0574.
Marshall—"SOI Design: Analog Memory and Digital Techniques" Kluwer Academic Publishers 2002 414 pages Doc 0543.
Mashiko—"Ultra-Low Power Operation of Partially-Depleted SoiCmos Integrated Circuits" IEICE Transactions on Electronic Voltage No. 11 Nov. 2000 pp. 1697-1704 8 pages Doc 0468.
Masuda et al. "RF Current Evaluation of ICs by MP-10L" NEC Research & Development vol. 40-41 1999 pp. 253-258.
Masuda—"High Power Heterojunction GaAs Switch IC with P-1dB of More than 38dBm for GSM Application" IEEE 1998pp. 229-232 4 pages Doc 0337.
Matloubian—"Smart Body Contact for SOI MOSFETs" 1989 IEEE SOSSOI Technology Conference pp. 128-129 Oct. 3-5, 1989 2 pages Doc 0425.
Matsumoto—"A Novel High Frequency Quasi-SOI Power MOSFET for Multi-Gigahertz Application" IEEE 1998 pp. 945-948 4 pages Doc 0338.
Matsumoto—"Fully Depleted 30-V-Class Thin Film SOI Power MOSFET" IEDM 95-979 Dec. 10-13, 1995 pp. 38.6.1-38.6.4 4 pages Doc 0222.
Maxin Integrated Products—"Charge Pumps Shine in Portable Designs" published Mar. 15, 2001 pp. 1-16 16 pages Doc 0518.
McGrath—"A 1.9-GHz GaAs Chip Set for the Personal Handyphone System" IEEE Transaction on Microwave Theory and Techniques 1995 pp. 1733-1744 12 pages Doc 0223.
McGrath—"Multi Gate FET Power Switches" Applied Microwave 1991 pp. 77-88 7 pages Doc 0188.
McGrath—"Novel High Performance SPDT Power Switches Using Multi-Gate FETs" 1991 IEEE 1991 IEEE MTT-S Digest pp. 839-842 4 pages Doc 0189.
McRory—"Transformer Coupled Stacked FET Power Amplifier" IEEE Journal of Solid State Circuits vol. 34 No. 2 Feb. 1999 pp. 157-161 5 pages Doc 0413.
Megahed—"Low Cost UTSi Technology for RF Wireless Applications" Peregrine Semiconductor Corporation IEEE MTT-S Digest 1998 pp. 981-984 4 pages Doc 0339.
Microwave Journal—"A Voltage Regulator for GaAs FETs" Microwave Journal 1995 1 page Doc 0224.
Miller—"Modern Electronic Communications" Prentice-Hall 1999 414 pages Doc 0401 (A-E).
Ming et al. "A New Structure of Silicon-on-Insulator Metal-Oxide-Semiconductor Field Effect Transistor to Suppress the Floating Body Effect" Chin. Phys. Lett. vol. 20 No. 5 (2003) pp. 767-769.
Minoli—"Telecommunications Technology Handbook" Artech House 2003 408 pages Doc 0576.
Mishra—"High Power Broadband Amplifiers for 1-18 GHz Naval Radar" University of California Santa Barbara pp. 1-9 Jul. 1, 1998 9 pages Doc 0358.
Misra—"Radio Frequency and Microwave Communication Circuits" Wiley 2001 297 pages Doc 0503.
Miyatsuji—"A GaAs High Power RF Single Pole Double Throw Switch IC for Digital. Mobile Communication System" IEEE International Solid-State Circuits Conference 1994 pp. 34-35 2 pages Doc 0206.
Miyatsuji—"A GaAs High Power RF Single Pole Dual Throw Switch IC for Digital Mobile Communication System" IEEE Journal of Solid-State Circuits 1995 pp. 979-983 5 pages Doc 0226.
Mizutani—"Compact DC-60-GHz HJFET MMIC Switches using Ohmic Electrode-Sharing Technology" IEEE Transactions on Microwave Theory and Techniques vol. 46 No. 11 Nov. 1998 pp. 1597-1603 7 pages Doc 0371.
Montoriol—"3.6V and 4.8V GSMDCS1800 Dual Band PA Application with DECT Capability Using Standard Motorola RFICs" 2000 p. 1-20 20 pages Doc 0446.
Morena Enrico Communication pursuant to Article 94(3) EPC received from the EPO for related appln. No. 06814836.0 dated Dec. 18, 2013 5 pgs.
Morishita—"Leakage Mechanism Due to Floating Body and Countermeasure on Dynamic Retention Mode of SOI-DRAM" 1995 Symposium on VLSI Technology Digest of Technical Papers Apr. 1995 pp. 141-142 2 pages Doc 0229.
Morreale—The CRC Handbook of Modern Telecommunication: CRC Press 2001 228 pages Doc 0504 (A-F).
Motorola's Exhibit a to the Response to Amended Complaint filed Jul. 2, 2012 in 337-TA-848 3 pages Doc 8073.

(56) References Cited

OTHER PUBLICATIONS

Moye—"A Compact Broadband Six-Bit MMIC Phasor with Integrated Digital Drivers+" IEEE 1990 Microwave and Millimeter-Wave Monolithic Circuits Symposium 1998 IEEE pp. 123-126 4 pages Doc 0341.
Nagayama—"Low Insertion Los DP3T MMIC Switch for Dual Band Cellular Phones"IEEE Journal of Solid State Circuits 1999 pp. 1051-1055 5 pages Doc 0402.
Nakatani—"A Wide Dynamic Range Switched-LNA in SiGe BICMOS" IEEE Radio Frequency Integrated Circuits Symposium 2001 pp. 223-226 4 pages Doc 0505.
Nakayama et al. "A 1.9GHz Single-Chip RF Front End GaAs MMIC with Low-Distortion Cascade FET Mixer for Personal Handy-Phone System Terminals" Radio Frequency Integrated Circuits Symposium 1998 pp. 205-208.
Nakayama—"A 1.9 GHz Single-Chip RF Front-End GaAs MMIC for Persona Communications" Microwave and Millimeter-Wave Monolithic Circuits Symposium 1996 pp. 69-72 4 pages Doc 0247.
Nakayama—"A 1.9 GHz Single-Chip RF Front-End GaAs MMIC with Low-Distortion Cascade FET Mixer for Personal Handy-Phone System Terminals" IEEE 1998 pp. 101-104 Doc 0342.
Narendra—"Scaling of Stack Effects and its Application for Leakage Reduction" Islped 2001 2001 pp. 195-200 6 pages Doc 0506.
NEC Corporation—"uPG13xG Series L-Band SPOT Switch GaAs MMIC" Document No. P1096EJ1VOANDO (1st Edition) Feb. 1996 30 pages Doc 0248.
NEC—"RF & Microwave Device Overview 2003—Silicon and GaAs Semiconductors" NEC 2003 73 pages Doc 0577.
Nelson Pass-Pass Labs "Cascode Amp Design" Audio Electronics pp. Mar. 1-4, 1978 4 pages Doc 0153.
Newman—"Radiation Hardened Power Electronics" Intersil Corporation 1999 pp. 1-4 4 pages Doc 0403.
Nishijima et al. "A High Performance Transceiver Hybrid IC for PHS Hand Set Operating with Single Positive Voltage Supply" Microwave Symposium Digest 1997 pp. 1155-1158.
Nork—"New Charge Pumps Offer Low Input and Output Noise" Linear Technology Corporation Design Notes Design Note 243 published Nov. 2000 pp. 1-2 2 pages Doc 0469.
Numata—"A + 2.40 V Controlled High Power GaAs SPDT Antenna Switch IC for GSM Application" IEEE Radio Frequency Integrated Circuits Symposium 2002 pp. 141-144 4 pages Doc 0544.
Numata—"A High Power Handling GSM Switch IC with New Adaptive Control Voltage Generator Circuit Scheme" IEEE Radio Frequency Integrates Circuits Symposium 2003 pp. 233-236 4 pages Doc 0578.
O—"CMOS Components for 802.11b Wireless LAN Applications" IEEE Radio Frequency Integrated Circuits Symposium 2002 pp. 103-106 4 pages Doc 0545.
O. Rozeau et al. "SOI Technologies Overview for Low-Power Low-Voltage Radio-Frequency Applications" Analog Integrated Circuits and Signal Processing 25 pp. 93-114 Boston MA Kluwer Academic Publishers Nov. 2000.
Ohnakado—"A 1.4dB Insertion Loss 5GHz TransmitReceive Switch Utilizing Novel Depletion-Layer Extended Transistors (DETs) in 0.18um CMOS Process" Symposium on VLSI Circuits Digest of Technical Papers 2002 pp. 162-163 2 pages Doc 0546.
Omdorff et al. "CMOSSOSLSI Switching Regulator Control Device" ISSCC 78 Feb. 17 2978 IEEE International Solid-State Circuits Conference pp. 234-235 and 282.
Ota—"High Isolation and Low Insertion Loss Switch IC Using GaAa MESFETS" IEEE Transactions on Microwave Theory and Techniques vol. 43 No. 9 Sep. 1995 pp. 2175-2177 3 pages Doc 0233.
Park—"A Regulated Charge Pump CMOS DCDC Converter for Low Power Application" 1998 pp. 1-62 62 pages Doc 0343.
Patel—"A Novel Body Contact for SIMOX Based SOI MOSFETs" Solid-State Electronics vol. 34 No. 10 pp. 1071-1075 Apr. 22, 1991 6 pages Doc 3000.
Peczalski—"RFAnalogDigital SOI Technology GPS Receivers and Other Systems on a Chip" IEEE Aerospace Conference Proceedings 2002 pp. 2013-2017 5 pages Doc 0547.
Pelella "Analysis and Control of Hysteresis in PDSOI CMOS" University of Florida Gainesville FL 1999 IEEE pp. 34.5.1-34.5.4 4 pages Doc 0404.
Pelella et al. "Low-Voltage Transient Bipolar Effect Induced by Dynamic Floating-Body Charging in Scaled PDSOI MOSFET's" IEEE Electron Device Letters vol. 17 No. 5 May 1996.
Pelella—"Control of Off-State Current in Scaled PDSOI CMOS Digital Circuits" Proceedings IEEE Intl SOI Conference Oct. 1998 pp. 147-148 2 pages Doc 0367.
Pelloie—"WP 25.2: SOI Technology Performance and Modeling" 1999 IEEE Intl. Solid-State Circuits Conference Feb. 1999 9 pages Doc 0414.
Peregrine Semiconductor Corporation—"An Ultra-Thin Silicon Technology that Provides Integration Solutions on Standard CMOS" 1988 4 pages Doc 0170.
Pozar—"Microwave and RF Design of Wireless Systems" Wiley 2001 192 pages Doc 0507 (A-B).
Pucel—"A Multi-Chip GaAs Monolithic TransmitReceive Module for X-Band" Research Division. Raytheon Company Jun. 15-17, 1982 IEEE MTT-S Digest pp. 489-492 4 pages Doc 0157.
Puechberty—"A GaAs Power Chip Set for 3V Cellular Communications" 1994 4 pages Doc 0207.
Pylarinos—"Charge Pumps: An Overview" Proceedings of the IEEE International Symposium on Circuits and Systems 2003 pp. 1-7 7 pages Doc 0579.
Raab—"Power Amplifiers and Transmitters for RF and Microwave" IEEE Transactions and Microwave Theory and Techniques vol. 50 No. 3 pp. 814-826 Mar. 2002 13 pages Doc 0553.
Rauly—"Investigation of Single and Double Gate SOI MOSFETs in Accumulation Mode for Enhanced Performances and Reduced Technological Drawbacks" Proceedings 30th European Solid-State Device Research Conference Sep. 2000 pp. 540-543 4 pages Doc 0460.
Razavi—"Next Generation RF Circuits and Systems" IEEE 1997 pp. 270-282 13 pages Doc 0295.
Razavi—"RF Microelectronics" Prentice-Hall 1998 179 pages Doc 0344.
Reedy et al. "Single Chip Wireless Systems Using SOI" IEEE International SOI Conference 1999 pp. 8-11.
Reedy—"UTSi CMOS: A Complete RF SOI Solution" Peregrine Semiconductor Corporation 2001 6 pages Doc 0509.
Rodgers et al. "Silicon UTSi COMS RFIC for CDMA Wireless Communications Systems" Peregrine Semiconductor Corporation 1999 IEEE MTT-S Digest p. 485-488.
Rohde—"OpticMillimeter-Wave Converter for 60 GHz Radio-Over-Fiber Systems" Fraunhofer-Institut fur Angerwandte Festkorperphysik Freiburg i. Br. Apr. 1997 pp. 15 5 pages Doc 0307.
Rossek—"Direct Optical Control of a Microwave Phase Shifter Using GaAs Field-Effect Transistors" Communications Research Group School of Electronic Engineering Faculty of Technology Middlesex University Sep. 1998 224 pages Doc 0361.
Rozeau—"SOI Technologies Overview for Low Power Low Voltage Radio Frequency Applications" Analog Integrated Circuits and Signal Processing Nov. 2000 pp. 93-114 22 pages Doc 0470.
S. Maeda et al.: "Substrate-bias Effect and Source-drain Breakdown Characteristics in Body-tied Short-channel SOI MOSFET's" IEEE Transactions on Electron Devices vol. 46 No. 1 Jan. 1999 (Jan. 1, 1999) pp. 151-158 XP000792084 DOI: doi:10.110916.737454.
Saccamango—"An SOI Floating Body Charge Monitor Technique" IEEE International SOI Conference Oct. 2000 pp. 88-89 2 pages Doc 0464.
Salva (or Savla)—"Design and Simulation of a Low Power Bluetooth Transceiver" The University of Wisconsin 2001 pp. 1-90 90 pages Doc 0510.
Sanders—"Statistical Modeling of SOI Devices for the Low Power Electronics Program" AET Inc. 1995 pp. 1-109 109 pages Doc 0227.
Sayre—"Complete Wireless Design" McGraw-Hill 2001 284 pages Doc 0511 (A-D).

(56) References Cited

OTHER PUBLICATIONS

Schaper—"Communications Computations Control and Signal-Processing" Kluwer Academic 1997 308 pages Doc 0296 (A-D).
Scheinberg—"A Computer Simulation Model for Simulating Distortion in FET Resistors" IEEE Transactions on Computer-Aided Design of Integrated Circuits and Systems vol. 19 No. 9 Sep. 2000 pp. 981-989 9 pages Doc 0461.
Schindler et al. "A 2-18 GHz Non-Blocking Active 2×2 Switch" Raytheon Company 1989 IEEE GaAs IC Symposium pp. 181-183.
Schindler et al. "A High Power 2-18 GHz TR Switch" 1988 IEEE IEEE 1990 Microwave and Millimeter-Wave Circuits Symposium pp. 119-122.
Schindler et al. "A Single Chip 2-20 GHz TR Module" 1988 IEEE IEEE 1990 Microwave and Millimeter-Wave Monolithic Circuits Symposium pp. 99-102.
Schindler et al. "DC-20 GHz N X M Passive Switches" IEEE Transactions on Microwave Theory and Techniques vol. 36 No. 12 Dec. 1988 pp. 1604-1613.
Schindler et al. "DC-20 GHz N×M Passive Switches" Raytheon Co. 1998 IEEE MTT-S Digest pp. 1001-1005.
Schindler et al. "DC-40 GHz and 20-40 GHz MMIC SPDT Switches" IEEE Transactions of Electron Devices vol. ED-34 No. 12 Dec. 1987 pp. 2595-2602.
Schindler—"A 2-18 GHz Non-Blocking Active 2×2 Switch" Raytheon Company 1989 IEEE GaAs IC Symposium pp. 181-183 3 page Doc 0175.
Schindler—"A High Power 2-18 GHz TR Switch" 1988 IEEE IEEE 1990 Microwave and Millimeter-Wave Circuits Symposium pp. 119-122 4 pages Doc 0180.
Schindler—"A Single Chip 2-20 GHz TR Module" 1988 IEEE IEEE 1990 Microwave and Millimeter-Wave Monolithic Circuits Symposium pp. 99-102 4 pages Doc 0182.
Schindler—"DC-20 GHz N X M Passive Switches" IEEE Transactions on Microwave Theory and Techniques vol. 36 No. 12 Dec. 1988 pp. 1604-1613 10 pages Doc 0172.
Schindler—"DC-20 GHZ N X M Passive Switches" Raytheon Co. 1998 IEEE MTT-S Digest pp. 1001-1005 5 pages Doc 0345.
Schindler—"DC-40 GHz and 20-40GHz MMIC SPDT Switches" IEEE Transactions of Electron Devices vol. ED-34 No. 12 Dec. 1987 pp. 2595-2602 8 pages Doc 0167.
Schlechtvveg—"Multifunctional Integration Using HEMT Technology" Fraunhofer Institute for Applied Solid State Physics (date uncertain believed Mar. 1997) 18 pages Doc 0306.
Sedra—"Microelectronic Circuits" University of Toronto Oxford University Press Fourth Edition 1982 1987 1991 1998 pp. 374-375 4 pages Doc 0158.
Shafi—"Wireless Communications in the 21st Century" Wiley 2002 230 pages Doc 0548 (A-C).
Shahid—"Partially Depleted SOI Technology for Digital Logic" IEEE Intl Solid-State Circuits Conference 1999 pp. 426-427 2 pages Doc 0408.
Shahidi—"Issues in SOI CMOS Technology and Design" IEEE 2000 Custom Integrated Circuits Conference PublicationPresentation dated May 21, 2000 78 pages Doc 8014.
Shifrin—"A New Power Amplifier Topology with Series Biasing and Power Combining of Transistors" IEEE 1992 Microwave and Millimeter-Wave Monolithic Circuits Symposium 1992 pp. 39-41 3 pages Doc 0196.
Shifrin—"High Power Control Components Using a New Monolithic FET Structure" IEEE Microwave and Millimeter-Wave Monolithic Circuits Symposium 1988 pp. 51-56 6 pages Doc 0171.
Shifrin—"Monolithic FET Structure for High Power Control Component Applications" IEEE Transactions on Microwave Theory and Techniques vol. 37 No. 12 Dec. 1989 pp. 2134-2142 8 pages Doc 0178.
Shimomura—"A 1-V 46-ns. 16-mb SOI-DRAM with Body Control Technique" IEEE Journal of Solid-State Circuits vol. 32 No. 11 Nov. 1997 pp. 1712-1720 9 pages Doc 0323.
Shimomura—"TP 4.3: A 1V 46ns 16Mb SOI-DRAM with Body Control Technique" 1997 IEEE Inti Solid-State Circuits Conference Feb. 1997 9 pages Doc 0300.
Shimura—"High Isolation V-Band SPDT Switch MMIC for High Power Use" IEEE MTT-S International Microwave Symposium Digest 2001 pp. 245-248 4 pages Doc 0512.
Shoucair—"Modeling Decoupling and Suppression of MOSFET Distortion Components" IEEE Proceeding Circuit Devices Systems vol. 146 No. 1 Feb. 1999 7 pages Doc 0415.
Silicon Wave—"Silicon Wave SiW1502 Radio Modem IC" Silicon Wave 2000 pp. 1-21 21 pages Doc 0447.
Sivaram—"Silicon Film Thickness Considerations in SOI-DTMOS" IEEE Device Letters vol. 23 No. 5 May 2002 pp. 276-278 3 pages Doc 0556.
Sjoblom Peter et al. "An Adaptive Impedance Tuning CMOS Circuit for ISM 2.4-GHz Band" IEEE Transactions on Circuits and Systems-I: Regular Papers vol. 52 No. 6 Jun. 2005 pp. 1115-1124.
Sleight—"Transient Measurements of SOI Body Contact Effectiveness" IEEE Electron Device Letters vol. 19 No. 12 Dec. 1998 pp. 499-501 3 pages Doc 0373.
Slobodnik—"Millimeter Wave GaAs Switch FET Modeling" Microwave Journal 1989 7 pages Doc 0176.
Smith—"Modern Communication Circuits" McGraw-Hill 1998 307 pages Doc 0347 (A-D).
Smuk—"Monolithic GaAs Multi-Throw Switches with Integrated Low Power DecoderDriver Logic" May 1997 IEEE Radio Frequency Integrated Circuits 4 pages Doc 0308.
Smuk—"Multi-Throw Plastic MMIC Switches Up to 6GHz with Integrated Positive Control Logic" IEEE 1999 pp. 259-262 4 pages Doc 0409.
Soyuer—"RF and Microwave Building Blocks in a Standard BiCMOS Technology"IBM T.J. Watson Research Center 1996 IEEE pp. 89-92 4 pages Doc 0249.
Street—"R.F. Switch Design" The Institution of Electrical Engineers 2000 pp. 41-47 7 pages Doc 0448.
Streetman et al. "Solid State Electronic Devices" Microelectronics Research Center Dept. of Electrical and Computer Engineering The University of Texas at Austin Chapter 6 2004 by Pearson Education Inc. 4 pgs.
Stuber et al. "Method and Apparatus Improving Gate Oxide Reliability by Controlling Accumulated Charge" patent application filed in the USPTO dated Jul. 22, 2013 for related U.S. Appl. No. 13/948,094 132 pgs.
Stuber et al. "SOI CMOS with High Performance Passive Components for Analog RF and Mixed Signal Designs" IEEE International SOI Conference 1998 pp. 99-100.
Stuber et al. Photocopy of an amendment that was filed with the USPTO dated Mar. 16, 2009 for related U.S. Appl. No. 11/520,912.
Stuber—Authorization to Act on Representative Capacity dated Feb. 11, 2019 for U.S. Appl. No. 15/419,898 4 pages Doc 4302.
Su et al. "On the Prediction of Geometry-Dependent Floating-Body Effect in SOI MOSFETs" IEEE Transactions on Electron Devices vol. 52 No. 7 Jul. 2005 pp. 1662-1664.
Su Pin et al. "On the Body-Source Built-In Potential Lowering of SOI MOSFETs" IEEE Electron Device Letters vol. 24 No. 2 Feb. 2003 pp. 90-92.
Sudhama—"Compact Modeling and Circuit Impact of Novel Frequency Dependence of Capacitance in RF MOSFETs" Nano Science and Technology Institute Technical Proceedings of the 2001 Intl Conference of Modeling and Simulation of Microsystems 4 pages Doc 0513.
Suehle et al. "Low Electric Field Breakdown of Thin Si02 Films Under Static and Dynamic Stress" IEEE Transactions on Electron Devices vol. 44 No. 5 May 1997 pp. 801-808.
Suematsu—"L-Band Internally Matched Si-MMIC Front End" IEEE 1996 pp. 2375-2378 4 pages Doc 0250.
Suematsu—"On-Chip Matching SI-MMIC for Mobile Communication Terminal Application" IEEE 1997 pp. 9-12 4 pages Doc 0297.
Suh—"A Physical Change-Based Model for Non-Fully Depleted SOI MOSFETS and Its Use in Assessing Floating-Body Effects in SOI SMOS Circuits" IEEE Transactions on Electron Devices vol. 42 No. 4 Apr. 1995 pp. 728-737 10 pages Doc 0230.

(56) References Cited

OTHER PUBLICATIONS

Szedon—"Advanced Silicon Technology for Microwave Circuits." Naval Research Laboratory 1994 pp. 1-110 122 pages Doc 0208.
T.-S. Chao et al.: "High-voltage and High-temperature Applications of DTMOS with Reverse Schottky Barrier on Substrate Contacts" IEEE Electron Device Letters vol. 25 No. 2 Feb. 2004 (Feb. 1, 2004) pp. 86-88 XP001046380 DOI: doi:10.1109LED.2003.822656.
Takamiya—"High-Performance Accumulated Black-Interface Dynamic Threshold SOI MOSFET (AB-DTMOS) with Large Body Effect at Low Supply Voltage" Japanese Journal of Applied Physics vol. 38 (1999) Part 1 No. 4B Apr. 1999 pp. 2483-2486 4 pages Doc 0416.
Tenbroek—"Electrical Measure of Silicon Film and Oxide Thickness in Partially Depleted SOI Technologies" Solid-State Electronics vol. 39 No. 7 pp. 1011-1014 Nov. 14, 1995 4 pages Doc 8019.
Terauchi et al. "A 'Self-Body-Bias' SOI MOSFET: A Novel Body-Voltage-Controlled SOI MOSFET for Low Voltage Applications" The Japan Society of Applied Physics vol. 42 (2003) pp. 2014-2019 Part 1 No. 4B Apr. 2003.
Terauchi et al. "A Novel 4T SRAM Cell Using "Self-Body-Biased" SOI MOSFET Structure Operating at 0.5 Volt" IEEE Int'l SOI Conference Oct. 2000 pp. 108-109.
Texas Instruments—"TPS60204 TPS60205 Regulated 3.3-V 100-mA Low-Ripple Charge Pump Low Power DCDC Converters" published Feb. 2001 rev. Sep. 2001 pp. 1-18 18 pages Doc 0530.
Tinella—"A 0.7DB Insertion Loss CMOS-SOI Antenna Switch with More than 50dB Isolation Over the 2.5 to 5GHz Band" Proceeding of the 28th European Solid-State Circuits Conference 2002 pp. 483-486 4 pages Doc 0549.
Tinella—"A High Performance CMOS-SOI Antenna Switch for the 2.5-5-GHz Band" IEEE Journal of Solid-State Circuits vol. 38 No. 7 Jul. 2003 pp. 1270-1283 5 pages Doc 0588.
Tinella—"Study of the Potential of CMOS-SOI Technologies Partially Abandoned for Radiofrequency Applications" Thesis for obtaining the standard of Doctor of INPG National Polytechnic of Grenoble Sep. 25, 2003 187 pages Doc 0594.
Titus et al. "A Silicon BICMOS Transceiver Front-End MMIC Covering 900 and 1900 MHz Applications" Hittite Microwave Corporation IEEE 1996 Microwave and Millimeter-Wave Monolithic Circuits Symposium pp. 73-75.
Tokumitsu—"A Low-Voltage High-Power TR-Switch MMIC Using LC Resonators" IEEE Transactions on Microwave Theory and Techniques vol. 43 No. 5 May 1995 pp. 997-1003 7 pages Doc 0228.
Tseng et al. "Characterization of Floating Body and Body-Grounded Thin Film Silicon-on-Insulator MOSFETs for Analog Circuit Applications" Ph.D. Thesis UCLA 1999 pp. All.
Tseng et al. "Comprehensive Study on AC Characteristics in SOI MOSFETs for Analog Applications" 1998 Symposium on VLSI Technology Digest of Technical Papers Jun. 1998.
Tseng—"AC Floating-Body Effects an Submicron Fully Depleted (FD) SOI nMOSFETs and the Impact on Analog Applications" IEEE Electron Devices vol. 19 No. 9 Sep. 1998 pp. 351-353 3 pages Doc 0362.
Tseng—"AC Floating-Body Effects and the Resultant Analog Circuit Issues in Submicron Floating Body and Body-Grounded SOI MOSFETs" IEEE Transactions on Electron Devices vol. 46 No. 8 Aug. 1999 8 pages Doc 0420.
Tseng—"Comprehensive Study on AC Characteristics in SOI MOSFETs for Analog Applications" 1998 Symposium on VLSI Technology Digest of Technical Papers Jun. 1998 2 pages Doc 0357.
Tsutsumi—"A Single Chip PHS Front End MMIC with a True Single +3 Voltage Supply" IEEE Radio Frequency Integrated Circuits Symposium 1998 pp. 105-108 4 pages Doc 0349.
TWI Associates-Letter Regarding Office Action Response for Application No. JP2003-535287 dated Nov. 30, 2005 1 page Doc 2342.
Uda—"A High Performance and Miniturized Dual Use (antennalocal) GaAs SPDT Switch IC Operating at +3 VOv" Microwave Symposium Digest 1996 pp. 141-144 4 pages Doc 0252.
Uda—"High Performance GaAs Switch IC's Fabricated Using MESFETs with Two Kinds of Pinch Off Voltages" IEEE GaAs IC Symposium 1993 pp. 247-250 4 pages Doc 0200.
Uda—"High-Performance GaAs Switch IC's Fabricated Using MESFETs with Two Kinds of Pinch-off Voltages and a Symmetrical Pattern Configuration" IEEE Journal of Solid-State Circuits vol. 29 No. 10 Oct. 1994 pp. 1262-1269 8 pages Doc 0209.
Uda—"Miniturization and High Isolation of GaAs SPDT Switch IC Mounted in Plastic Package" 1996 8 pages Doc 0253.
Ueda et al. "A CAD Compatible SOICMOS Gate Array Having Body Fixed Partially Depleted Transistors" IEEE Int'l Solid-State Circuits Conference Feb. 8, 1997 pp. 288-289.
Ueda et al. "Floating Body Effects on Propagation Delay in SOICMOS LSIs" IEEE SOI Conference Oct. 1996 pp. 142-143.
UEDA—"A 5GHz-Band On-Chip Matching CMOS MMIC Front-End" 11th GAAS Symposium—Munich 2003 pp. 101-104 4 pages Doc 0580.
Valeri et al. "A Composite High Voltage Device Using Low Voltage SOI MOSFET's" IEEE 1990 pp. 169-170.
Valeri et al. "A Silicon-on-Insulator Circuit for High Temperature High-Voltage Applications" IEEE 1991 pp. 60-61.
Van Der Pujie—"Telecommunication Circuit Design" Wiley 1992 187 pages Doc 0197 (A-B).
Van Der Pujie—"Telecommunication Circuit Design" Wiley 2002 225 pages Doc 0550 (A-C).
Voldman—"Dynamic Threshold Body- and Gate-coupled SOI ESD Protection Networks" Proceedings Electrical OverstressElectrostatic Discharge Symposium (Date of Conference Sep. 23-25, 1997 Santa Clara CA) Journal of Electrostatics 44 Mar. 20, 1998 pp. 239-255 17 pages.
Wada—"Active Body-Bias SOI-CMOS Driver Circuits" Symposium on VLSI Circuits Digest of Technical Papers 1997 pp. 29-30 2 pages Doc 0298.
Wambacq "A Single Package Solution for Wireless Transceivers" IEEE 1999 pp. 1-5 5 pages Doc 0411.
Wang et al. "A Robust Large Signal Non-Quasi-Static MOSFET Model for Circuit Simulation" IEEE 2004 Custom Integrated Circuits Conference pp. 2-1-1 through 2-1-4.
Wang et al. "Threshold Voltage Instability at Low Temperatures in Partially Depleted Thin Film SOI MOSFET's" 1990 IEEE SOSSOI Technology Conference Oct. 1990 pp. 91-92.
Wang—"A Novel Low-Voltage Silicon-on-Insulator (SOI) CMOS Complementary Pass-Transistor Logic (CPL) Circuit Using Asymmetrical Dynamic Threshold Pass-Transistor (ADTPT) Technique" Proceedings of the 43rd IEEE Midwest Symposium on Circuits and Systems Aug. 2000 pp. 694-697 4 pages Doc 0458.
Wang—"Efficiency Improvement in Charge Pump Circuits" IEEE Journal of Solid-State Circuits vol. 32 No. 6 Jun. 1997 pp. 852-860 9 pages Doc 0318.
Wang—"Threshold Voltage Instability at Low Temperatures in Partially Depleted Thin Film SOI MOSFETs" IEEE SOSSOI Technology Conference Jun. 1991 pp. 91-92 2 pages Doc 0185.
Wei et al. "Measurement of Transient Effects in SOI DRAMSRAM Access Transistors" IEEE Electron Device Letters vol. 17 No. 5 May 1996 pp. 193-195.
Wei—"Effect of Floating-Body Charge on SOI MOSFET Design" IEEE Transaction on Electron Devices vol. 45 No. 2 Feb. 1998 9 pages Doc 0352.
Wei—"Large-Signal Model of Triple-Gate MESFETPHEMT for Switch Applications" Alpha Industries Inc. 1999 IEEE pp. 745-748 4 pages Doc 0412.
Wei—"Measurement and Modeling of Transient Effects in Partially Depleted SOI MOSFETs" M.S. Thesis MIT Jul. 1996 76 pages Doc 0265.
Wei—"Measurements of Transient Effects in SOI DRAMSRAM Access Transistors" IEEE Electron Device Letters vol. 17 No. 5 May 1996 pp. 193-195 3 pages Doc 0262.
Weigand Christopher "An ASIC Driver for GaAs FET Control Components" Technical Feature Applied Microwave & Wireless 2000 pp. 42-48.
Weisman—"The Essential Guide to RF and Wireless" Prentice-Hall 2000 133 pages Doc 0450 (A-B).

(56) References Cited

OTHER PUBLICATIONS

Wetzel—"Silicon-on-Sapphire Technology for Microwave Power Application" University of California San Diego 2001 229 pages Doc 0514 (A-B).

Wiatr et al. "Impact of Floating Silicon Film on Small-Signal Parameters of Fully Depleted SOI-MOSFETs Biased into Accumulation" Solid-State Electronics 49 (2005) Received Sep. 11, 1930 revised on Nov. 9, 2004 pp. 779-789.

Wiatr et al. "Impact of Floating Silicon Film on Small-Signal Parameters of Fully Depleted SOI-MOSFETs Biased into Accumulation" Solid-State Electronics 49 (2005) revised on Nov. 9, 2004 pp. 779-789.

Willert-Porada "Advances in Microwave and Radio Frequency Processing" 8th International Conference on Microwave and High-Frequency Heating Springer Publication 2001.

Willert-Porada—"Advances in Microwave and Radio Frequency Processing" 8th International Conference on Microwave and High-Frequency Heating Oct. 2009 408 pages Doc 0714 (A-F).

Workman—"A Comparative Analysis of the Dynamic Behavior of BTGSOI MOSFET's and Circuits with Distributed Body Resistance" IEEE Transactions and Electron Devices vol. 45 No. 10 Oct. 1998 pp. 2138-2145 8 pages Doc 0368.

Workman—"Dynamic Effects in BTGSOI MOSFETs and Circuits Due to Distributed Body Resistance" Proceedings 1997 IEEE International SOI Conference Oct. 1997 pp. 28-29 2 pages Doc 0322.

Yamamoto et al. "A 2.4GHz Band 1.8V Operation Single Chip Si-CMOS TR MMIC Front End with a Low Insertion Loss Switch" IEEE Journal of Solid-State Circuits vol. 36 No. 8 Aug. 2001 pp. 1186-1197.

Yamamoto et al. "A GaAs RF Transceiver IC for 1.9GHz Digital Mobile Communication Systems" IISSCC96 Session 21 Wireless Systems Paper SP 21.1 IEEE International Solid-State Circuits Conference pp. 340-341 and 496.

Yamamoto Kazuya et al. "A 2.2-V Operation 2.4-GHz Single-Chip GaAs MMIC Transceiver for Wireless Applications" IEEE Journal of Solid-State Circuits vol. 34 No. 4 Apr. 1999 pp. 502-512.

Yamamoto—"A Single-Chip GaAs RF Transceiver for 1.9GHz Digital Mobil Communication Systems" IEEE 1996 pp. 1964-1973 10 pages Doc 0255.

Yamamoto—"Design and Experimental Results of a 2V-Operation Single Chip GaAs TR MMIC Front-End for 1.9 GHz Personal Communications" IEEE 1998 pp. 7-12 6 pages Doc 0350.

Yamao—"GaAs Broadband Monolithic Switches" 1986 pp. 63-71 10 pages Doc 0162.

Yang—"Sub-100nm Vertical MOSFETs with Si1-x-y GexCy SourceDrains" a dissertation presented to the faculty of Princeton University Jun. 2000 272 pages Doc 0455.

Yeh—"High Performance 0.1 μm Partially Depleted SOI CMOSFET" 2000 IEEE International SOI Conference Oct. 2000 pp. 68-69 2 pages Doc 0466.

Ytterdal—"MOSFET Device Physics and Operation" Device Modeling for Analog and RF CMOS Circuit Design 2003 John Wley & Sons Ltd. 46 pages Doc 0581.

Yun—"High Power-GaAs MMIC Switches with Planar Semi-Insulated Gate FETs (SIGFETs)" International Symposium on Power Semiconductor Devices & Ics 1990 pp. 55-58 4 pages Doc 0184.

Zhu et al. "Simulation of Suppression of Floating-Body Effect in Partially Depleted SOI MOSFET Using a Si1-xGex Dual Source Structure" Materials Science and Engineering B 114-115 (2004) pp. 264-268.

Zhu Ming—"A New Structure of Silicon-on-Insulator Metal-Oxide Semiconductor Field Effect Transistor to Suppress the Floating Body Effect" Nov. 4, 2002 Chin. Phys. Lett. vol. 20 No. 5 (2003) pp. 767-769 3 pages Doc 0575.

\* cited by examiner

200

METHOD AND APPARATUS IMPROVING GATE OXIDE RELIABILITY BY CONTROLLING ACCUMULATED CHARGE

CROSS-REFERENCE TO RELATED APPLICATIONS—CLAIMS OF PRIORITY

This application is a continuation of and claims priority to U.S. patent application Ser. No. 17/549,839, filed Dec. 13, 2021, which is a continuation of and claims priority to U.S. patent application Ser. No. 16/739,081, filed Jan. 9, 2020, and issued as U.S. Pat. No. 11,201,245 on Dec. 14, 2021, which is a continuation of and claims priority to U.S. patent application Ser. No. 15/419,898, filed Jan. 30, 2017, and issued as U.S. Pat. No. 10,818,796 on Oct. 27, 2020, which is a continuation of and claims priority to U.S. patent application Ser. No. 13/948,094, filed Jul. 22, 2013, and issued as U.S. Pat. No. 9,608,619 on Mar. 28, 2017, which is a continuation of and claims priority to U.S. patent application Ser. No. 13/028,144, filed Feb. 15, 2011, and issued as U.S. Pat. No. 8,954,902 on Feb. 10, 2015, which is a divisional of and claims priority to U.S. patent application Ser. No. 11/520,912, filed Sep. 14, 2006, and issued as U.S. Pat. No. 7,890,891 on Feb. 15, 2011, which is a continuation in-part of and claims priority to U.S. patent application Ser. No. 11/484,370, filed Jul. 10, 2006, and issued as U.S. Pat. No. 7,910,993 on Mar. 22, 2011, which claims the benefit of U.S. Provisional Application No. 60/698,523, filed Jul. 11, 2005; and U.S. Provisional Application No. 60/718,260, filed Sep. 15, 2005, all of which are hereby incorporated by reference in their entirety.

BACKGROUND

1. Field

The present invention relates to metal-oxide-semiconductor (MOS) field effect transistors (FETs), and particularly to MOSFETs fabricated on Semiconductor-On-Insulator ("SOI") and Silicon-On-Sapphire ("SOS") substrates. In one embodiment, an SOI (or SOS) MOSFET is adapted to control accumulated charge and thereby improve linearity of circuit elements. In another embodiment, according to the present CIP, an SOI (or SOS) MOSFET is adapted to control accumulated charge and thereby improve gate oxide reliability.

2. Description of Related Art

Although the disclosed method and apparatus for use in improving the linearity of MOSFETs are described herein as applicable for use in SOI MOSFETs, it will be appreciated by those skilled in the electronic device design arts that the present teachings are equally applicable for use in SOS MOSFETs. The present teachings also apply to other semiconductor-on-insulator systems, wherein the silicon is replaced by another semiconductor such as silicon-germanium (SiGe). It will also be appreciated by those skilled in the electronic design arts that the present disclosed method and apparatus also apply to virtually any insulating gate technology, and to integrated circuits having a floating body. As those skilled in the art will appreciate, technologies are constantly being developed for achieving "floating body" implementations. For example, the inventors are aware of circuits implemented in bulk silicon wherein circuit implementations are used to "float" the body of the device. The disclosure contemplates embodiments of the disclosed method and apparatus implemented in any of the developing floating body implementations. Therefore, references to and exemplary descriptions of SOI MOSFETs herein are not to be construed as limiting the applicability of the present teachings to SOI MOSFETs only. Rather, as described below in more detail, the disclosed method and apparatus find utility in MOSFETs implemented in a plurality of device technologies, including SOS.

As is well known, a MOSFET employs a gate-modulated conductive channel of n-type or p-type conductivity, and is accordingly referred to as an "NMOSFET" or "PMOSFET", respectively. FIG. 1 shows a cross-sectional view of an exemplary prior art SOI NMOSFET 100. As shown in FIG. 1, the prior art SOI NMOSFET 100 includes an insulating substrate 118 that may comprise a buried oxide layer, sapphire, or other insulating material. A source 112 and drain 116 of the NMOSFET 100 comprise N+ regions (i.e., regions that are heavily doped with an "n-type" dopant material) produced by ion implantation into a silicon layer positioned above the insulating substrate 118. (The source and drain of PMOSFETs comprise P+ regions (i.e., regions heavily doped with "p-type" dopant material)). The body 114 comprises a P− region (i.e., a region that is lightly doped with a "p-type" dopant), produced by ion implantation, or by dopants already present in the silicon layer when it is formed on the insulating substrate 118. As shown in FIG. 1, the NMOSFET 100 also includes a gate oxide 110 positioned over the body 114. The gate oxide 110 typically comprises a thin layer of an insulating dielectric material such as $SiO_2$. The gate oxide 110 electrically insulates the body 114 from a gate 108 positioned over the gate oxide 110. The gate 108 comprises a layer of metal or, more typically, polysilicon.

A source terminal 102 is operatively coupled to the source 112 so that a source bias voltage "Vs" may be applied to the source 112. A drain terminal 106 is operatively coupled to the drain 116 so that a drain bias voltage "Vd" may be applied to the drain 116. A gate terminal 104 is operatively coupled to the gate 108 so that a gate bias voltage "Vg" may be applied to the gate 108.

As is well known, when a voltage is applied between the gate and source terminals of a MOSFET, a generated electric field penetrates through the gate oxide to the transistor body. For an enhancement mode device, a positive gate bias creates a channel in the channel region of the MOSFET body through which current passes between the source and drain. For a depletion mode device, a channel is present for a zero gate bias. Varying the voltage applied to the gate modulates the conductivity of the channel and thereby controls the current flow between the source and drain.

For an enhancement mode MOSFET, for example, the gate bias creates a so-called "inversion channel" in a channel region of the body 114 under the gate oxide 110. The inversion channel comprises carriers having the same polarity (e.g., "P" polarity (i.e., hole carriers), or "N" polarity (i.e., electron carriers) carriers) as the polarity of the source and drain carriers, and it thereby provides a conduit (i.e., channel) through which current passes between the source and the drain. For example, as shown in the SOI NMOSFET 100 of FIG. 1, when a sufficiently positive voltage is applied between the gate 108 and the source 112 (i.e. a positive gate bias exceeding a threshold voltage $V_{th}$), an inversion channel is formed in the channel region of the body 114. As noted above, the polarity of carriers in the inversion channel is identical to the polarity of carriers in the source and drain. In this example, because the source and drain comprise "n-type" dopant material and therefore have N polarity carriers, the carriers in the channel comprise N polarity carriers. Similarly, because the source and drain comprise "p-type" dopant material in PMOSFETs, the carriers in the channel of turned on (i.e., conducting) PMOSFETs comprise P polarity carriers.

Depletion mode MOSFETs operate similarly to enhancement mode MOSFETs, however, depletion mode MOSFETs are doped so that a conducting channel exists even without a voltage being applied to the gate. When a voltage of appropriate polarity is applied to the gate the channel is depleted. This, in turn, reduces the current flow through the depletion mode device. In essence, the depletion mode device is analogous to a "normally closed" switch, while the enhancement mode device is analogous to a "normally open" switch. Both enhancement and depletion mode MOSFETs have a gate voltage threshold, $V_{th}$, at which the MOSFET changes from an off-state (non-conducting) to an on-state (conducting).

No matter what mode of operation an SOI MOSFET employs (i.e., whether enhancement or depletion mode), when the MOSFET is operated in an off-state (i.e., the gate voltage does not exceed $V_{th}$), and when a sufficient nonzero gate bias voltage is applied with respect to the source and drain, an "accumulated charge" may occur under the gate. The "accumulated charge", as defined in more detail below and used throughout the present application, is similar to the "accumulation charge" described in the prior art literature in reference to MOS capacitors. However, the prior art references describe "accumulation charge" as referring only to bias-induced charge existing under a MOS capacitor oxide, wherein the accumulation charge is of the same polarity as the majority carriers of the semiconductor material under the capacitor oxide. In contrast, and as described below in more detail, "accumulated charge" is used herein to refer to gate-bias induced carriers that may accumulate in the body of an off-state MOSFET, even if the majority carriers in the body do not have the same polarity as the accumulated charge. This situation may occur, for example, in an off-state depletion mode NMOSFET, wherein the accumulated charge may comprise holes (i.e., having P polarity) even though the body doping is N− rather than P−.

For example, as shown in FIG. 1, when the SOI NMOSFET 100 is biased to operate in an off-state, and when a sufficient nonzero voltage is applied to the gate 108, an accumulated charge 120 may accumulate in the body 114 underneath and proximate the gate oxide 110. The operating state of the SOI NMOSFET 100 shown in FIG. 1 is referred to herein as an "accumulated charge regime" of the MOSFET. The accumulated charge regime is defined in more detail below. The causes and effects of the accumulated charge in SOI MOSFETs are now described in more detail.

As is well known, electron-hole pair carriers may be generated in MOSFET bodies as a result of several mechanisms (e.g., thermal, optical, and band-to-band tunneling electron-hole pair generation processes). When electron-hole pair carriers are generated within an NMOSFET body, for example, and when the NMOSFET is biased in an off-state condition, electrons may be separated from their hole counterparts and pulled into both the source and drain. Over a period of time, assuming the NMOSFET continues to be biased in the off-state, the holes (resulting from the separated electron-hole pairs) may accumulate under the gate oxide (i.e., forming an "accumulated charge") underneath and proximate the gate oxide. A similar process (with the behavior of electrons and holes reversed) occurs in similarly biased PMOSFET devices. This phenomenon is now described with reference to the SOI NMOSFET 100 of FIG. 1.

When the SOI NMOSFET 100 is operated with gate, source and drain bias voltages that deplete the channel carriers in the body 114 (i.e., the NMOSFET 100 is in the off-state), holes may accumulate underneath and proximate the gate oxide 110. For example, if the source bias voltage Vs and the drain bias voltage Vd are both zero (e.g., connected to a ground contact, not shown), and the gate bias voltage Vg comprises a sufficiently negative voltage with respect to ground and with respect to $V_{th}$, holes present in the body 114 become attracted to the channel region proximate the gate oxide 110. Over a period of time, unless removed or otherwise controlled, the holes accumulate underneath the gate oxide 110 and result in the accumulated charge 120 shown in FIG. 1. The accumulated charge 120 is therefore shown as positive "+" hole carriers in FIG. 1. In the example given, Vg is negative with respect to Vs and Vd, so electric field regions 122 and 124 may also be present.

Accumulated Charge Regime Defined

The accumulated charge is opposite in polarity to the polarity of carriers in the channel. Because, as described above, the polarity of carriers in the channel is identical to the polarity of carriers in the source and drain, the polarity of the accumulated charge 120 is also opposite to the polarity of carriers in the source and drain. For example, under the operating conditions described above, holes (having "P" polarity) accumulate in off-state NMOSFETs, and electrons (having "N" polarity) accumulate in off-state PMOSFETs. Therefore, a MOSFET device is defined herein as operating within the "accumulated charge regime" when the MOSFET is biased to operate in an off-state, and when carriers having opposite polarity to the channel carriers are present in the channel region. Stated in other terms, a MOSFET is defined as operating within the accumulated charge regime when the MOSFET is biased to operate in an off-state, and when carriers are present in the channel region having a polarity that is opposite the polarity of the source and drain carriers.

For example, and referring again to FIG. 1, the accumulated charge 120 comprises hole carriers having P or "+" polarity. In contrast, the carriers in the source, drain, and channel (i.e., when the FET is in the on-state) comprise electron carriers having N or "−" polarity. The SOI NMOSFET 100 is therefore shown in FIG. 1 as operating in the accumulated charge regime. It is biased to operate in an off-state, and an accumulated charge 120 is present in the channel region. The accumulated charge 120 is opposite in polarity (P) to the polarity of the channel, source and drain carriers (N).

In another example, wherein the SOI NMOSFET 100 comprises a depletion mode device, $V_{th}$ is negative by definition. According to this example, the body 114 comprises an N− region (as contrasted with the P− region shown in FIG. 1). The source and drain comprise N+ regions similar to those shown in the enhancement mode MOSFET 100 of FIG. 1. For Vs and Vd both at zero volts, when a gate bias Vg is applied that is sufficiently negative relative to $V_{th}$ (for example, a Vg that is more negative than approximately −1 V relative to $V_{th}$), the depletion mode NMOSFET is biased into an off-state. If biased in the off-state for a sufficiently long period of time, holes may accumulate under the gate oxide and thereby comprise the accumulated charge 120 shown in FIG. 1.

In other examples, Vs and Vd may comprise nonzero bias voltages. In some embodiments, Vg must be sufficiently negative to both Vs and Vd (in order for Vg to be sufficiently negative to $V_{th}$, for example) in order to bias the NMOSFET in the off-state. Those skilled in the MOSFET device design arts shall recognize that a wide variety of bias voltages may be used to practice the present teachings. As described below in more detail, the present disclosed method and apparatus contemplates use in any SOI MOSFET device biased to operate in the accumulated charge regime.

SOI and SOS MOSFETs are often used in applications in which operation within the accumulated charge regime adversely affects MOSFET performance. As described below in more detail, unless the accumulated charge is removed or otherwise controlled, it detrimentally affects performance of SOI MOSFETs under certain operating conditions. One exemplary application, described below in more detail with reference to the circuits shown in FIGS. 2B and 5A, is the use of SOI MOSFETs in the implementation of radio frequency (RF) switching circuits. As described below with reference to FIGS. 2B and 5A in more detail, the inventors have discovered that unless the accumulated charge is removed or otherwise controlled, under some operating conditions, the accumulated charge adversely affects the linearity of the SOI MOSFET and thereby increases harmonic distortion and intermodulation distortion (IMD) caused by the MOSFET when used in the implementation of certain circuits. In addition, as described below in more detail, the inventors have discovered that removal or control of the accumulated charge improves the drain-to-source breakdown voltage (i.e., the "BVDSS") characteristics of the SOI MOSFETs.

Therefore, it is desirable to provide techniques for adapting and improving SOI (and SOS) MOSFETs, and circuits implemented with the improved SOI MOSFETs, in order to remove or otherwise control the accumulated charge, and thereby significantly improve SOI MOSFET performance. It is desirable to provide methods and apparatus for use in improving the linearity characteristics in SOI MOSFETs. The improved MOSFETs should have improved linearity, harmonic distortion, intermodulation distortion, and BVDSS characteristics as compared with prior art MOSFETs, and thereby improve the performance of circuits implemented with the improved MOSFETs. The present teachings provide such novel methods and apparatus.

Gate Oxide Reliability and the Accumulated Charge Regime

The gate oxide is a critical component of a MOSFET. In many applications, including RF switch implementation, it is desirable to make the gate oxide as thin as possible. In RF circuit applications, thinner gate oxide results in higher on-currents and lower insertion losses for RF signals. However, if the gate oxide is too thin, the oxide will break down when a gate voltage is applied. When an electric field is applied to a gate oxide, there is typically a significant time interval before the gate oxide fails. The time required for a gate oxide to fail is a function of the applied electric field and temperature. This phenomenon is known as Time Dependent Dielectric Breakdown (TDDB). As a rough rule of thumb, at room temperature the electric field in a gate oxide should not exceed approximately 5 MV/cm for a desired lifetime or time-to-breakdown of ten years.

TDDB in gate oxides has been investigated extensively. One exemplary reference is an article entitled "A Unified Gate Oxide Reliability Model," C. Hu and Q. Lu, 37th International Reliability Physics Symposium, San Diego, C A 1999. This paper discusses two major mechanisms for TDDB which occur under different stress conditions related to the strength of the applied electric field.

Another exemplary reference is a technical paper entitled "Low Electric Field Breakdown of Thin $SiO_2$ Films Under Static and Dynamic Stress," J. S. Suehle and P. Chaparala, IEEE Transactions on Electron Devices, Vol. 44, No. 5, May 1997. This reference reports an increase in gate oxide lifetime under bipolar pulsed stress (positive and negative voltage pulses) relative to unipolar (DC) stress. This effect occurs only at very large fields, and is attributed to relaxation of hole trapping occurring in the gate oxide. This phenomenon is unrelated to the improvements in gate oxide reliability that can be obtained by controlling accumulated charge in SOI MOSFETs, as described in more detail herein.

Still yet another reference relating to TDDB is a technical paper entitled "Reliability Issues for Silicon-on-insulator," R. Bolam, et al., Electron Devices Meeting 2000, IEDM Technical Digest, December 2000. The authors report that there is no significant difference for TDDB failure in bulk Si devices and SOI devices fabricated in accordance with current art. The paper by C. Hu and Q. Lu, the reference by Suchle and Chaparala, and the reference by R. Bolam, cited above (referred to herein as the "TDDB references"), are hereby fully incorporated by reference herein, as though set forth in full for their teachings on the reliability of $SiO_2$ when used as a gate dielectric.

The TDDB references cited above indicate that TDDB lifetime, at a given temperature, is dependent on the electric field in the gate oxide. When charge carriers are present beneath the gate oxide (e.g., when the MOSFET is in an on-state), the electric field in the oxide is approximately equal to the gate-to-source voltage divided by the gate oxide thickness. However, in accordance with teachings presented herein, persons skilled in the arts of electronic devices will appreciate that this is not necessarily the case for an SOI MOSFET operated in an off-state in the accumulated charge regime. In this case, the electric field that stresses the gate oxide is also affected by the presence of an accumulated charge under the gate. In particular, the inventors have discovered that removing or otherwise controlling the accumulated charge can significantly reduce the electric field that stresses the gate oxide and thereby improve the gate oxide reliability. Therefore, it is desirable to provide techniques for adapting and operating SOI MOSFET devices and circuits in order to control the accumulated charge and thereby significantly improve gate oxide reliability. The present teachings provide such novel techniques for adapting and operating SOI MOSFET devices.

SUMMARY

Apparatuses and methods are provided to control accumulated charge in SOI MOSFETs, thereby improving nonlinear responses and harmonic and intermodulaton distortion effects in the operation of the SOI MOSFETs.

In one embodiment, a circuit having at least one SOI MOSFET is configured to operate in an accumulated charge regime. An accumulated charge sink (ACS), operatively coupled to the body of the SOI MOSFET, receives accumulated charge generated in the body, thereby reducing the nonlinearity of the net source-drain capacitance of the SOI MOSFET.

In one embodiment, the ACS comprises a high impedance connection to the MOSFET body, with an exemplary impedance greater than 106 ohm.

Embodiments Relating to Methods and Apparatuses for Improving Gate Oxide Reliability in Accordance with the Present CIP Circuits with SOI MOSFETs are adapted to control accumulated charge in the SOI MOSFETs, thereby improving gate oxide reliability of the SOI MOSFETs.

In one embodiment, a circuit comprises an SOI MOSFET, operating in the accumulated charge regime, and means for accumulated charge control (ACC), operatively coupled to the SOI MOSFET. The SOI MOSFET is adapted to have a maximum electric field Eth in the gate oxide of the SOI MOSFET, where Eth corresponds to a desired lifetime or average time-to-breakdown for the gate oxide. The SOI MOSFET is adapted responsive to a first determination of the maximum electric field $E_{ox1}$ in the gate oxide with an uncontrolled accumulated charge proximate to the gate oxide, and further responsive to second determination of the maximum electric field $E_{ox2}$ in the gate oxide with a controlled accumulated charge proximate to the gate oxide. Determinations of $E_{tb}$, $E_{ox1}$, and $E_{ox2}$ may be performed using well known techniques such as TDDB measurements and simulations of the SOI MOSFET operation.

According to another embodiment, a method for improving gate oxide reliability of an SOI MOSFET, operating in the accumulated charge regime, begins at a STEP (a). At the STEP (a), a first maximum electric field $E_{ox1}$ in the gate oxide of the SOI MOSFET is determined with an uncontrolled accumulated charge proximate to the gate oxide. Proceeding to a STEP (b), a second maximum electric field $E_{ox2}$ in the gate oxide of the SOI MOSFET is determined with a controlled accumulated charge proximate to the gate oxide. At a STEP (c), the SOI MOSFET is implemented in a circuit, wherein the SOI MOSFET is adapted to have a maximum electric field Eth in the gate oxide. The maximum electric field $E_{tb}$ corresponds to a desired lifetime or time-to-breakdown for the gate oxide. The SOI MOSFET is adapted responsive to the determinations of the STEPS (a) and (b). At a final STEP (d), the circuit is operated using a means for ACC operatively coupled to the SOI MOSFET.

In another embodiment, the SOI MOSFET is adapted by implementing a second thickness $T_{ox2}$ of the gate oxide, wherein $T_{ox2}$ is less than a first thickness $T_{ox1}$ of the gate oxide. The first thickness $T_{ox1}$ corresponds to the SOI MOSFET having the maximum electric field $E_{ox1}$ in the gate oxide less than or equal to Eth when the SOI MOSFET is operated without the means for ACC operatively coupled to the SOI MOSFET. Implementation of the means for ACC enables the use of the lesser second thickness $T_{ox2}$, without allowing the maximum electric field $E_{ox2}$ in the gate oxide to exceed $E_{tb}$.

According to another embodiment, the SOI MOSFET is adapted to enable a specified performance for the SOI MOSFET using the second thickness $T_{ox2}$ and a second body width W2 of the SOI MOSFET (the terms "gate width," "body width" and "transistor width" are used equivalently and interchangeably herein), wherein the second body width W2 is less than a first body width W1 of the SOI MOSFET. The first body width W1 corresponds to the SOI MOSFET being adapted to enable the specified performance using the first thickness $T_{ox1}$. Using the lesser second gate oxide thickness $T_{ox2}$ provides improvements in the performance of the SOI MOSFET, such as reduced insertion loss, improved on-state conductance, and improved transconductance. This allows the body width of the SOI MOSFET to be reduced while maintaining the specified performance. Advantages of reduced body width include smaller die size for lower manufacturing cost and reduced parasitic capacitance, and better performance such as improved linearity.

In a further embodiment, the SOI MOSFET is adapted by implementing a second limiting gate bias voltage $V_{g2}$ applied to a gate of the SOI MOSFET. $V_{g2}$ has an absolute value greater than the absolute value of a first limiting gate bias voltage $V_{g1}$ applied to the gate of the SOI MOSFET. $V_{g1}$ corresponds to the SOI MOSFET having the maximum electric field $E_{ox1}$ in the gate oxide less than or equal to $E_{tb}$ when the SOI MOSFET is operated without the means for ACC operatively coupled to the SOI MOSFET. Implementation of the means for ACC enables the magnitude of the off-state limiting gate bias $V_{g2}$ to be increased over $V_{g1}$ without having the maximum electric field $E_{ox2}$ in the gate oxide exceed $E_{tb}$. More generally, using ACC allows the use of thinner gate oxide, larger gate bias magnitude, or a selected combination thereof.

In another embodiment, the means for ACC may comprise an Accumulated Charge Sink (ACS), having a resistance greater than $10^6$ ohm, operatively coupled to a body region of the SOI MOSFET to receive and remove the accumulated charge.

In another exemplary embodiment, the means for ACC may comprise an ACS, having a resistance not greater than $10^6$ ohm, operatively coupled to a body region of the SOI MOSFET to receive and remove the accumulated charge.

In yet another exemplary embodiment, the means for ACC may comprise a control circuit operatively coupled to a gate of the SOI MOSFET. The control circuit is adapted to apply a voltage pulse to the gate to switch the SOI MOSFET from the off-state to an on-state for a selected interval, thereby dissipating the accumulated charge proximate to the gate oxide.

In yet another exemplary embodiment, the means for ACC may comprise a resistor electrically connected to a gate of the SOI MOSFET sufficient to prevent attenuation of an induced RF voltage on the gate, and wherein an RF signal voltage is applied to a drain of the SOI MOSFET that generates the induced RF voltage, thereby reducing the accumulated charge.

According to other exemplary embodiments, the SOI MOSFET may be an NMOSFET or a PMOSFET. The SOI MOSFET may be fabricated using silicon-on-sapphire, or other SOI technologies, such as Separation by Implantation of Oxygen (SIMOX)), silicon bonded to insulator, etc. The exemplary circuit including the SOI MOSFET may be an RF switching circuit, an RF mixer, a power amplifier, a level shifting circuit, a negative voltage generator, an oscillator, a DC-DC converter or other circuit using SOI MOSFETs.

BRIEF DESCRIPTION OF THE DRAWINGS

FIG. 3F-1 is a cross-sectional view of the improved SOI NMOSET of FIGS. 3A-3B.

FIG. 3G-1 is a schematic plot of inversion channel charge as a function of applied gate voltage when a region of increased threshold voltage is present.

FIG. 4D-1 is a simplified schematic of the improved SOI NMOSFET of FIG. 4D, embodied as a four terminal device, showing an accumulated charge sink (ACS) terminal coupled to a separate bias source.

Like reference numbers and designations in the various drawings indicate like elements.

DETAILED DESCRIPTION

As noted above, those skilled in the electronic device design arts shall appreciate that the teachings herein apply equally to NMOSFETs and PMOSFETs. For simplicity, the embodiments and examples presented herein for illustrative purposes include only NMOSFETs, unless otherwise noted. By making well known changes to dopants, charge carriers, polarity of bias voltages, etc., persons skilled in the arts of electronic devices will easily understand how these embodiments and examples may be adapted for use with PMOSFETs.

Non-linearity and Harmonic Distortion Effects of Accumulated Charge in an SOI NMOSFET As described in the background section above, no matter what mode of operation the MOSFET employs (i.e., enhancement mode or depletion mode), under some circumstances, when a MOSFET is operated in an off-state with a nonzero gate bias voltage applied with respect to the source and drain, an accumulated charge may occur under the gate. According to the present teachings, as described above when the MOSFET is in an off-state, and when carriers are present in the channel region having a polarity that is opposite the polarity of the source and drain carriers, the MOSFET is said to be operating in the accumulated charge regime.

According to the present teachings, the inventors have observed that, when used in certain circuit implementations, MOSFETs operating in the accumulated charge regime exhibit undesirable non-linear characteristics that adversely impact circuit performance. For example, as described below in more detail with reference to FIG. 2A, the accumulated charge 120 (FIG. 1) adversely affects the linearity of off-state SOI MOSFETs, and more specifically, it adversely affects the linearity of contributing capacitances to the drain-to-source capacitance (Cds). For an SOI MOSFET operating in an off-state, Cds is referred to as $C_{off}$. The contributing capacitances to $C_{off}$ are described below in reference to FIG. 2A for bias conditions wherein the gate bias Vg is provided by a circuit having an impedance that is large compared to the impedances of the contributing capacitances. As described below with reference to FIGS. 2B and 5A, this, in turn, adversely affects harmonic distortion, intermodulation distortion, and other performance characteristics of circuits implemented with the SOI MOSFETs. These novel observations, not taught or suggested by the prior art, may be understood with reference to the electrical model shown in FIG. 2A.

Figure 1:
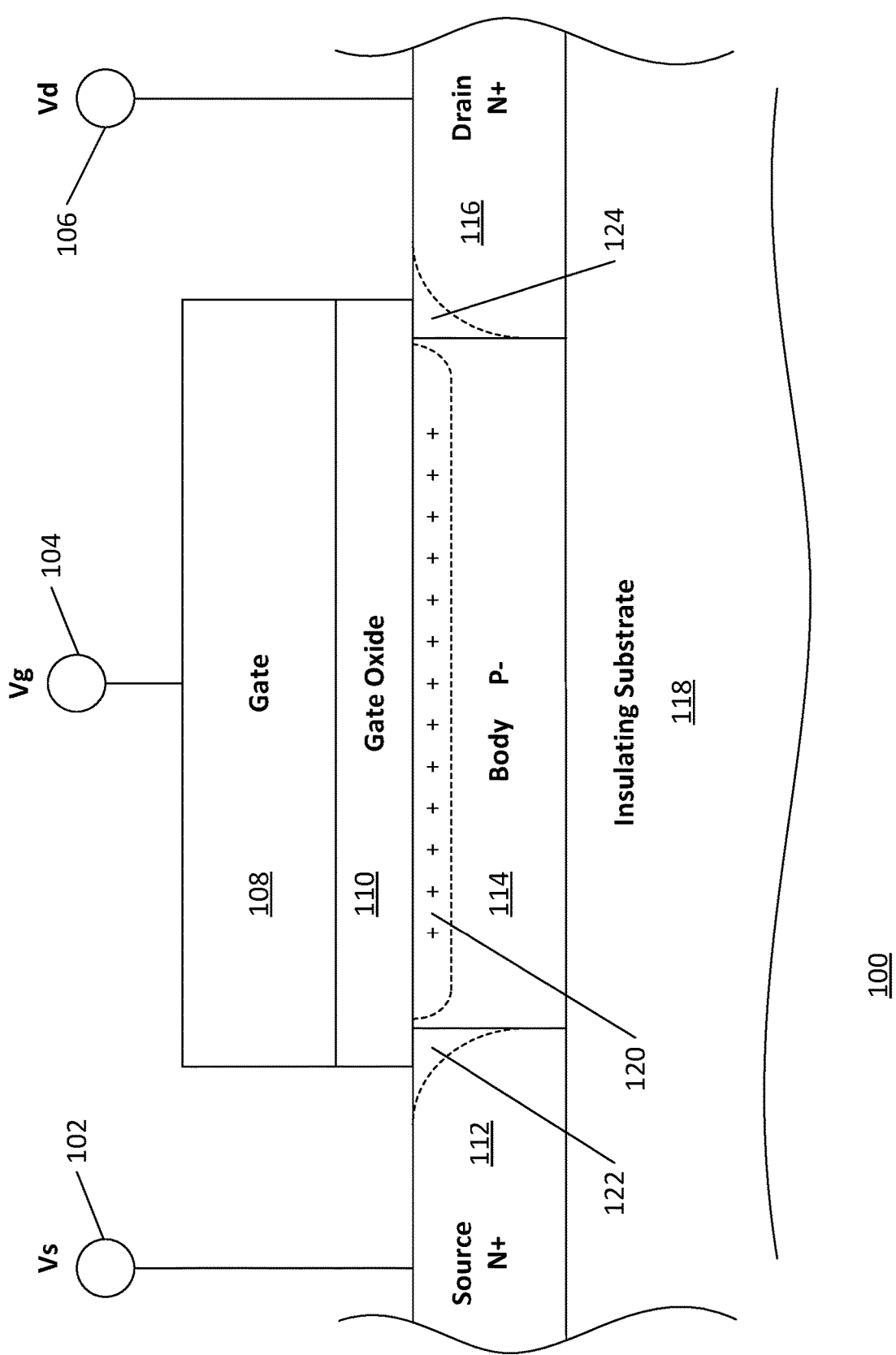
FIG. 1 is a cross-sectional view of an exemplary prior art SOI NMOSFET.
Figure 2A:
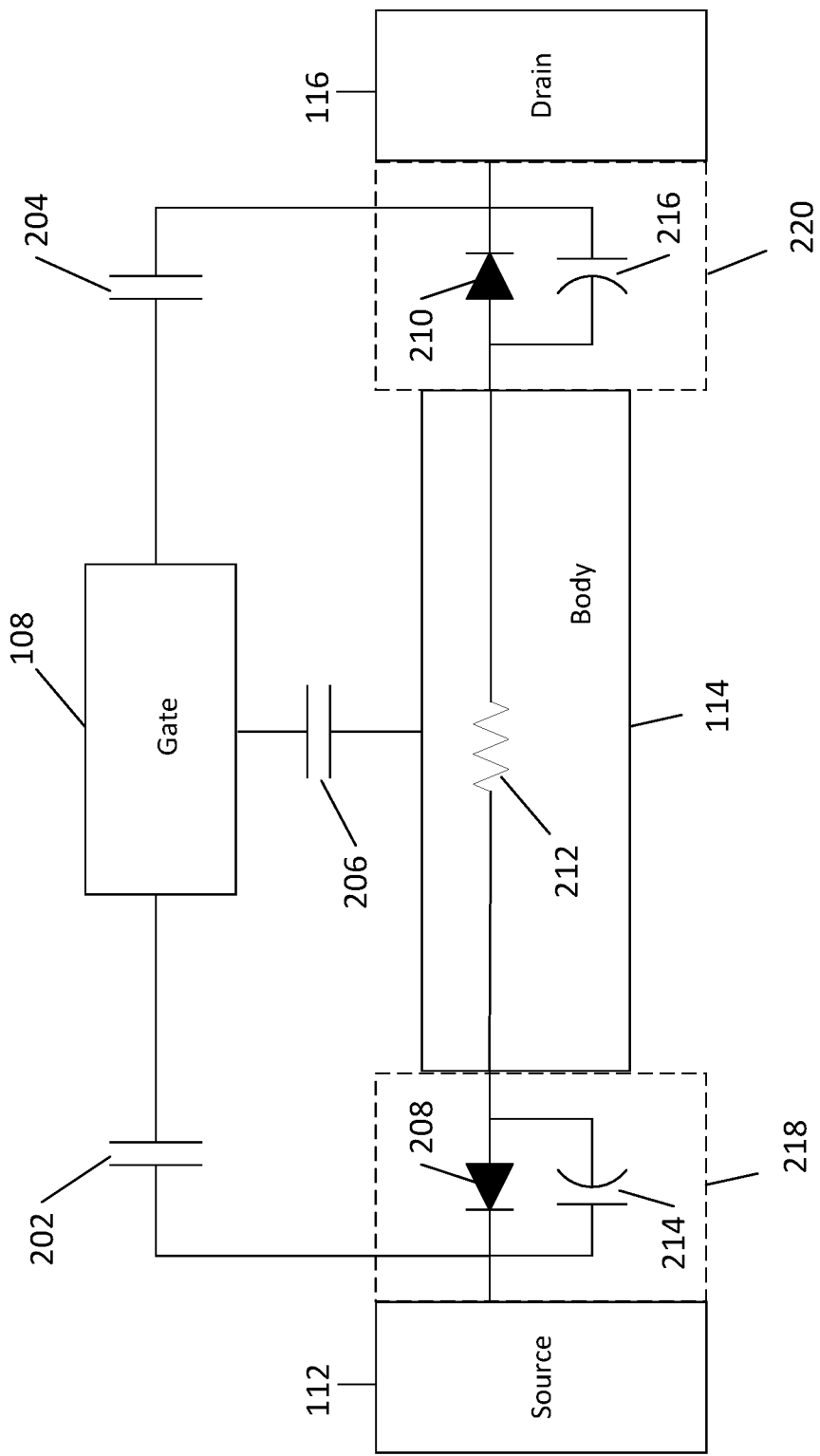
FIG. 2A is a simplified schematic of an electrical model showing the off-state impedance characteristics of the exemplary prior art SOI NMOSFET of FIG. 1.

FIG. 2A is a simplified schematic of an electrical model 200 showing the off-state impedance (or conversely, conductance) characteristics of the exemplary prior art SOI NMOSFET 100 of FIG. 1. More specifically, the model 200 shows the impedance characteristics from the source 112 to the drain 116 when the NMOSFET 100 is operated in the off-state. Because the drain-to-source off-state impedance characteristic of the NMOSFET 100 is primarily capacitive in nature, it is referred to herein as the drain-to-source off-state capacitance ($C_{off}$). For the exemplary description herein, the gate 108 is understood to be biased at a voltage Vg by a circuit (not shown) that has an impedance that is large compared to the impedances of the contributing capacitances described in reference to FIG. 2A. Persons skilled in the electronic arts will understand how this exemplary description may be modified for the case wherein the impedance of the circuit providing the Vg bias is not large compared to the impedances of the contributing capacitances.

As shown in FIG. 2A, the junction between the source 112 and the body 114 (i.e., a source-body junction 218) of the off-state NMOSFET 100 can be represented by a junction diode 208 and a junction capacitor 214, configured as shown. Similarly, the junction between the drain 116 and the body 114 (i.e., the drain-body junction 220) of the off-state NMOSFET 100 can be represented by a junction diode 210 and a junction capacitor 216, configured as shown. The body 114 is represented simply as an impedance 212 that is present between the source-body junction 218 and the drain-body junction 220.

A capacitor 206 represents the capacitance between the gate 108 and the body 114. A capacitor 202 represents the capacitance between the source 112 and the gate 108, and another capacitor 204 represents the capacitance between the drain 116 and the gate 108. A substrate capacitance due to the electrical coupling between the source 112 and the drain 116 (through the insulating substrate 118 shown in FIG. 1) is taken to be negligibly small in the exemplary description set forth below, and therefore is not shown in the electrical model 200 of FIG. 2A.

As described above, when the NMOSFET 100 is in the off-state, and when the accumulated charge 120 (FIG. 1) is not present in the body 114 (i.e., the NMOSFET 100 is not operating within the accumulated charge regime), the body 114 is depleted of charge carriers. In this case the body impedance 212 is analogous to the impedance of an insulator, and the electrical conductance through the body 114 is very small (i.e., the NMOSFET 100 is in the off-state). Consequently, the principal contributions to the drain-to-source off-state capacitance $C_{off}$ are provided by the capacitors 202 and 204. The capacitors 202 and 204 are only slightly voltage dependent, and therefore do not significantly contribute to a nonlinear response that adversely affects harmonic generation and intermodulation distortion characteristics.

However, when the NMOSFET 100 operates within the accumulated charge regime, and the accumulated charge 120 is therefore present in the body 114, mobile holes comprising the accumulated charge produce p-type conductivity between the source-body junction 218 and the drain-body junction 220. In effect, the accumulated charge 120 produces an impedance between the source-body junction 218 and the drain-body junction 220 that is significantly less than the impedance between the junctions in the absence of the accumulated charge. If a Vds voltage is applied between the drain 116 and the source 112, the mobile holes redistribute according to the electrical potentials that result within the body 114. DC and low-frequency current flow through the SOI NMOSFET 100 is prevented by the diode properties of the source-body junction 218 and the drain-body junction 220, as represented by the junction diodes 208 and 210, respectively. That is, because the junction diodes 208 and 210 are anti-series (i.e., "back-to-back") in this case, no DC or low-frequency currents flow through the SOI NMOSFET 100. However, high-frequency currents may flow through the SOI NMOSFET 100 via the capacitances of the source-body junction 218 and the drain-body junction 220, as represented by the junction capacitors 214 and 216, respectively.

The junction capacitors 214 and 216 are voltage dependent because they are associated with junctions between n-type and p-type regions. This voltage dependence results from the voltage dependence of the width of the depletion region of the junction between the n-type and p-type regions. As a bias voltage is applied to the NMOSFET, the width of the depletion region of the junction between the n-type and p-type regions is varied. Because the capacitance of the junction depends on the width of the junction depletion region, the capacitance also varies as a function of the bias applied across the junction (i.e., the capacitance is also voltage dependent).

Further, the capacitors 202 and 204 may also have a voltage dependence caused by the presence of the accumulated charge 120. Although the complex reasons for this voltage dependence are not described in detail herein, persons skilled in the arts of electronic devices shall understand that electric field regions (e.g., electric field regions 122 and 124 described above with reference to FIG. 1) may be affected by the response of the accumulated charge and its response to an applied Vds, thereby causing a voltage dependence of capacitors 202 and 204. An additional nonlinear effect may occur due to a direct capacitance (not shown) between the source 112 and the drain 116. Although this direct capacitance would usually be expected to be negligible for most SOI MOSFETs, it may contribute for SOI MOSFETs having very short spacing between the source and drain. The contribution of this direct capacitance to $C_{off}$ is also voltage-dependent in the presence of accumulated charge, for reasons that are analogous to the voltage dependencies of the capacitors 202 and 204 as described above.

The voltage dependencies of the junction capacitors 214 and 216, the gate-to-source and gate-to-drain capacitors 202, 204, respectively, and the direct capacitance (not shown), cause nonlinear behavior in off-state capacitance $C_{off}$ of the MOSFET when AC voltages are applied to the NMOSFET 100, thereby producing undesirable generation of harmonic distortions and intermodulation distortion (IMD). The relative contributions of these effects are complex, and depend on fabrication processes, biases, signal amplitudes, and other variables. However, those skilled in the electronic device design arts shall understand from the teachings herein that reducing, removing, or otherwise controlling the accumulated charge provides an overall improvement in the nonlinear behavior of $C_{off}$. In addition, because the body impedance 212 is significantly decreased in the presence of the accumulated charge 120, the magnitude of $C_{off}$ may be increased when the FET operates in the accumulated charge regime. Reducing, removing, or otherwise controlling the accumulated charge also mitigates this effect.

The inventors have observed that the nonlinear behavior of the MOSFET off-state capacitance $C_{off}$ adversely affects the performance of certain circuits implemented with the prior art SOI MOSFETs. For example, when an RF switch is implemented using the prior art SOI MOSFETs, such as the prior art SOI NMOSFET 100 of FIG. 1, the above-described non-linear off-state characteristics of the prior art MOSFETs adversely affect the linearity of the switch. As described below in more detail, RF switch linearity is an important design parameter in many applications. Improved switch linearity leads to improved suppression of harmonic and intermodulation (IM) distortion of signals processed by the switch. These improved switch characteristics can be critically important in some applications such as use in cellular communication devices.

For example, the well known GSM cellular communication system standard imposes stringent linearity, harmonic and intermodulation suppression, and power consumption requirements on front-end components used to implement GSM cell phones. One exemplary GSM standard requires that all harmonics of a fundamental signal be suppressed to below −30 dBm at frequencies up to 12.75 GHZ. If harmonics are not suppressed below these levels, reliable cell phone operation can be significantly adversely impacted (e.g., increased dropped calls or other communication problems may result due to harmonic and intermodulation distortion of the transmit and receive signals). Because the RF switching function is generally implemented in the cell phone front-end components, improvements in the RF switch linearity, harmonic and intermodulation suppression, and power consumption performance characteristics is highly desirable. A description of how the non-linear behavior of the off-state capacitance $C_{off}$ of the prior art MOSFETs adversely affects these RF switch characteristics is now described with reference to FIG. 2B.

Figure 2B:
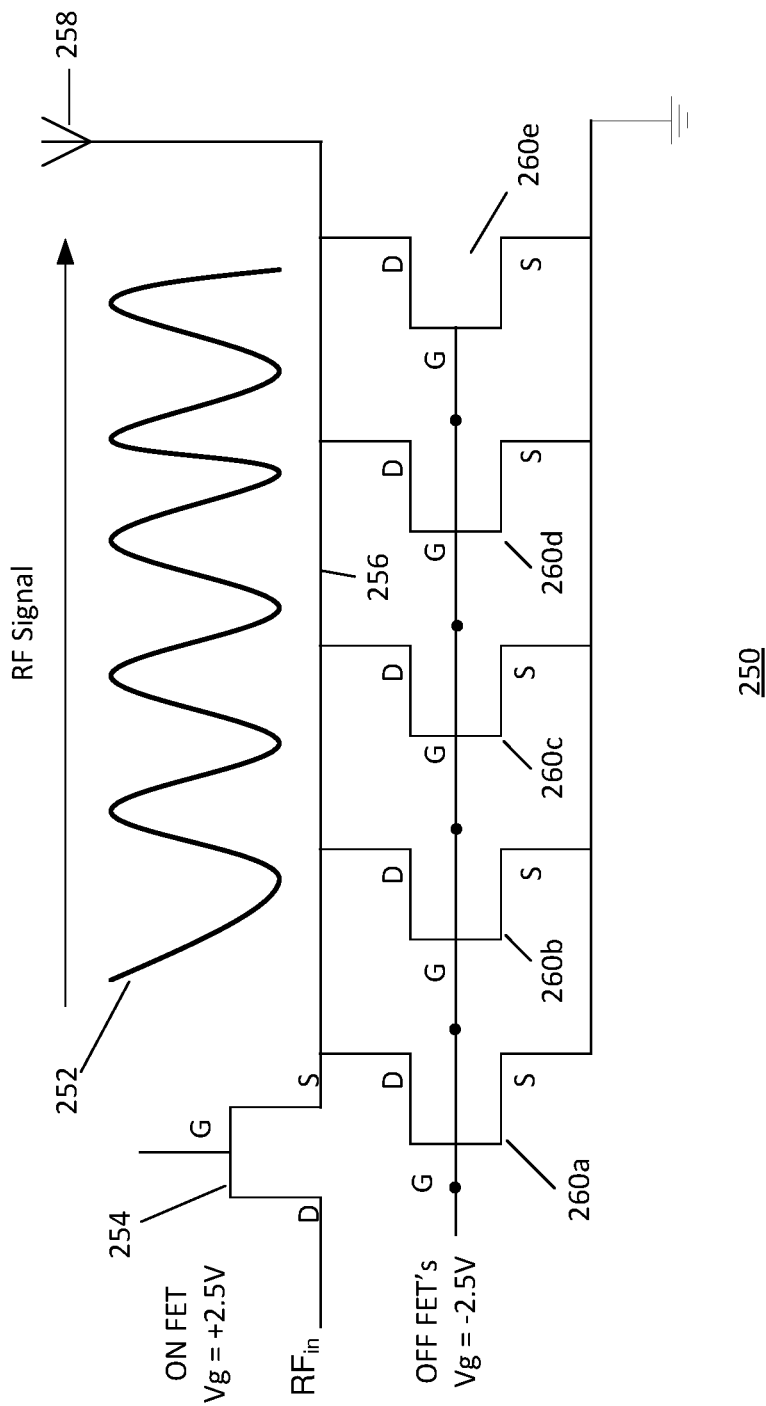
FIG. 2B is a schematic of an exemplary simplified RF switching circuit implemented using prior art SOI MOSFETs such as the prior art SOI NMOSFET of FIG. 1.

Harmonic Distortion Effects on RF Switch Circuits Implemented using Prior Art SOI MOSFETS FIG. 2B illustrates an exemplary simplified RF switch circuit 250 implemented using prior art MOSFETs such as the prior art SOI NMOSFET 100 described above with reference to FIG. 1. A detailed description of the operation and implementation of RF switch circuits is provided in commonly assigned U.S. Pat. No. 6,804,502 which is hereby incorporated herein by reference in its entirety for its teachings on RF switch circuits. As shown in FIG. 2B, the prior art RF switch 250 includes a single "pass" or "switching" MOSFET 254 operatively coupled to five shunting MOSFETs 260a-260c.

The MOSFET 254 acts as a pass or switching transistor and is configured, when enabled, to selectively couple an RF input signal (applied to its drain, for example) to an RF antenna 258 via a transmission path 256. The shunting MOSFETs, 260a-260e, when enabled, act to alternatively shunt the RF input signal to ground. As is well known, the switching MOSFET 254 is selectively controlled by a first switch control signal (not shown) coupled to its gate, and the shunting MOSFETs, 260a-260e are similarly controlled by a second switch control signal (not shown) coupled to their gates. The switching MOSFET 254 is thereby enabled when the shunting MOSFETs 260a-260e are disabled, and vice versa. As shown in the exemplary embodiment of the RF switch 250 of FIG. 2B, the switching MOSFET 254 is enabled by applying a gate bias voltage of +2.5V (via the first switch control signal). The shunting MOSFETs 260a-260e are disabled by applying a gate bias voltage of −2.5V (via the second switch control signal).

When the switch 250 is configured in this state, the RF signal 252 propagates through the switching MOSFET 254, through the transmission path 256, and to the antenna 258. As described above with reference to FIG. 2A, when the shunting MOSFETS 260a-260c comprise prior art SOI (or SOS) MOSFETs, such as the SOI NMOSFET 100 (FIG. 1), an accumulated charge can occur in the SOI MOSFET bodies (i.e., when the SOI MOSFETs operate in the accumulated charge regime as described above). The accumulated charge can produce nonlinear behavior in the off-state capacitance $C_{off}$ of the SOI MOSFETs when AC voltages are applied to the MOSFETs.

More specifically, when the accumulated charge is present in the channel regions of the off-state SOI MOSFETs 260a-260e it responds to variations in the RF signals applied to their respective drains. As the time varying RF signal propagates along the transmission path 256, the RF signal applies time varying source-to-drain bias voltages to the SOI MOSFETs 260a-260c. The time varying source-to-drain bias voltages creates movement of the accumulated charge within the channel regions of the SOI MOSFETs 260-260e. The movement of the accumulated charge within the channel regions of the SOI MOSFETs causes variations in the drain-to-source off-state capacitance of the SOI MOSFETs 260a-260c. More specifically, the movement of the accumulated charge within the channel regions causes a voltage dependence of the drain-to-source off-state capacitance as described above with reference to FIG. 2A. The voltage dependent variations in the off-state capacitance of the SOI MOSFETs 260a-260e is the dominant cause of harmonic distortion and IMD of the RF signal as it propagates through the RF switch 250.

As noted above, harmonic distortion and IMD of the RF signal is a major disadvantage of the prior art RF switch circuits implemented using the prior art SOI MOSFET devices. For many applications, harmonics and IMD of the RF signal must be suppressed to levels that heretofore have been difficult or impossible to achieve using prior art SOI MOSFET devices. In GSM devices, for example, at a maximum operating power of +35 dBm, prior art switches typically have only a 6 dB margin to the GSM third order harmonics suppression requirement of less than −30 dBm. Very low even order harmonic distortion is also desirable in GSM systems as the second order harmonic of the GSM transmit band also resides in the DCS receive band. Suppression of odd order (e.g., third order) harmonics of the RF signal, however, is desirable and improvements in that regard are needed.

In addition, as is well known, presence of an accumulated charge in the bodies of floating body (e.g., SOI) MOSFETs can also adversely affect the drain-to-source breakdown voltage (BVDSS) performance characteristics of the floating body MOSFETs. As is well known, floating-body FETs demonstrate drain-to-source breakdown voltage problems, also known as BVDSS, wherein the drain-to-source "punch-through" voltage is reduced by a parasitic bipolar action. The parasitic bipolar action is caused when holes are generated in the channel and the holes have nowhere to dissipate (i.e., because the body is floating, the holes have no means for escaping the body). As a consequence, the potential of the MOSFET body is increased, which effectively reduces the threshold voltage. In turn, this condition causes the MOSFET device to experience increased leakage, thereby generating more holes in the body, and thereby exacerbating the BVDSS problem (as a result of this positive feedback condition).

The present disclosed method and apparatus for improving linearity of SOI (and SOS) MOSFET devices overcomes the above-described disadvantages of the prior art. Once the accumulated charge is recognized as a major source of harmonic distortion, IMD and compression/saturation in off-state SOI MOSFET devices, and in circuits (such as RF circuits) implemented with these devices, it becomes clear that reduction, removal, and/or control of the accumulated charge improves the harmonic suppression characteristics of these devices. In addition, reduction, removal, and/or control of the accumulated charge also improves the BVDSS performance characteristics by preventing the parasitic bipolar action from occurring. Improvements in BVDSS lead to consequent improvements in device linearity. Several exemplary structures and techniques for controlling the accumulated charge in SOI MOSFETs are described in detail in the next section.

Method and Apparatus for Improving the Linearity of MOSFETs Using Accumulated Charge Sinks (ACS)—Overview As described below in more detail, the present disclosure describes methods and apparatuses for improving semiconductor device linearity (e.g., reducing adverse harmonic distortion and IMD effects) in SOI MOSFETs. In one exemplary embodiment, the method and apparatus improves the linearity and controls the harmonic distortion and IMD effects of the MOSFET devices by reducing the accumulated charge in the bodies of the MOSFET devices. In one embodiment, the present method and apparatus reduces or otherwise controls the accumulated charge in the MOSFET bodies using an accumulated charge sink (ACS) that is operatively coupled to the MOSFET body. In one embodiment, the present method and apparatus entirely removes all of the accumulated charge from the bodies of the MOSFET devices. In one described embodiment, the MOSFET is biased to operate in an accumulated charge regime, and the ACS is used to entirely remove, reduce, or otherwise control, the accumulated charge and thereby reduce harmonic distortions and IMD that would otherwise result. Linearity is also improved in some embodiments by removing or otherwise controlling the accumulated charge thereby improving the floating body MOSFET BVDSS characteristics.

As noted in the background section above, persons skilled in the electronic device design and manufacture arts shall appreciate that the teachings herein apply equally to MOSFETs fabricated on Silicon-On-Insulator ("SOI") and Silicon-On-Sapphire ("SOS") substrates. As noted above, the present method and apparatus may also be applied to silicon-germanium (SiGe) SOI MOSFETs. For simplicity, the embodiments and examples presented herein for illustrative purposes include only NMOSFETs, unless otherwise noted. By making well known changes to dopants, charge carriers, polarity of bias voltages, etc., persons skilled in the electronic device design arts will easily understand how these embodiments and examples may be adapted for use with PMOSFETs.

As noted above, the present disclosure is particularly applicable to FETs and associated applications benefiting from a fully depleted channel when the FET is operated in the off-state, wherein an accumulated charge may result. The disclosed method and apparatus for use in improving the linearity of MOSFETs also finds applicability for use with partially depleted channels. As known to those skilled in the art, the doping and dimensions of the body vary widely. In an exemplary embodiment, the body comprises silicon having a thickness of approximately 100 angstroms to approximately 2,000 angstroms. In a further exemplary embodiment, dopant concentration within the FET bodies ranges from no more than that associated with intrinsic silicon to approximately $1 \times 10^{18}$ active dopant atoms per $cm^3$, resulting in fully-depleted transistor operation. In a further exemplary embodiment, dopant concentration within the FET bodies ranges from $1 \times 10^{18}$ to $1 \times 10^{19}$ active dopant atoms per $cm^3$ and/or the silicon comprising the body ranges from a thickness of 2000 angstroms to many micrometers, resulting in partially-depleted transistor operation. As will be appreciated by those skilled in the electronic design and manufacturing arts, the present disclosed method and apparatus for use in improving linearity of MOSFETs can be used in MOSFETs implemented in wide variety of dopant concentrations and body dimensions. The present disclosed method and apparatus therefore is not limited for use in MOSFETs implemented using the exemplary dopant concentrations and body dimensions as set forth above.

According to one aspect of the present disclosure, accumulated charge within a FET body is reduced using control methodologies and associated circuitry. In one embodiment all of the accumulated charge is removed from the FET body. In other embodiments, the accumulated charge is reduced or otherwise controlled. In one embodiment, holes are removed from the FET body, whereas in another embodiment, electrons are removed from the FET body, as described below in more detail. By removing holes (or electrons) from the FET body using the novel and nonobvious teachings of the present disclosure, voltage induced variations in the parasitic capacitances of the off-state FETs are reduced or eliminated, thereby reducing or eliminating nonlinear behavior of the off-state FETs. In addition, as described above with reference to FIG. 2A, because the body impedance is greatly increased when the accumulated charge is reduced or controlled, there is a beneficial overall reduction in the magnitude of the FET off-state capacitances. Also, as described above, removing or otherwise controlling the accumulated charge in floating body MOSFETs improves the BVDSS characteristics of the FET and thereby improves the linearity of the floating body MOSFET.

Accumulated charge control not only facilitates a beneficial overall reduction in the FET off-state capacitance $C_{off}$ (as described above with reference to FIG. 2A and below with reference to FIG. 4G), it also facilitates a reduction in $C_{off}$ variations that can occur over time in the presence of a time varying Vas bias voltage. Thus, a reduction of undesirable harmonics generation and intermodulation distortion in RF switch circuits is obtained using SOI MOSFETs made in accordance with the present disclosure. Improved SOI MOSFET power handling, linearity, and performance are achieved by devices made in accordance with the present teachings. While the methods and apparatuses of the present disclosure are capable of fully removing accumulated charge from the FET bodies, those skilled in the electronic device design arts shall appreciate that any reduction of accumulated charge is beneficial.

Reductions in harmonics and intermodulation distortion are generally beneficial in any semiconductor system, either bulk semiconductor or semiconductor-on-insulator (SOI) systems. SOI systems include any semiconductor architecture employing semiconductor-containing regions positioned above an underlying insulating substrate. While any suitable insulating substrate can be used in a SOI system, exemplary insulating substrates include silicon dioxide (e.g., a buried oxide layer supported by a silicon substrate, such as that known as Separation by Implantation of Oxygen (SIMOX)), bonded wafer (thick oxide), glass, and sapphire. As noted above, in addition to the commonly used silicon-based systems, some embodiments of the present disclosure may be implemented using silicon-germanium (SiGe), wherein the SiGe is used equivalently in place of Si.

A wide variety of ACS implementations and structures can be used to practice the present disclosed method and apparatus. In accordance with one embodiment of the present method and apparatus, an ACS is used to remove or otherwise control accumulated charge (referenced as 120 in FIG. 1 described above) from the MOSFETs when the MOSFETs are configured to operate in the accumulated charge regime. By adapting the SOI (or SOS) MOSFETS in accordance with the present teachings, improved Accumulated Charge Control (ACC) MOSFETs are realized. The ACC MOSFETs are useful in improving performance of many digital circuits, including RF switching circuits. Various characteristics and possible configurations of the exemplary ACC MOSFETs are described in detail below with reference to FIGS. 3A-3I. This section also describes how the exemplary ACS implementations of the present disclosure differ from the body contacts of the prior art.

Figure 4B:
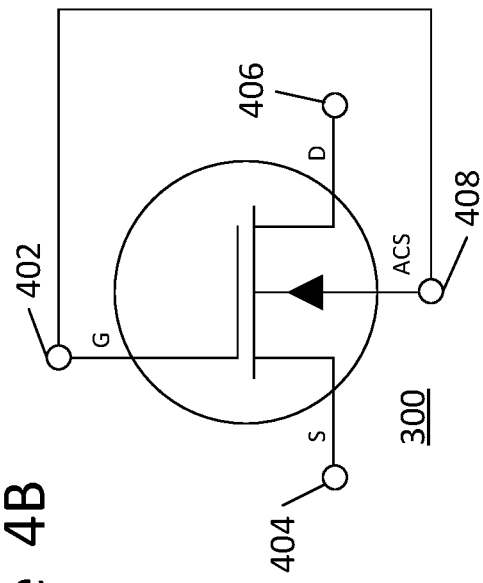
FIG. 4B is a simplified schematic of an improved SOI NMOSFET adapted to control accumulated charge, embodied as a four terminal device, wherein an accumulated charge sink (ACS) terminal is coupled to a gate terminal.
Figure 4D:
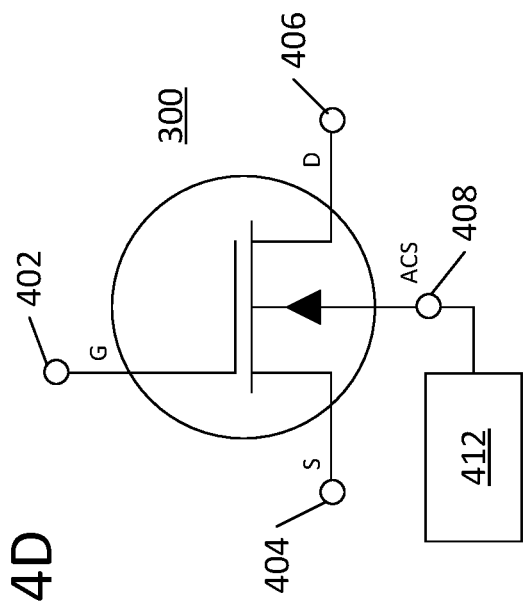
FIG. 4D is a simplified schematic of an improved SOI NMOSFET adapted to control accumulated charge, embodied as a four terminal device, wherein an accumulated charge sink (ACS) terminal is coupled to a control circuit.
Figure 4A:
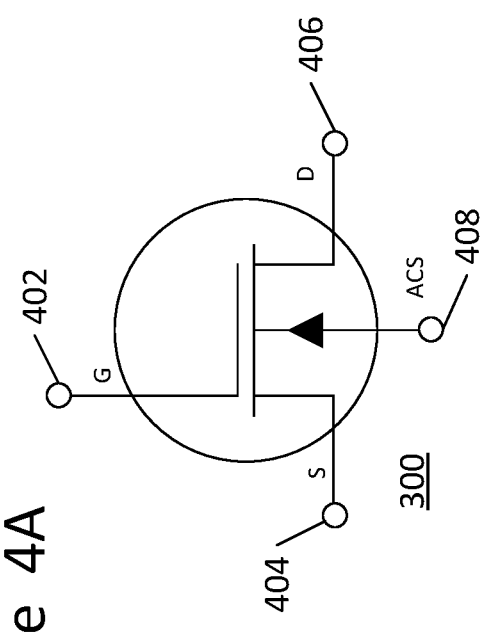
FIG. 4A is a simplified schematic of an improved SOI NMOSFET adapted to control accumulated charge embodied as a four terminal device.

The ACC MOSFET is shown schematically embodied as a four-terminal device in FIG. 4A. FIGS. 4B-4F show various exemplary simple circuit configurations that can be used in removing the accumulated charge from the ACC MOSFET when it operates in an accumulated charge regime. The operation of the simplified circuit configurations is described in more detail below with reference to FIGS. 4A-4F. The improvement in off-state capacitance $C_{off}$ of the ACC MOSFETs, as compared with the off-state capacitance of the prior art SOI MOSFETs, is described below with reference to FIG. 4G.

The operation of various exemplary RF switch circuits implemented using the ACC MOSFETs of the present disclosure is described below with reference to the circuit schematics of FIGS. 5B-5D. Further, an exemplary RF switch circuit using stacked ACC MOSFETs (for increased power handling) of the present disclosure is described below with reference to FIG. 6. An exemplary method of improving the linearity of an SOI MOSFET using an accumulated charge sink (ACS) is described with reference to FIG. 7. Finally, exemplary fabrication methods that may be used to manufacture the ACC MOSFET are described. The various exemplary ACS implementations and structures that can be used to practice the disclosed method and apparatus are now described with reference to FIGS. 3A-3I.

Controlling Accumulated Charge Using an Accumulated Charge Sink (ACS)

Figure 3B:
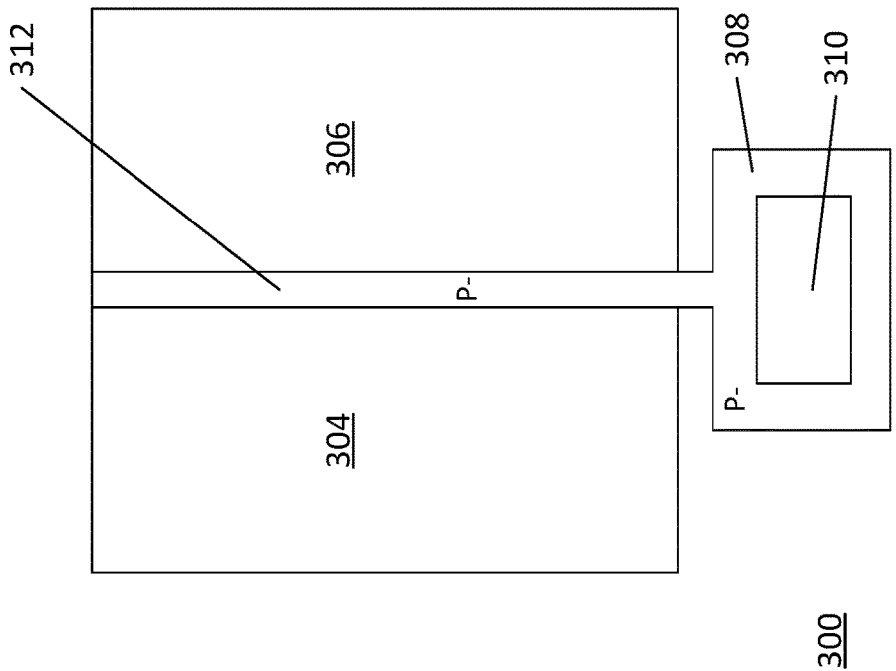
FIGS. 3A and 3B are simplified schematic diagrams of a top view of an improved SOI NMOSFET adapted to control accumulated charge in accordance with the present teachings.
Figure 3A:
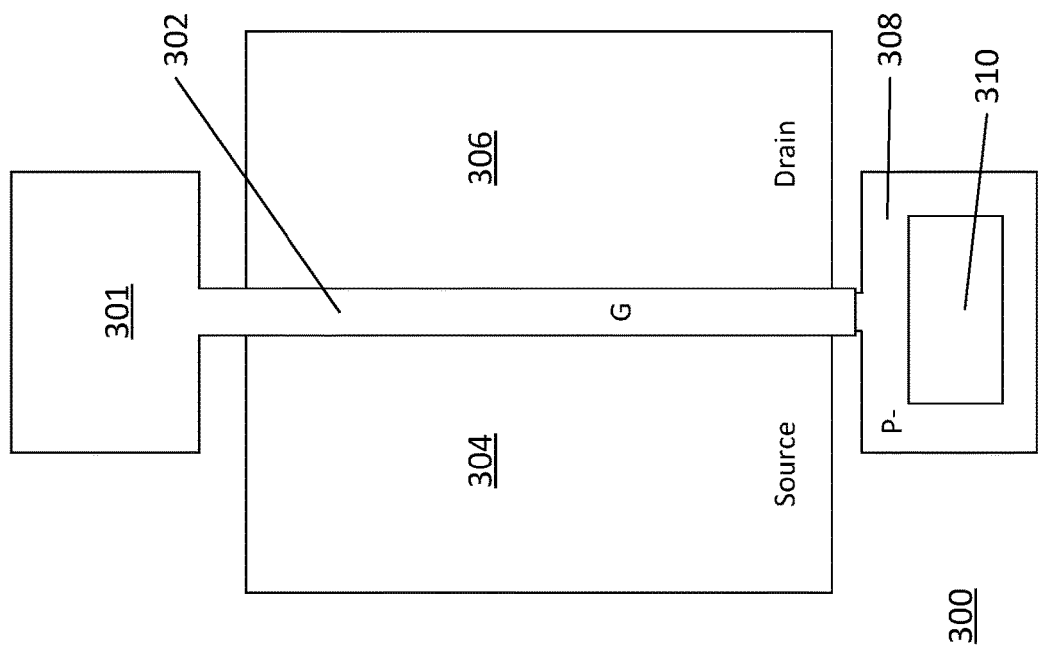

FIGS. 3A and 3B are simplified schematic diagrams of a top view of an Accumulated Charge Control (ACC) SOI NMOSFET 300 adapted to control accumulated charge 120 (FIG. 1) in accordance with the present disclosure. In the exemplary embodiment, a gate contact 301 is coupled to a first end of a gate 302. A gate oxide (not shown in FIG. 3A but shown in FIG. 1) and a body 312 (shown in FIG. 3B) are positioned under the gate 302. In the exemplary NMOSFET 300 shown, a source 304 and a drain 306 comprise N+ regions. In the exemplary embodiment, the ACC NMOSFET 300 includes an accumulated charge sink (ACS) 308 comprising a P− region. The ACS 308 is coupled to and is in electrical communication with the body 312 which also comprises a P− region. A region 310 provides electrical connection to the ACS 308. In some embodiments, the region 310 comprises a P+ region. As shown in FIG. 3A, the region 310 is coupled to and is in electrical communication with the ACS 308.

Those skilled in the arts of electronic devices shall understand that the region 310 may be used to facilitate electrical coupling to the ACS 308 because in some embodiments it may be difficult to make a direct contact to a lightly doped region. In addition, in some embodiments the ACS 308 and the region 310 may be coextensive. In another embodiment, the region 310 comprises an N+ region. In this embodiment, the region 310 functions as a diode connection to the ACS 308, which prevents positive current flow into the ACS 308 (and also prevents positive current flow into the body 312) under particular bias conditions, as described below in more detail.

FIG. 3B is an alternative top view of the ACC SOI NMOSFET 300 of FIG. 3A, illustrating the ACC NMOSFET 300 without its gate contact 301, gate 302, and gate oxide being visible. This view allows the body 312 to be visible. FIG. 3B shows the coupling of the ACS 308 to one end of the body 312. In one embodiment, the body 312 and the ACS 308 comprise a combined P− region that may be produced by a single ion-implantation step. In another embodiment, the body 312 and ACS 308 comprise separate P− regions that are coupled together.

As is well known to those skilled in the electronic device design arts, in other embodiments, the ACC NMOSFET 300 of FIGS. 3A and 3B can be implemented as an ACC PMOSFET simply by reversing the dopant materials used to implement the various FET component regions (i.e., replace p-type dopant material with n-type dopant material, and vice versa). More specifically, in an ACC PMOSFET, the source and drain comprise P+ regions, and the body comprises an N− region. In this embodiment, the ACS 308 also comprises an N− region. In some embodiments of the ACC PMOSFET, the region 310 may comprise an N+ region. In other embodiments of the ACC PMOSFETs, the region 310 comprises a P+ region, which functions as a diode connection to the ACS 308 and thereby prevents current flow into the ACS 308 under particular bias conditions.

Prior Art Body Contacts Distinguished from the Disclosed ACS

According to the present disclosure, the ACS 308 used to implement ACC SOI MOSFETs includes novel features in structure, function, operation and design that distinguish it from the so-called "body contacts" (also sometimes referred to as "body ties", usually when the "body contact" is directly connected to the source) that are well known in the prior art.

Exemplary references relating to body contacts used in prior art SOI MOSFETs include the following: (1) F. Hameau and O. Rozeau, Radio-Frequency Circuits Integration Using CMOS SOI 0.25 µm Technology," 2002 RF IC Design Workshop Europe, 19-22 Mar. 2002, Grenoble, France; (2) J. R. Cricci et al., "Silicon on Sapphire MOS Transistor," U.S. Pat. No. 4,053,916, Oct. 11, 1977; (3) O. Rozeau et al., "SOI Technologies Overview for Low-Power Low-Voltage Radio-Frequency Applications," Analog Integrated Circuits and Signal Processing, 25, pp. 93-114, Boston, MA, Kluwer Academic Publishers, November 2000; (4) C. Tinella et al., "A High-Performance CMOS-SOI Antenna Switch for the 2.5-5-GHz Band, "IEEE Journal of Solid-State Circuits, Vol. 38, No. 7, July, 2003; (5) H. Lee et al., "Analysis of body bias effect with PD-SOI for analog and RF applications," Solid State Electron., Vol. 46, pp. 1169-1176, 2002; (6) J.-H. Lee, et al., "Effect of Body Structure on Analog Performance of SOI NMOSFETs," Proceedings, 1998 IEEE International SOI Conference, 5-8 Oct. 1998, pp. 61-62; (7) C. F. Edwards, et al., The Effect of Body Contact Series Resistance on SOI CMOS Amplifier Stages," IEEE Transactions on Electron Devices, Vol. 44, No. 12, December 1997 pp. 2290-2294; (8) S. Maeda, et al., Substrate-bias Effect and Source-drain Breakdown Characteristics in Body-tied Short-channel SOI MOSFET's," IEEE Transactions on Electron Devices, Vol. 46, No. 1, January 1999 pp. 151-158; (9) F. Assaderaghi, et al., "Dynamic Threshold-voltage MOSFET (DTMOS) for Ultra-low Voltage VLSI," IEEE Transactions on Electron Devices, Vol. 44, No. 3, March 1997, pp. 414-422; (10) G. O. Workman and J. G. Fossum, "A Comparative Analysis of the Dynamic Behavior of BTG/SOI MOSFETs and Circuits with Distributed Body Resistance," IEEE Transactions on Electron Devices, Vol. 45, No. 10, October 1998 pp. 2138-2145; and (11) T.-S. Chao, et al., "High-voltage and High-temperature Applications of DTMOS with Reverse Schottky Barrier on Substrate Contacts," IEEE Electron Device Letters, Vol. 25, No. 2, February 2004, pp. 86-88.

As described herein, applications such as RF switch circuits, may use SOI MOSFETs operated with off-state bias voltages, for which accumulated charge may result. The SOI MOSFETs are defined herein as operating within the accumulated charge regime when the MOSFETs are biased in the off-state, and when carriers having opposite polarity to the channel carriers are present in the channel regions of the MOSFETs. In some embodiments, the SOI MOSFETs may operate within the accumulated charge regime when the MOSFETs are partially depleted yet still biased to operate in the off-state. Significant benefits in improving nonlinear effects on source-drain capacitance can be realized by removing or otherwise controlling the accumulated charge according to the present teachings. In contrast to the disclosed techniques, none of the cited prior art teach or suggest ACS methods and apparatuses that are uniquely useful for removing or controlling accumulated charge. Nor are they informed regarding problems caused by the accumulated charge such as nonlinear effects on the off-state source-drain capacitance $C_{off}$. Consequently, the prior art body contacts described in the references cited above differ greatly (in structure, function, operation and design) from the ACSs described with reference to FIGS. 3A-4D.

In one example, the ACS 308 operates effectively to remove or otherwise control the accumulated charge from the SOI NMOSFET 300 using a high impedance connection to and throughout the body 312. High impedance ACSs may be used because the accumulated charge 120 is primarily generated by phenomena (e.g., thermal generation) that take a relatively long period of time to produce significant accumulated charge. For example, a typical time period for producing non-negligible accumulated charge when the NMOSFET operates in the accumulated charge regime is approximately a few milliseconds or greater. Such relatively slow generation of accumulated charge corresponds to very low currents, typically less than 100 nA/mm of transistor width. Such low currents can be effectively conveyed even using very high impedance connections to the body. According to one example, the ACS 308 is implemented with a connection having a resistance of greater than $10^6$ ohms. Consequently, the ACS 308 is capable of effectively removing or otherwise controlling the accumulated charge 120 even when implemented with a relatively high impedance connection, relative to the low impedance prior art body contacts.

In stark contrast, the prior art teachings of body contacts described in the references cited above require low impedance (high efficiency) access to the body regions of SOI MOSFETs for proper operation (see, e.g., references (3), (6), and (7) above). A principal reason for this requirement is that the prior art body contacts are primarily directed to reducing the adverse effects on SOI MOSFET functions caused by much faster and more effective electron-hole pair generation processes than occur when the FET is operated in the accumulated charge regime. For example, in some prior art MOSFETs not operated in the accumulated charge regime, electron-hole pair carriers are generated as a result of impact ionization. Impact ionization produces electron-hole pairs at a much faster rate than occurs when the FET is operated in the accumulated charge regime.

The relative rates for electron-hole pair generation by impact ionization versus the pair generation processes causing accumulated charge can be estimated from the roll-off frequencies for the two phenomena. For example, reference (3) cited above indicates roll-off frequencies for impact ionization effects in the range of 105 Hz. In contrast, a roll-off frequency for the accumulated charge effects has been observed to be in the range of 103 Hz or less, as indicated by recovery times for odd harmonics. These observations indicate that the ACS 308 can effectively control accumulated charge using an impedance that is at least 100 times larger than required of prior art body contacts used in controlling impact ionization charge, for example. Further, because impact ionization primarily occurs when the SOI MOSFET operates in an on-state, the effects of impact ionization can be amplified by on-state transistor operation. Low impedance body contacts to and throughout a body region is even more critical in these environments in order to control the effects of impact ionization under the on-state conditions.

In stark contrast, the ACS 308 of the present teachings removes or otherwise controls the accumulated charge only when the ACC SOI MOSFET operates in the accumulated charge regime. By definition, the FET is in the off-state in this regime, so there is no requirement to remove impact ionization as amplified by an on-state FET. Therefore, a high impedance ACS 308 is perfectly adequate for removing the accumulated charge under these operating conditions. The prior art requirements for low impedance body connections results in numerous problems of implementation that are overcome by the present teachings, as described below in more detail.

In addition, the ACS 308 may be implemented with much lower source-to-drain parasitic capacitance as compared to the body contacts of the prior art. The above-described low impedance connection to the SOI MOSFET body required of the prior art body contacts necessitates proximity of the contacts to the entire body. This may require a plurality body contact "fingers" that contact the body at different locations along the body. The low impedance connection to the body also necessitates proximity of the prior art body contacts to the source and drain. Because of parasitic capacitances produced by such body contacts, the cited prior art references teach away from the use of such structures for many high frequency applications such as RF. In stark contrast, the ACS 308 of the present disclosure may be positioned away from the source 304, the body 312, and the drain 306, as shown in FIGS. 3A and 3B, thereby eliminating or greatly reducing parasitic capacitances caused by a more proximate positioning of the ACS 308 relative to the source drain and body. Further, the ACS 308 may be implemented in SOI MOSFETs operated with a depleted channel. In general, the cited prior art references teach away from the use of body contacts for this environment (see, e.g., reference (3), cited above).

Further, because impact ionization hole currents are much larger (in the range of 5,000 nA per mm body width) than for accumulated charge generation (less than approximately 100 nA per mm body width), the prior art does not teach how to effectively implement very large body widths (i.e., much greater than approximately 10 μm). In contrast, the ACS 308 of the present disclosed device may be implemented in SOI MOSFETs having relatively large body widths. This provides improvements in on-state conductance and transconductance, insertion loss and fabrication costs, particularly for RF switch devices. According to the prior art teachings cited above, larger body widths adversely affect the efficient operation of body contacts because their impedances are necessarily thereby increased. Although the cited prior art suggests that a plurality of fingers may be used to contact the body at different locations, the plurality of fingers adversely affects parasitic source-to-drain capacitances, as described above.

For these reasons, and for the reasons described below in more detail, the present disclosure provides novel MOSFET devices, circuits and methods that overcome the limitations according to the prior art teachings as cited above.

Figures 3C, 3D:
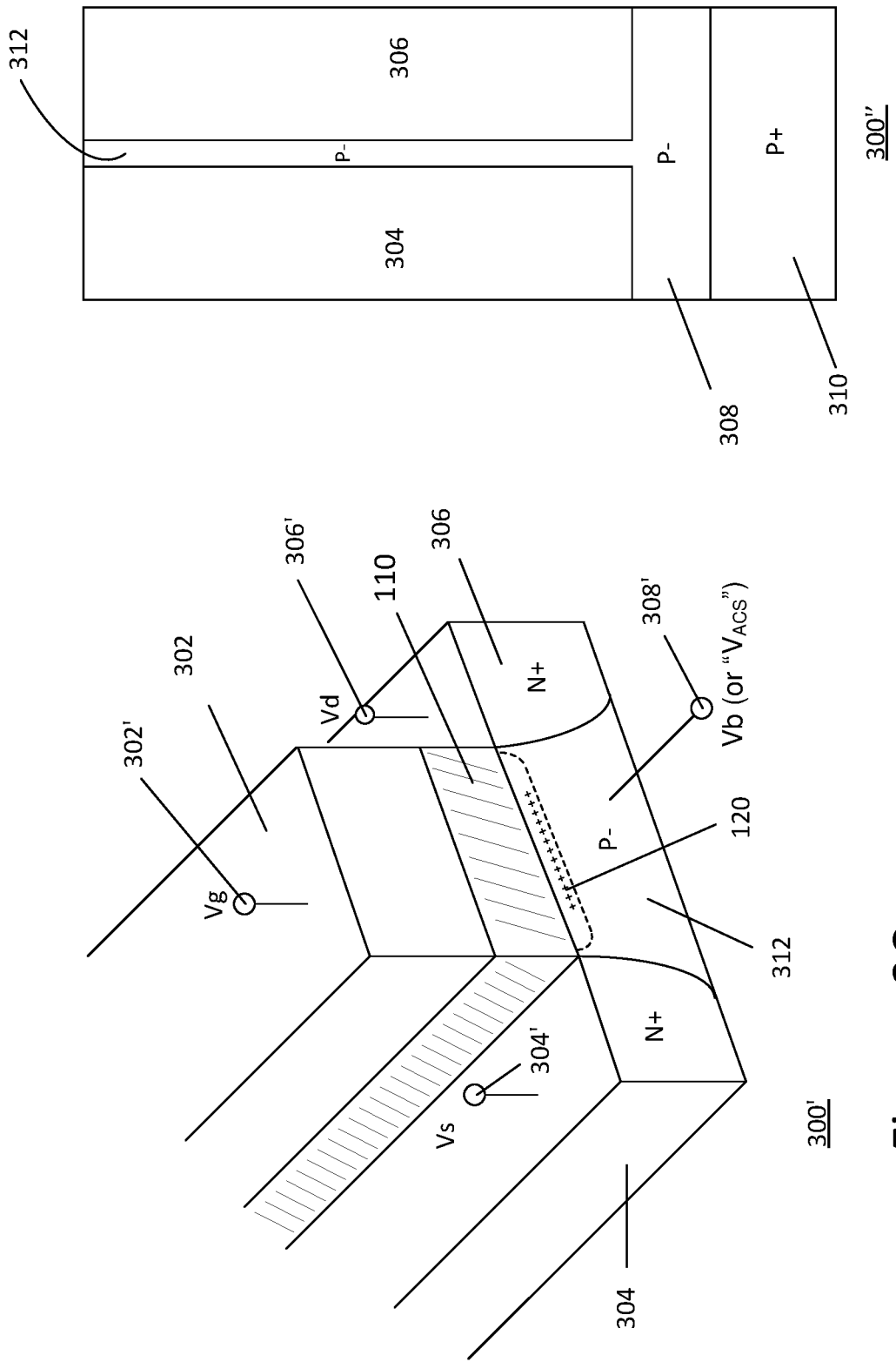
FIG. 3C is a cross-sectional perspective schematic of an improved SOI NMOSFET adapted to control accumulated charge showing gate, source, drain and accumulated charge sink (ACS) terminals.
FIG. 3D is a simplified top view schematic of an improved SOI NMOSFET adapted to control accumulated charge having an accumulated charge sink (ACS) electrically coupled to a P+ region.

FIG. 3C is a cross-sectional perspective schematic of an ACC SOI NMOSFET 300' adapted to control accumulated charge in accordance with the disclosed method and apparatus. In the example shown in FIG. 3C, the ACC NMOSFET 300' includes four terminals that provide electrical connection to the various FET component regions. In one embodiment, the terminals provide means for connecting external integrated circuit (IC) elements (such as metal leads, not shown) to the various FET component regions. Three of the terminals shown in FIG. 3C are typically available in prior art FET devices. For example, as shown in FIG. 3C, the ACC NMOSFET 300' includes a gate terminal 302' that provides electrical connection to the gate 302. Similarly, the ACC NMOSFET 300' includes source and drain terminals 304', 306' that provide electrical connection to the source 304 and drain 306, respectively. As is well known in the electronic design arts, the terminals are coupled to their respective FET component regions (i.e., gate, drain and source) via so-called "ohmic" (i.e., low resistance) contact regions. The manufacturing and structural details associated with the coupling of the various FET terminals to the FET component regions are well known in the art, and therefore are not described in more detail here.

As described above with reference to FIGS. 3A and 3B, the ACC NMOSFET 300' is adapted to control accumulated charge when the NMOSFET operates in the accumulated charge regime. To this end, in the exemplary embodiment shown in FIG. 3C, the ACC NMOSFET 300' includes a fourth terminal that provides electrical connection to the body 312, and thereby facilitates reduction (or other control) of the accumulated charge when the FET 300' operates in the accumulated charge regime. More specifically, and referring again to FIG. 3C, the ACC NMOSFET includes a "body" terminal, or Accumulated Charge Sink (ACS) terminal 308'. The ACS terminal 308' provides an electrical connection to the ACS 308 (not shown in FIG. 3C, but shown in FIGS. 3A and 3B) and to the body 312. Although the ACS terminal 308' is shown in FIG. 3C as being physically coupled to the body 312, those skilled in the electronic design arts shall understand that this depiction is for illustrative purposes only. The direct coupling of the ACS terminal 308' to the body 312 shown in FIG. 3C illustrates the electrical connectivity (i.e., not the physical coupling) of the terminal 308' with the body 312. Similarly, the other terminals (i.e., terminals 302', 304' and 306') are also shown in FIG. 3C as being physically coupled to their respective FET component regions. These depictions are also for illustrative purposes only.

In most embodiments, as described above with reference to FIGS. 3A-3B, and described further below with reference to FIGS. 3D-3I, the ACS terminal 308' provides the electrical connection to the body 312 via coupling to the ACS 308 via the region 310. However, the present disclosure also contemplates embodiments where the coupling of the ACS terminal 308' is made directly to the body 312 (i.e., no intermediate regions exist between the ACS terminal and the body).

In accordance with the disclosed method and apparatus, when the ACC NMOSFET 300' is biased to operate in the accumulated charge regime (i.e., when the ACC NMOSFET 300' is in the off-state, and there is an accumulated charge 120 of P polarity (i.e., holes) present in the channel region of the body 312), the accumulated charge is removed or otherwise controlled via the ACS terminal 308'. When accumulated charge 120 is present in the body 312, the charge 312 can be removed or otherwise controlled by applying a bias voltage ($V_b$ (for "body") or $V_{ACS}$ (ACS bias voltage)) to the ACS terminal 308'. In general, the ACS bias voltage $V_{ACS}$ applied to the ACS terminal 308' may be selected to be equal to or more negative than the lesser of the source bias voltage Vs and drain bias voltage Vd. More specifically, in some embodiments, the ACS terminal 308' can be coupled to various accumulated charge sinking mechanisms that remove (or "sink") the accumulated charge when the FET operates in the accumulated charge regime. Several exemplary accumulated charge sinking mechanisms and circuit configurations are described below with reference to FIGS. 4A-5D.

Similar to the prior art NMOSFET 100 described above with reference to FIG. 1, the ACC SOI NMOSFET 300' of FIG. 3C can be biased to operate in the accumulated charge regime by applying specific bias voltages to the various terminals 302', 304', and 306'. In one exemplary embodiment, the source and drain bias voltages (Vs and Vd, respectively) are zero (i.e., the terminals 304' and 306' are connected to ground). In this example, if the gate bias voltage (Vg) applied to the gate terminal 302' is sufficiently negative with respect to the source and drain bias voltages, and with respect to $V_{th}$ (for example, if Vin is approximately zero, and if Vg is more negative than approximately −1 V), the ACC NMOSFET 300' operates in the off-state. If the ACC NMOSFET 300' continues to be biased in the off-state, the accumulated charge (holes) will accumulate in the body 312. Advantageously, the accumulated charge can be removed from the body 312 via the ACS terminal 308'. In some embodiments, as described below in more detail with reference to FIG. 4B, the ACS terminal 308' is coupled to the gate terminal 302' (thereby ensuring that the same bias voltages are applied to both the gate (Vg) and the body (shown in FIG. 3C as "Vb" or "$V_{ACS}$").

However, those skilled in the electronics design arts shall appreciate that a myriad of bias voltages can be applied to the four device terminals while still employing the techniques of the present disclosed method and apparatus. As long as the ACC SOI NMOSFET 300' is biased to operate in the accumulated charge regime, the accumulated charge can be removed or otherwise controlled by applying a bias voltage $V_{ACS}$ to the ACS terminal 308', and thereby remove the accumulated charge from the body 312.

For example, in one embodiment wherein the ACC NMOSFET 300' comprises a depletion mode device, $V_{th}$ is negative by definition. In this embodiment if both the Vs and Vd bias voltages comprise zero volts (i.e., both terminals tied to circuit ground node), and a gate bias Vg applied to the gate terminal 302' is sufficiently negative to $V_{th}$ (for example, Vg is more negative than approximately −1 V relative to $V_{th}$), holes may accumulate under the gate oxide 110 thereby becoming the accumulated charge 120. In this example, in order to remove the accumulated holes (i.e., the accumulated charge 120) from the FET body 312, the voltage $V_{ACS}$ applied to the ACS 308 may be selected to be equal to or more negative than the lesser of Vs and Vd.

In other examples, the source and drain bias voltages, Vs and Vd, respectively, may comprise voltage other than zero volts. According to these embodiments, the gate bias voltage Vg must be sufficiently negative to both Vs and Vd (in order for Vg to be sufficiently negative to $V_{th}$, for example) in order to bias the NMOSFET in the off-state. As described above, if the NMOSFET is biased in the off-state for a sufficiently long time period (approximately 1-2 ms, for example) an accumulated charge will accumulate under the gate oxide. In these embodiments, as noted above, in order to remove the accumulated charge 120 from the body 312, the ACS bias voltage $V_{ACS}$ applied to the ACS terminal 308' may be selected to be equal to or more negative than the lesser of Vs and Vd.

It should be noted that, in contrast to the examples described above, the prior art body contacts are implemented largely for purposes of mitigating the adverse effects caused by impact ionization. Consequently, the prior art body contacts are typically tied to the source of the MOSFET. In order to effectively control, reduce, or entirely remove the accumulated charge in an NMOSFET, $V_{ACS}$ should, in the exemplary embodiments, be equal to or more negative than the lesser of Vs and Vd. Those skilled in the electronic device design arts shall appreciate that different Vs, Vd, Vg and $V_{ACS}$ bias voltages may be used when the ACC MOSFET comprises a PMOSFET device. Because the prior art body contacts are typically tied to the source, this implementation cannot be effected using the prior art body contact approach.

FIG. 3D is a simplified schematic diagram of a top view of an ACC SOI NMOSFET 300'' adapted to control accumulated charge 120 (FIG. 1) in accordance with the present disclosure. FIG. 3D shows the ACC NMOSFET 300'' without its gate contact 301, gate 302, and gate oxide being visible. The ACC NMOSFET 300'' of FIG. 3D is very similar in design to the ACC NMOSFET 300 described above with reference to FIGS. 3A and 3B. For example, similar to the ACC NMOSFET 300, the ACC NMOSFET 300'' includes a source 304 and drain 306 comprising N+ regions. The ACC NMOSFET 300'' also includes an accumulated charge sink (ACS) 308 comprising a P− region. As shown in FIG. 3D, the P− region that comprises the ACS 308 abuts (i.e., is directly adjacent) the body 312, which also comprises a P− region. Similar to the ACC NMOSFET 300, the ACC NMSOFET 300'' includes a region 310 that provides electrical connection to the ACS 308. As noted above, in some embodiments, the region 310 comprises a P+ region. In another embodiment, the region 310 may comprise an N+ region (which thereby prevents positive current flow into the body 312 as noted above). As shown in FIG. 3D, the region 310 is formed in the ACC NMOSFET 300'' directly adjacent the ACS 308. The ACC SOI NMOSFET 300'' functions to control accumulated charge similarly to the operation of the ACC NMOSFETs described above with reference to FIGS. 3A-3C.

Figure 3E:
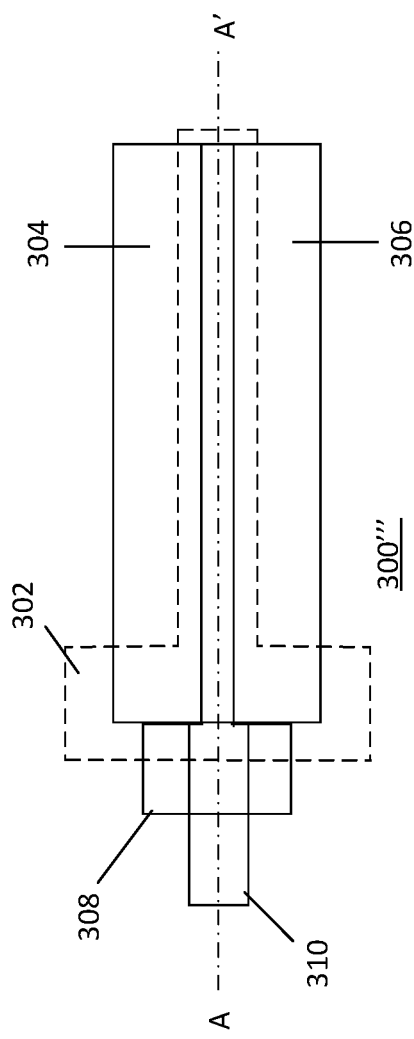
FIG. 3E is a simplified top view schematic of an improved SOI NMOSFET adapted to control accumulated charge and showing a cross-sectional view line A-A' taken along approximately a center of the SOI NMOSFET.

FIG. 3E is a simplified schematic diagram of a top view of an ACC SOI NMOSFET 300'' adapted to control accumulated charge in accordance with the present disclosure. The ACC NMOSFET 300''' is very similar in design and function to the ACC NMOSFETs described above with reference to FIGS. 3A-3D. FIG. 3E shows a dashed cross-sectional view line A-A' taken along the approximate center of the NMOSFET 300''. This cross-sectional view is used herein to describe structural and performance characteristics of some exemplary prior art MOSFETS and some embodiments of the ACC NMOSFET that may occur as a result of the fabrication processes. Details of this cross-sectional view A-A' are now described with reference to FIG. 3F.

View line A-A' slices through the following component regions of the ACC NMOSFET 300'': the P+ region 310, the ACS 308 (shown in FIG. 3E, but not shown in FIG. 3F), a P+overlap region 310', a gate oxide 110, and a poly-silicon gate 302. In some embodiments, during the fabrication process, when the region 310 is doped with p-type dopant material, proximate the P− body region, some additional P+ doping may be implanted (i.e., the p-type dopant material may overlap) into the P+overlap region 310' of the poly-silicon gate 302. In some embodiments, such overlapping is intentionally performed to ensure that all of the gate oxide 110 is completely covered by the P+ region (i.e., to ensure that no gap exists on the edge of the oxide 110 between the gate 302 and the P+ region 310). This, in turn, aids in providing a minimum impedance connection between the P+ region 310 and the body 312.

Figure 3F:
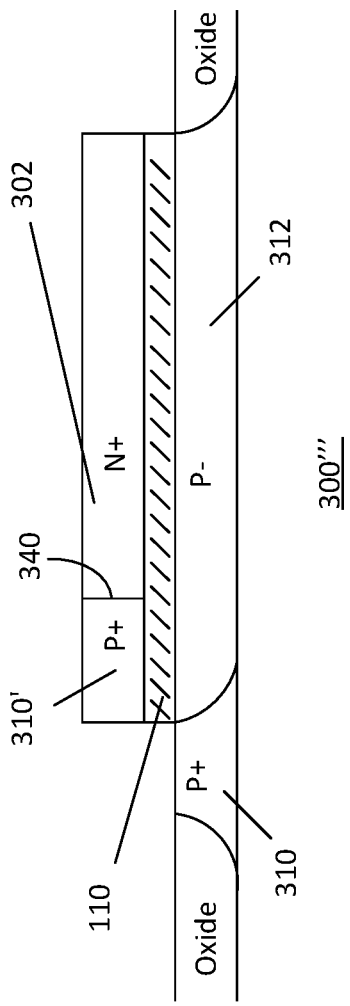
FIG. 3F is a cross-sectional view of the improved SOI NMOSET of FIG. 3E taken along the A-A' view line of FIG. 3E.
Figures 1, 3F:
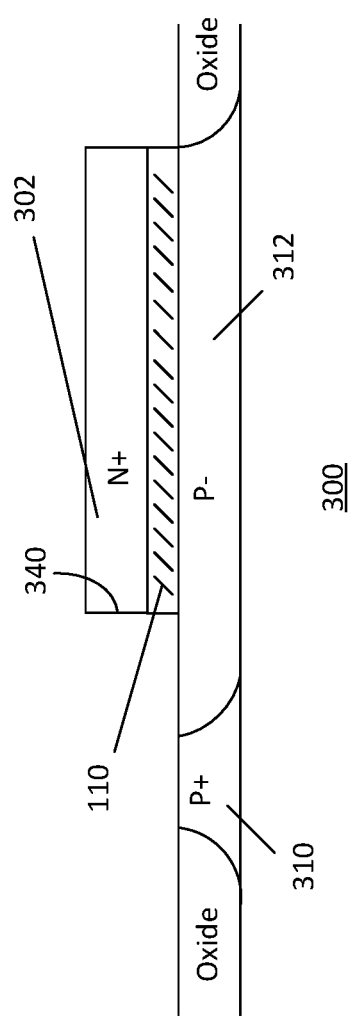

Although the present teachings encompass such embodiments described above, those skilled in the electronic device design and manufacturing arts shall recognize that such low-resistance connections are not required. Therefore, the disadvantages associated with the embodiment shown in FIGS. 3G and 3G-1, as described below in more detail, can be overcome by using other embodiments described herein (for example, the embodiments 300 and 300'' described below with reference to FIGS. 3F-1 and 3H, respectively), in which gaps are intentionally implemented between the P+ region 310 and the body 312. In one exemplary embodiment, the P+overlap region 320 overlaps the oxide 110 by approximately 0.2-0.7 microns. Those skilled in the MOSFET design and manufacturing arts shall appreciate that other overlap region dimensions can be used in practicing the present disclosed method and apparatus. In some embodiments, as shown in FIG. 3F, the remaining area over the gate oxide 110 and over the P− body is doped with n-type dopant material (i.e., it comprises an N+ region).

Owing to the presence of the P+overlap region 310' over the gate oxide 110, over the body 312, and proximate an edge 340 of the poly-silicon gate 302, an increased threshold voltage is created in one region of the NMOSFET 300''. More specifically, due to the P+ doping (in the overlap region 310') proximate the edge 340 of the gate 302 over the channel region of the body 312, a higher magnitude threshold voltage is created in that portion of the MOSFET 300''. The effects of the increased threshold voltage are now described in more detail with reference to FIG. 3G.

Figures 1, 3G:
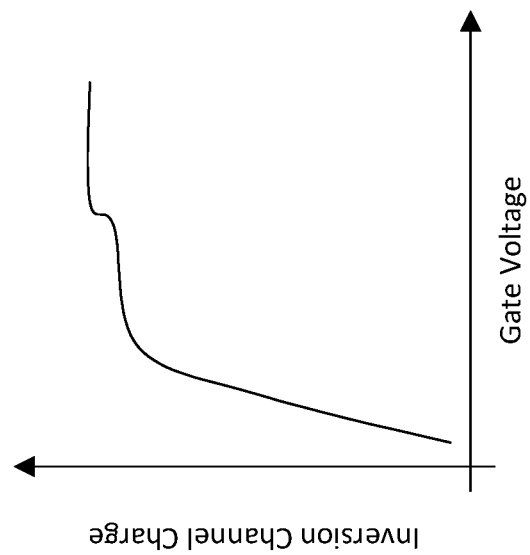
FIG. 3G is a simplified top view schematic of an SOI NMOSFET illustrating the region of increased threshold voltage that can occur in the prior art MOSFETs and in some embodiments of the improved SOI MOSFET due to manufacturing processes.
Figure 3G:
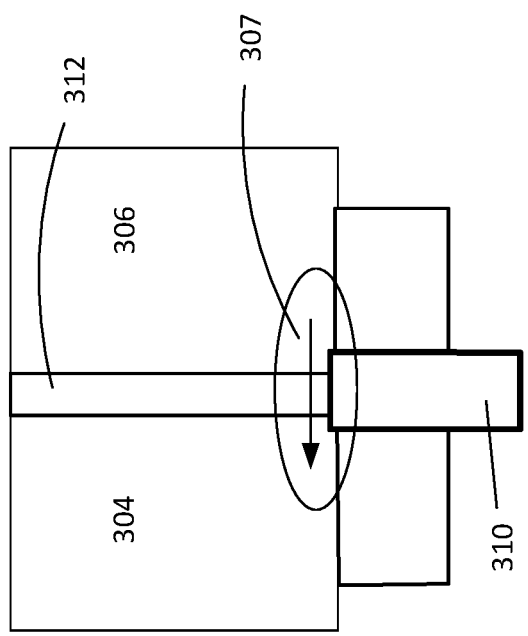

FIG. 3G-1 is a schematic plot of the inversion channel charge vs. applied gate voltage of an ACC NMOSFET illustrating one effect of the above described increased threshold voltage that can occur in prior art MOSFETs and in some embodiments of the present ACC NMOSFETS due to manufacturing processes. As described below in more detail, the increased magnitude threshold voltage shown in FIG. 3G also occurs in prior art designs because of the proximity of body ties to the FET body. As described below with reference to the embodiment of FIG. 3H, for example, the present disclosed method and apparatus can be used to reduce or eliminate the increased threshold voltage found in the prior art SOI MOSFET designs.

FIG. 3G shows one embodiment of the ACC NMOSFET without its gate contact, gate, and gate oxide being visible. The MOSFET region of increased threshold voltage described above with reference to FIGS. 3E and 3F is shown in FIG. 3G as occurring in the region encompassed by the ellipse 307. As will be well understood by those skilled in the electronic design and manufacturing arts, for the reasons set forth above with reference to FIGS. 3E and 3F, due to the increased threshold voltage, the region 307 of the ACC MOSFET shown in FIG. 3G effectively inverts after the rest of the ACC MOSFET channel region.

The threshold voltage increase can be reduced by reducing the size of the region 307. Eliminating the region 307 will eliminate the threshold voltage increase. Because the threshold voltage increase can increase harmonic and intermodulation distortion of the "on" MOSFET, eliminating this effect improves device performance.

In one exemplary embodiment, as shown, for example in the embodiments of the ACC NMOSFET 300 described above with reference to FIGS. 3A and 3B, and as described below in more detail with reference to the cross-sectional view of the ACC MOSFET 300 of FIG. 3F-1, the detrimental effects associated with threshold voltage increase are mitigated or overcome by positioning the P+ region 310 a selected distance away from an edge of the poly-silicon gate 302. This approach is shown both in the top view of the ACC MOSFET 300 of FIG. 3A, and in the cross-sectional view of the ACC MOSFET 300 shown in FIG. 3F-1. As shown in the cross-sectional view of the ACC MOSFET 300 of FIG. 3F-1, the P+ region 310 does not extend all the way to the edge 340 of the poly-silicon gate 302. This is in stark contrast to the embodiment 300" shown in FIG. 3F, where the P+ region 310' extends all the way to the gate edge 340. By positioning the P+ region 310 a distance away from the gate edge 340 as shown in the embodiment 300 of FIG. 3F-1, no P+ region is positioned proximate the poly-silicon gate 302 (i.e., there is no P+ region present in the poly-silicon gate 302). This configuration of the P+ region 310 eliminates or greatly reduces the threshold voltage increase problems described above. As described above with reference to FIGS. 3A and 3B, and with reference to the comparisons to the prior art body contact references, the relatively high impedance of the ACS 308 P– region (shown in FIG. 3A) between the P+ region 310 and the gate 302 does not adversely affect the performance of the ACC NMOSFET 300. As described above, the accumulated charge can be effectively removed even using a relatively high impedance ACS connection.

In another exemplary embodiment, as described below with reference to FIG. 3H, threshold voltage increase is removed by positioning the P+ region 310 (and the ACS 308) a distance away from the body 312. Because the electrical connectivity between the ACS 308 and the body 312 has relatively high impedance when the small region of P+ 310 is positioned a distance away from the body 312, this approach is never taught or suggested by the body contact prior art references (which require low impedance contacts as described above). This improved embodiment is described next with reference to FIG. 3H.

Figure 3I:
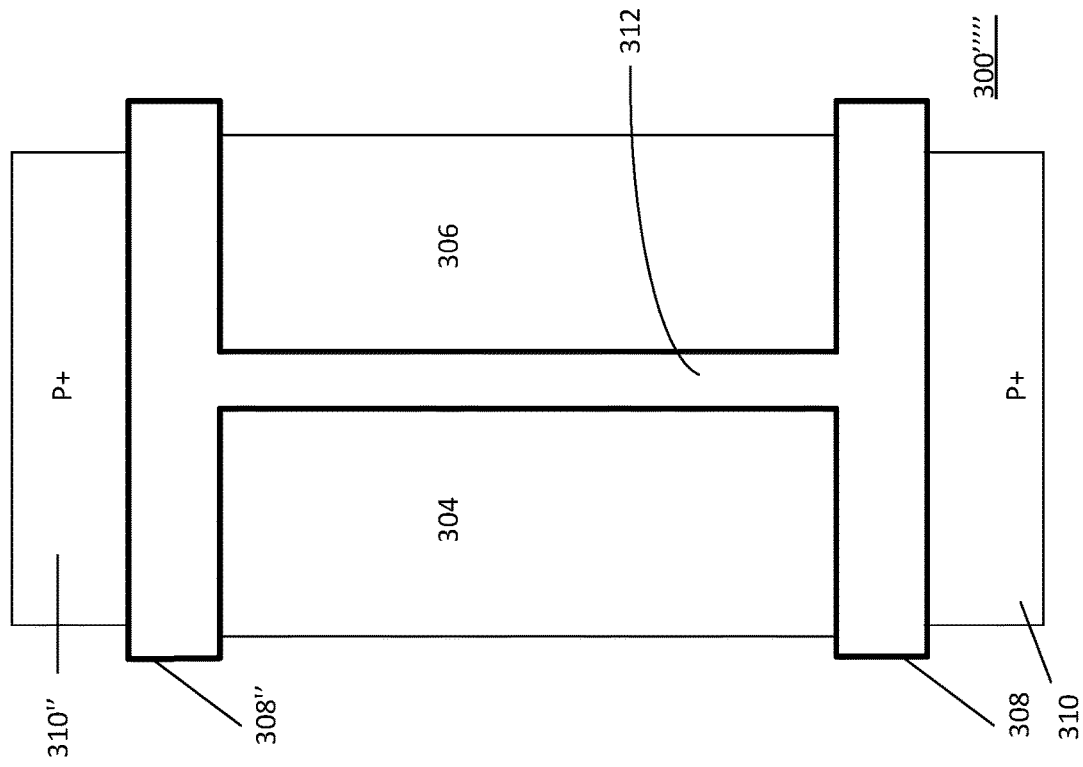
FIG. 3I is a simplified top view schematic of an improved SOI NMOSFET adapted to control accumulated charge and configured in an "H-gate" configuration.
Figure 3H:
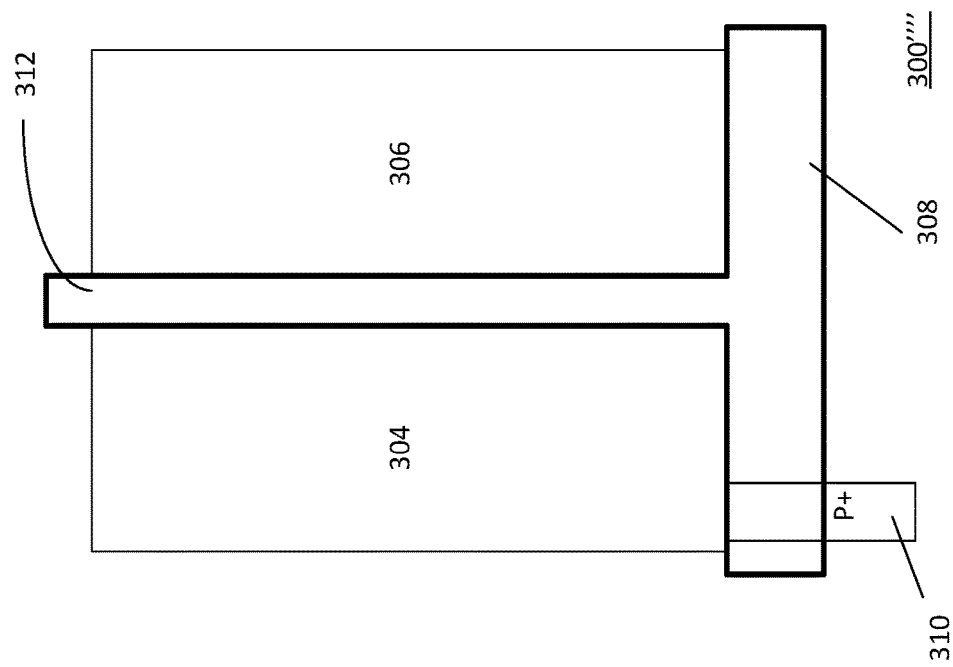
FIG. 3H is a simplified top view schematic of an improved SOI NMOSFET adapted to control accumulated charge and configured in a "T-gate" configuration.

FIG. 3H is a simplified top view schematic of another embodiment of an ACC SOI NMOSFET 300'' adapted to control accumulated charge and configured in a "T-gate" configuration. FIG. 3H shows the ACC NMOSFET 300''' without its gate contact 301, gate 302, and gate oxide being visible. As shown in FIG. 3H, the ACC NMOSFET 300'''' includes a small P+ region 310 conjoined to an ACS 308. As shown in FIG. 3H, the P+ region 310 (and thus the ACS external electrical connection) is disposed a selected distance away from the body 312. The total impedance of the electrical connection from the body 312, through the ACS 308, and to the P+ region 310 is increased by positioning the P+ region 310 a selected distance away from the body 312. However, as described above, the present ACC NMOSFET 300'' works perfectly well to remove accumulated charge even using relatively high impedance ACS connections. For the reasons described above with reference to FIGS. 3A and 3B, due to the nature of the accumulated charge when the NMOSFET 300'' operates in the accumulated charge regime, the ACC NMOSFET 300'' does not require low impedance ACS electrical connections in order to remove accumulated charge from the body 312. Rather, an ACS connection of relatively large impedance may be used in practicing the present teachings, with corresponding improvements in NMOSFET performance as described above (e.g., reductions in parasitic capacitance as compared with prior art low impedance body contacts). However, in other embodiments, if desired, a low impedance ACS connection may be used to practice the disclosed method and apparatus for use in improving linearity characteristics of SOI MOSFETs.

Moreover, as described above with reference to FIG. 3G, the embodiment of FIG. 3H improves device performance owing to the fact that the small P+ region 310 is positioned a distance away from the body 312. Because the small P+ region 310 is positioned a distance away from the body 312, the threshold voltage increase is reduced or entirely eliminated, together with the consequent adverse performance effects described above.

FIG. 3I is a simplified top view schematic of another embodiment of an ACC SOI NMOSFET 300'' adapted to control accumulated charge and configured in an "H-gate" configuration. FIG. 3I shows the ACC NMOSFET 300''' without its gate contact 301, gate 302, and gate oxide being visible. With the exception of some structural differences described herein, the ACC NMOSFET 300'' is very similar in design and function to the ACC NMOSFETs described above with reference to FIGS. 3A-3D and 3H. As shown in FIG. 3I, the ACC NMOSFET 300'' includes two ACSs, 308 and 308'', disposed at opposite ends of the H-gate ACC NMOSFET 300''. P+ regions 310 and 310'' are formed to abut their respective ACSs, 308 and 308'', and provide electrical contact thereto. In accordance with the disclosed method and apparatus, as described above, when the ACC NMOSFET 300'' is biased to operate in the accumulated charge regime, the accumulated charge is removed or otherwise controlled via the two ACSs 308 and 308''.

It shall be understood by those skilled in the electronic device design arts that although the illustrated embodiment shows the ACSs 308 and 308'' extending approximately the entire width of the ACC NMOSFET 300'', the ACSs 308 and 308'' may also comprise much narrower (or wider) regions, and still function perfectly well to remove or otherwise control the accumulated charge. Also, in some embodiments, it is not necessary that the impedance of the ACS 308 matches the impedance of the ACS 308''. It will further be understood by the skilled person that the ACSs 308 and 308'' may comprise different sizes and configurations (i.e., rectangular, square, or any other convenient shape), and may also be positioned at various distances away from the body 312 (i.e., not necessarily the same distance away from the body 312). As described above with reference to FIG. 3H, when the ACS 308 is positioned a selected distance away from the body 312, the problems associated with threshold voltage increase are reduced or eliminated.

Four-Terminal ACC MOSFET Devices—Simple Circuit Configurations

The SOI NMOSFET 300 of FIGS. 3A and 3B may be implemented as a four terminal device, as illustrated schematically in FIG. 4A. As shown in the improved ACC SOI NMOSFET 300 of FIG. 4A, a gate terminal 402 is electrically coupled to the gate contact 301 (e.g., FIG. 3A) and is analogous to the gate terminal 302' shown in FIG. 3C. The gate contact 301 is electrically coupled to the gate 302 (e.g., FIGS. 3A and 3C). Similarly, a source terminal 404 is electrically coupled to the source 304 (e.g., FIGS. 3A-3C) and is analogous to the source terminal 304' of FIG. 3C. Similarly, a drain terminal 406 is electrically coupled to the drain 306 (e.g., FIGS. 3A-3C) and is analogous to the drain terminal 306' of FIG. 3C. Finally, the ACC NMOSFET 300 includes an ACS terminal 408 that is electrically coupled to the ACS 308 (e.g., see FIGS. 3A-3B, and FIGS. 3D, 3H-3I) via the region 310. Those skilled in the electronic design and manufacturing arts shall understand that the region 310 may be used in some embodiments to facilitate electrical coupling to the ACS 308 because, in some embodiments, it may be difficult to make a direct contact to a lightly doped region (i.e., the ACS 308). The ACS terminal 408 is analogous to the ACS terminal 308' shown in FIG. 3C.

The ACC SOI NMOSFET 300 of FIG. 4A may be operated using various techniques and implemented in various circuits in order to control accumulated charge present in the FET when it is operating in an accumulated charge regime. For example, in one exemplary embodiment as shown in FIG. 4B, the gate and ACS terminals, 402 and 408, respectively, are electrically coupled together. In one embodiment of the simplified circuit shown in FIG. 4B, the source and drain bias voltages applied to the terminals 404 and 406, respectively, may be zero. If the gate bias voltage (Vg) applied to the gate terminal 402 is sufficiently negative with respect to the source and drain bias voltages applied to the terminals 404 and 406, and with respect to the threshold voltage $V_{th}$, (for example, if $V_{th}$ is approximately zero, and if Vg is more negative than approximately −1 V) the ACC NMOSFET 300 operates in the accumulated charge regime. As described above with reference to FIG. 3C, for example, when the MOSFET operates in this regime, accumulated charge (holes) may accumulate in the body of the NMOSFET 300.

Advantageously, the accumulated charge can be removed via the ACS terminal 408 by connecting the ACS terminal 408 to the gate terminal 402 as shown. This configuration ensures that when the FET 300 is in the off-state, it is held in the correct bias region to effectively remove or otherwise control the accumulated charge. As shown in FIG. 4B, connecting the ACS terminal 408 to the gate ensures that the same bias voltages are applied to both the gate (Vg) and the body (shown in FIG. 3C as "Vb" or "$V_{ACS}$"). Because the bias voltage $V_{ACS}$ is the same as the gate voltage Vg in this embodiment, the accumulated charge is no longer trapped below the gate oxide (by attraction to the gate bias Vg) because it is conveyed to the gate terminal 402 via the ACS terminal 408. The accumulated charge is thereby removed from the body via the ACS terminal 408.

In other exemplary embodiments, as described above with reference to FIG. 3C, for example, Vs and Vd may comprise nonzero bias voltages. According to these examples, Vg must be sufficiently negative to both Vs and Vd in order for Vg to be sufficiently negative to $V_{th}$ to turn the NMOSFET 300 off (i.e., operate the NMOSFET 300 in the off-state). When so biased, as described above, the NMOSFET 300 may enter the accumulated charge regime and thereby have accumulated charge present in the body. For this example, the voltage $V_{ACS}$ may also be selected to be equal to Vg by connecting the ACS terminal 408 to the gate terminal 402, thereby conveying the accumulated charge from the body of the ACC NMOSFET, as described above.

In another exemplary embodiment, as described above, the ACC NMOSFET 300 comprises a depletion mode device. In this embodiment, the threshold voltage, $V_{th}$, is, by definition, less than zero. For Vs and Vd both at zero volts, when a gate bias Vg sufficiently negative to $V_{th}$ is applied to the gate terminal 402 (for example, Vg more negative than approximately −1 V relative to $V_{th}$), holes may accumulate under the gate oxide and thereby comprise an accumulated charge. For this example, the voltage $V_{ACS}$ may also be selected to be equal to Vg by connecting the ACS terminal 408 to the gate terminal 402, thereby conveying the accumulated charge from the ACC NMOSFET as described above.

In some embodiments of the improved ACC SOI NMSOFET 300, such as that described above with reference to FIG. 4B, when the FET is biased on, diodes formed at the edge of the device (such as described above with reference to the interface between the ACS 308 and the drain 304 (and the source 306) as shown in FIG. 3D) may become forward biased thereby allowing current to flow into the source and drain regions. In addition to wasting power, this may introduce nonlinearity into the NMSOFET. The nonlinearity results because the current that flows as a result of the forward biased interface diodes comprises nonlinear current. As Vgs and Vgd are reduced in that region of the device, the on resistance Ron at the edge of the device is increased. As is well known, and for the reasons set forth above, if the interface diodes formed at the edge of the device become forward biased, the device on-state characteristics are consequently dramatically adversely affected. Those skilled in the electronic device design arts shall understand that the configuration shown in FIG. 4B limits application of a gate bias voltage Vgs to approximately 0.7 Volts. The simplified circuit shown in FIG. 4C can be used to overcome these problems.

Figure 4C:
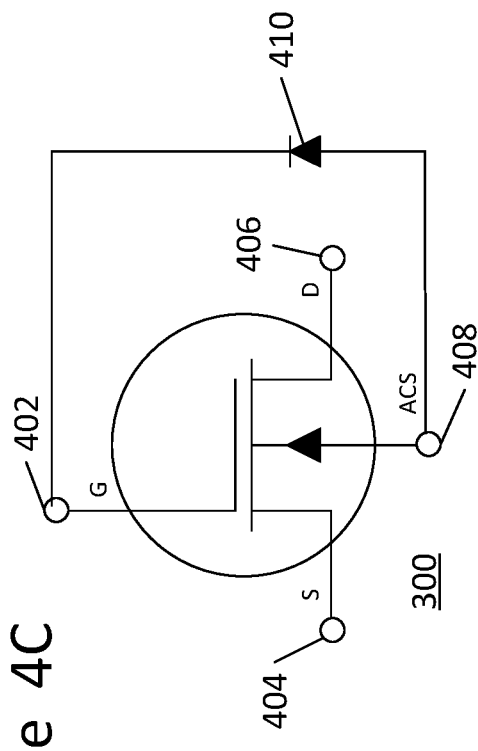
FIG. 4C is a simplified schematic of an improved SOI NMOSFET adapted to control accumulated charge, embodied as a four terminal device, wherein an accumulated charge sink (ACS) terminal is coupled to a gate terminal via a diode.
Figures 1, 4D:
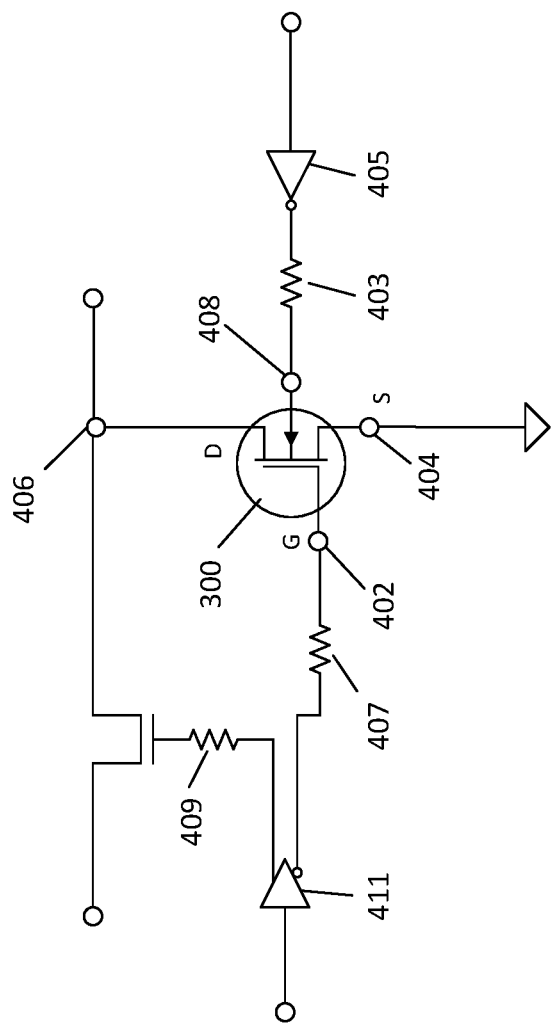

Another exemplary simplified circuit using the improved ACC SOI NMSOFET 300 is shown in FIG. 4C. As shown in FIG. 4C, in this embodiment, the ACS terminal 408 may be electrically coupled to a diode 410, and the diode 410 may, in turn, be coupled to the gate terminal 402. This embodiment may be used to prevent a positive current flow into the MOSFET body 312 caused by a positive Vg-to-Vs (or, equivalently, Vgs, where Vgs=Vg−Vs) bias voltage, as may occur, for example, when the SOI NMOSFET 300 is biased into an on-state condition.

As with the device shown in FIG. 4B, when biased off, the ACS terminal voltage VAS comprises the gate voltage plus a voltage drop across the diode 410. At very low ACS terminal current levels, the voltage drop across the diode 410 typically also is very low (e.g., <<100 mV, for example, for a typical threshold diode). The voltage drop across the diode 410 can be reduced to approximately zero by using other diodes, such as a 0Vf diode, for example. In one embodiment, reducing the voltage drop across the diode is achieved by increasing the diode 410 width. Additionally, maintaining the ACS-to-source or ACS-to-drain voltage (whichever bias voltage of the two bias voltages is lower) increasing negative, also improves the linearity of the ACC MOSFET device 300.

When the SOI NMOSFET 300 is biased in an on condition, the diode 410 is reverse-biased, thereby preventing the flow of positive current into the source and drain regions. The reverse-biased configuration reduces power consumption and improves linearity of the device. The circuit shown in FIG. 4C therefore works well to remove accumulated charge from the ACC MOSFET body when the FET is in the off-state and is operated in the accumulated charge regime. It also permits almost any positive voltage to be applied to the gate voltage Vg. This, in turn, allows the ACC MOSFET to effectively remove accumulated charge when the device operates in the off-state, yet assume the characteristics of a floating body device when the device operates in the on-state.

With the exception of the diode 410 used to prevent the flow of positive current into the ACS terminal 408, exemplary operation of the simplified circuit shown in FIG. 4C is the same as the operation of the circuit described above with reference to FIG. 4B.

In yet another embodiment, the ACS terminal 408 may be coupled to a control circuit 412 as illustrated in the simplified circuit of FIG. 4D. The control circuit 412 may provide a selectable ACS bias voltage $V_{ACS}$ that selectively controls the accumulated charge (i.e., the accumulated charge 120 described above with reference to FIG. 1). As shown in FIG. 4D, rather than having a local circuit provide the ACS bias voltage $V_{ACS}$ (e.g., as derived from the gate voltage Vg), in some embodiments the ACS bias voltage $V_{ACS}$ is produced by a separate source that is independent of the ACC MOSFET device 300. In the case of a switch (as described below in more detail with reference to FIG. 4D-1), the ACS bias voltage $V_{ACS}$ should be driven from a source having a high output impedance. For example, such a high output impedance source can be obtained using a large series resistor in order to ensure that the RF voltage is divided across the MOSFET and that the ACS bias voltage $V_{ACS}$ has Vds/2 "riding" on it, similarly to the gate voltage. This approach is described in more detail below with reference to FIG. 4D-1.

It may be desirable to provide a negative ACS bias voltage $V_{ACS}$ to the ACS terminal 408 when the SOI NMOSFET 300 is biased into an accumulated charge regime. In this exemplary embodiment, the control circuit 412 may prevent positive current flow into the ACS terminal 408 by selectively maintaining an ACS bias voltage $V_{ACS}$ that is consistently negative with respect to both the source and drain bias voltages. In particular, the control circuit 412 may be used to apply an ACS bias voltage that is equal to or more negative than the lesser of Vs and Vd. By application of such an ACS bias voltage, the accumulated charge is thereby removed or otherwise controlled.

In the exemplary embodiment of the simplified circuit shown in FIG. 4D, the source and drain bias voltages applied to the terminals 404 and 406, respectively, may be zero. If the gate bias voltage (Vg) applied to the gate terminal 402 is sufficiently negative with respect to the source and drain bias voltages applied to the terminals 404 and 406, and with respect to $V_{th}$, (for example, if Vin is approximately zero, and if Vg is more negative than approximately –1 V) the ACC NMOSFET 300 operates in the accumulated charge regime, and the accumulated charge (holes) may accumulate in the body of the ACC NMOSFET 300. Advantageously, the accumulated charge can be removed via the ACS terminal 408 by connecting the ACS terminal 408 to the control circuit 412 as shown. In order to ensure that the accumulated charge is conveyed from the body of the ACC NMOSFET 300, the ACS bias voltage $V_{ACS}$ that is applied to the ACS terminal 408 should be equal to or more negative than the gate voltage the lesser of Vs and Vd. Because the accumulated charge 120 is conveyed to the bias voltage $V_{ACS}$ applied to the ACS terminal 408 by the control circuit 412, the accumulated charge does not remain trapped under the gate oxide due to attraction to the gate bias voltage Vg.

In other embodiments, Vs and Vd may comprise bias voltages that are other than zero. According to these examples, Vg must be sufficiently negative to both Vs and Vd in order for Vg to be sufficiently negative to $V_{th}$, in order to bias the NMOSFET 300 in the off-state. This allows the accumulation of accumulated charge under the gate oxide. For this example, the ACS bias voltage $V_{ACS}$ may be selected to be equal to or more negative than the lesser of Vs and Vd by connecting the ACS terminal 408 to the control circuit 412 to provide selected ACS bias voltages, thereby conveying the accumulated charge from the ACC NMOSFET 300.

In other embodiments, if the ACC NMOSFET 300 of FIG. 4D comprises a depletion mode device, $V_{th}$ is, by definition, less than zero. For Vs and Vd both at zero volts, when a gate bias Vg sufficiently negative to $V_{th}$ is applied (for example, Vg more negative than approximately –1 V relative to $V_{th}$), holes may accumulate under the gate oxide. For this example, the ACS bias voltage $V_{ACS}$ that is applied to the ACS terminal 408 may also be selected to be equal to or more negative than the lesser of Vs and Vd by connecting the ACS terminal 408 to the control circuit 412 and thereby provide the desired ACS bias voltages $V_{ACS}$ that are necessary to remove the accumulated charge from the ACC NMOSFET 300.

As described above, in one embodiment, instead of having the control circuit 412 provide a bias to the ACS terminal 408 as shown in FIG. 4D, the ACS terminal 408 can be driven by a separate bias source circuit, as shown, for example, in the embodiment of FIG. 4D-1. In one exemplary circuit implementation, as exemplified in the circuit of FIG. 4D-1, in an RF switch circuit, the separate $V_{ACS}$ source has a high output impedance element 403 which ensures that the RF voltage is divided across the ACC NMOSFET 300, and which further ensures that the voltage applied to the ACS terminal 408 has Vds/2 applied thereon, similar to the voltage Vgs that is applied to the gate terminal 402. In one exemplary embodiment, an inverter 405 is configured in series with the high output impedance element 403 and supplied by GND and $-V_{DD}$. In one exemplary embodiment, $-V_{DD}$ is readily derived from a convenient positive voltage supply. It could, however, comprise an even more negative voltage for improved linearity (i.e., it can be independent of the gate voltage).

In another embodiment, the circuit shown in FIG. 4C can be modified to include a clamping circuit configured in series with an ACS terminal 408. Such an exemplary embodiment is shown in FIG. 4E. Under certain operating conditions, current that flows out of the ACC NMOSFET 300, conveying the accumulated charge from the body of the ACC NMOSFET 300, via the ACS terminal 408 is sufficiently high such that it causes problems in the biasing circuitry (i.e., under some conditions the ACS current is so high that the biasing circuitry cannot adequately sink the current flowing out of the body of the ACC NMOSFET 300). As shown in the circuit of FIG. 4E, one exemplary embodiment solves this problem by interrupting the flow of ACS current out of the body of the ACC NMOSFET 300, and thereby returning the ACC NMOSFET 300 to a floating body condition.

In one exemplary circuit, as shown in FIG. 4E, a depletion-mode FET 421 is configured in series between the ACS terminal 408 and a diode 410. In this exemplary circuit, the depletion-mode FET 421 includes a gate terminal that is electrically connected to the FET's source terminal. In this configuration, the depletion-mode FET 421 functions to clip or limit the current that flows from the ACS terminal 408 when the ACC MOSFET operates in the accumulated charge regime. More specifically, the depletion-mode FET 421 enters saturation upon reaching a predefined threshold. The current leaving the body of the ACC MOSFET is thereby limited by the saturation current of the FET 421. In some embodiments, the predefined saturation threshold may optionally be adjusted to change the point at which clamping occurs, such as by selecting a higher threshold voltage, which results in a lower maximum current and earlier clamping.

In some embodiments, such as for example in an RF switch circuit, the gate terminal 402 and the ACS terminal 408 follow Vds at half the value (Vds/2) of Vds. At high Vds excursions, Vgs may approach the threshold voltage $V_{th}$, resulting in increased Ids leakage current. In some cases, such a leakage current exits the ACS terminal 408 and can overwhelm associated circuitry (e.g., a negative voltage generator). Hence, the circuit shown in FIG. 4E solves or otherwise mitigates these problems. More specifically, by coupling the FET 421 in series between the ACS terminal 408 and the diode 410, the current that exits the ACS terminal 408 is limited to the saturation current of the FET 421.

In yet another exemplary embodiment, the simplified circuit shown in FIG. 4C can be modified to include an AC shorting capacitor placed in parallel with the diode 410. The simplified circuit of FIG. 4F can be used to compensate for certain undesirable nonlinearities present in a full circuit application. In some embodiments, due to parasitics present in the MOSFET layout, nonlinearity characteristics existing in the diode 410 of FIG. 4C may introduce undesirable nonlinearities in a full circuit implementation. As the diode is in place to provide DC bias conditions and is not intended to have any AC signals across it, it may be desirable in some embodiments to take steps to mitigate the effects of any AC signal present across the diode 410.

Figure 4F:
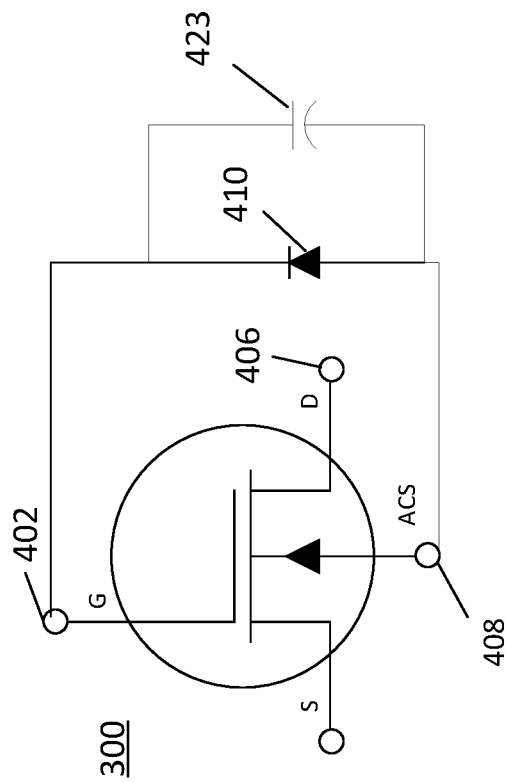
FIG. 4F is a simplified schematic of an improved SOI NMOSFET adapted to control accumulated charge, embodied as a four terminal device, wherein an accumulated charge sink (ACS) terminal is coupled to a gate terminal via a diode in parallel with a capacitor.
Figure 4E:
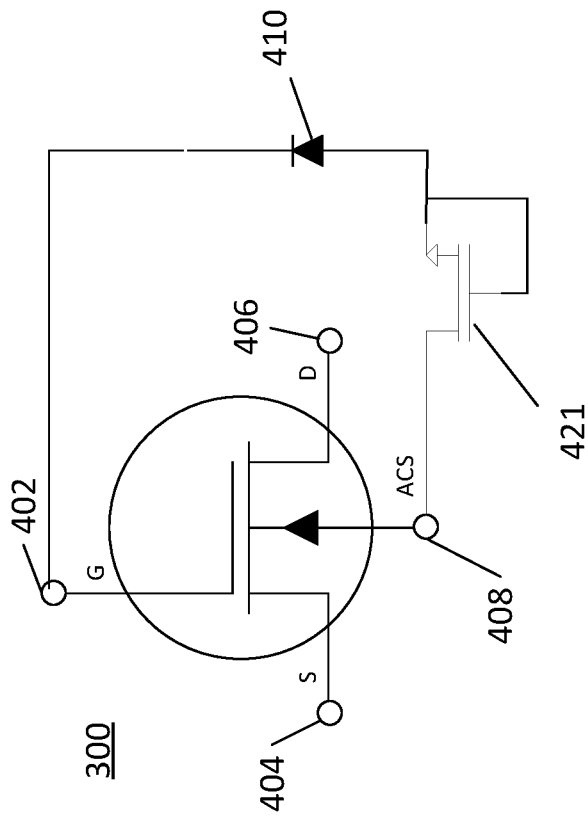
FIG. 4E is a simplified schematic of an improved SOI NMOSFET adapted to control accumulated charge, embodied as a four terminal device, wherein an accumulated charge sink (ACS) terminal is coupled to a clamping circuit.

As shown in the simplified circuit of FIG. 4F, the circuit of FIG. 4C has been modified to include an AC shorting capacitor 423 wherein the AC shorting capacitor 423 is configured in parallel across the diode 410. The AC shorting capacitor 423 is placed in parallel with the diode 410 to ensure that nonlinearities of the diode 410 are not excited by an AC signal. In some exemplary circuits, such as in an RF switch, the AC shorting capacitor 423 does not impact the higher level full circuit, as the gate terminal 402 and the ACS terminal 408 typically have the same AC signal applied (i.e., AC equipotential).

In some circuit embodiments, body nodes of a multi-finger FET implementation may be connected to one another (using, for example, metal or silicon), overlapping the source fingers. On another side of the FET implementation, gate nodes may be are connected to one another (using, for example, metal or silicon) overlapping the drain fingers. As a result of this FET implementation, additional capacitance may result between the source and body (S-B), and further additional capacitance may result between the drain and gate (D-G). These additional capacitances may degrade the symmetry of the intrinsic device. Under AC excitation, this results in the gate terminal following the drain terminal more closely, and the body terminal following the source terminal more closely, which effectively creates an AC signal across the diode 410, which can excite nonlinearities of the diode 410 as described above. Using the exemplary embodiment shown in FIG. 4F, parasitic nonlinear excitation due to the overlapping fingers is mitigated.

Figure 4G:
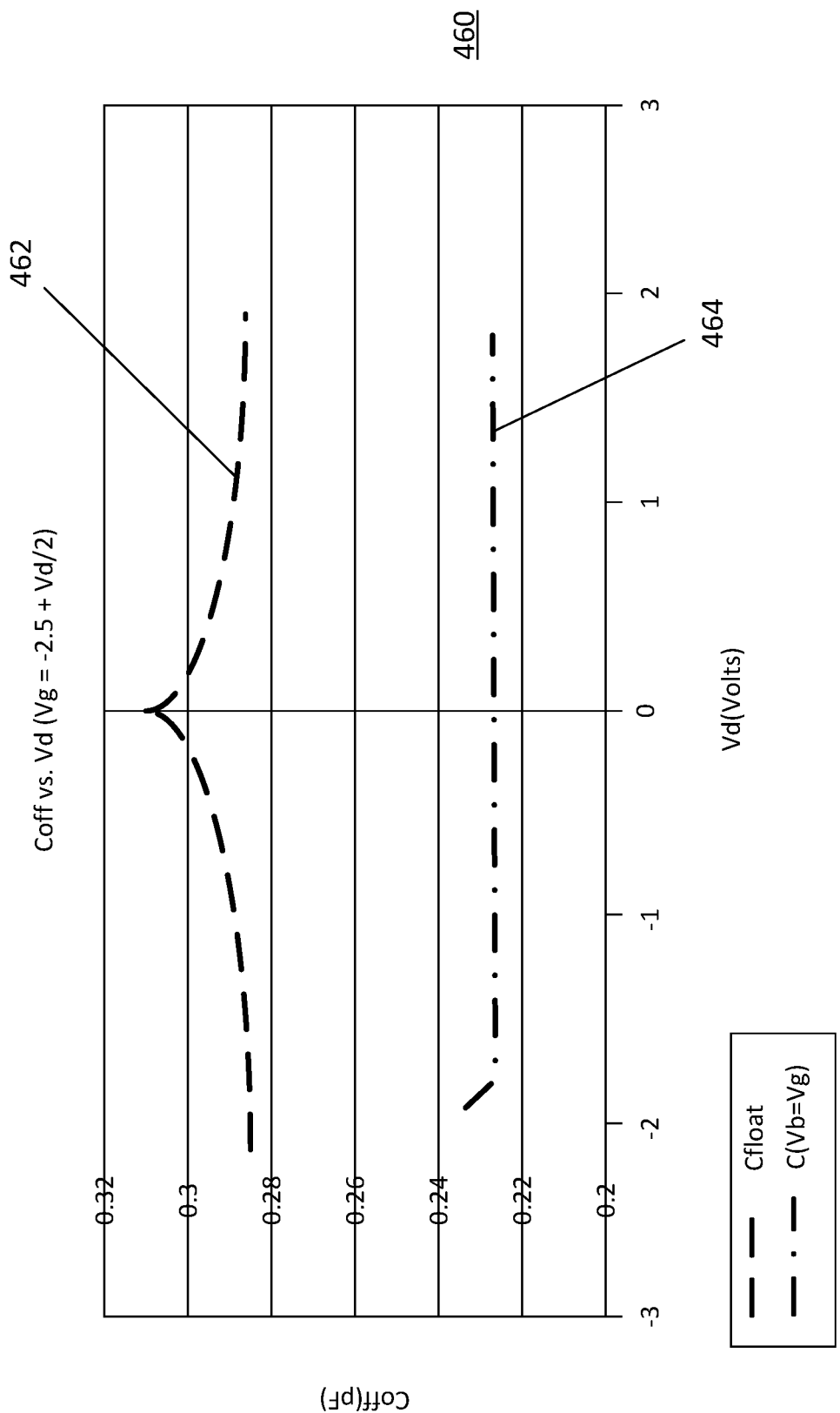
FIG. 4G shows plots of the off-state capacitance ($C_{off}$) versus applied drain-to-source voltages for SOI MOSFETs operated in the accumulated charge regime, wherein a first plot shows the off-state capacitance $C_{off}$ of a prior art SOI MOSFET, and wherein a second plot shows the off-state capacitance $C_{off}$ of the improved ACC SOI MOSFET made in accordance with the present teachings.

Improved $C_{off}$ Performance Characteristics of ACC MOSFETs made in Accordance with the Present Disclosed Method and Apparatus FIG. 4G is a plot 460 of the off-state capacitance ($C_{off}$) versus an applied drain-to-source voltage of an SOI MOSFET when an AC signal is applied to the MOSFET. In one embodiment, a gate voltage equals −2.5 Volts+Vd/2, and Vs equals 0. A first plot 462 shows the off-state capacitance $C_{off}$ of a typical prior art NMOSFET operating within the accumulated charge regime and thereby having an accumulated charge as described above with reference to FIG. 1. As shown in FIG. 4G, the off-state capacitance $C_{off}$ shown in plot 462 of the prior art FET is voltage-dependent (i.e., it is nonlinear) and peaks when Vd=0 Volts. A second plot 464 illustrates the off-state capacitance $C_{off}$ of an improved ACC SOI MOSFET made in accordance with the present teachings, wherein the accumulated charge is conveyed from the ACC MOSFET, thereby reducing, controlling and/or eliminating the accumulated charge from the ACC MOSFET body. As shown in FIG. 4G, the off-state capacitance $C_{off}$ shown in plot 464 of the ACC SOI MOSFET is not voltage-dependent (i.e., it is linear).

As described above with reference to FIG. 2A, by controlling, reducing or eliminating the accumulated charge, the impedance 212 of the NMOSFET body 312 (FIG. 3C, and shown as the MOSFET body 114 in the electrical model of FIG. 2A) is increased to a very large value. This increase in the impedance 212 of the MOSFET body reduces the contribution to $C_{off}$ caused by the impedance of the junctions 218 and 220 (FIG. 2A), thereby reducing the overall magnitude of $C_{off}$ and the nonlinear effects associated with the impedances of the junctions 218 and 220. Plot 464 illustrates how the present teachings advantageously reduce both the nonlinearity and overall magnitude of the off-state capacitance $C_{off}$ of the MOSFET. The reduced nonlinearity and magnitude of the off-state capacitance $C_{off}$ improves the performance of circuits using MOSFETs operating in an accumulated charge regime, such as RF switching circuits. Exemplary RF switching circuits implemented with the ACC MOSFETs described above with reference to FIGS. 4A-4F are now described with reference to FIGS. 5A-5D.

Figure 5A:
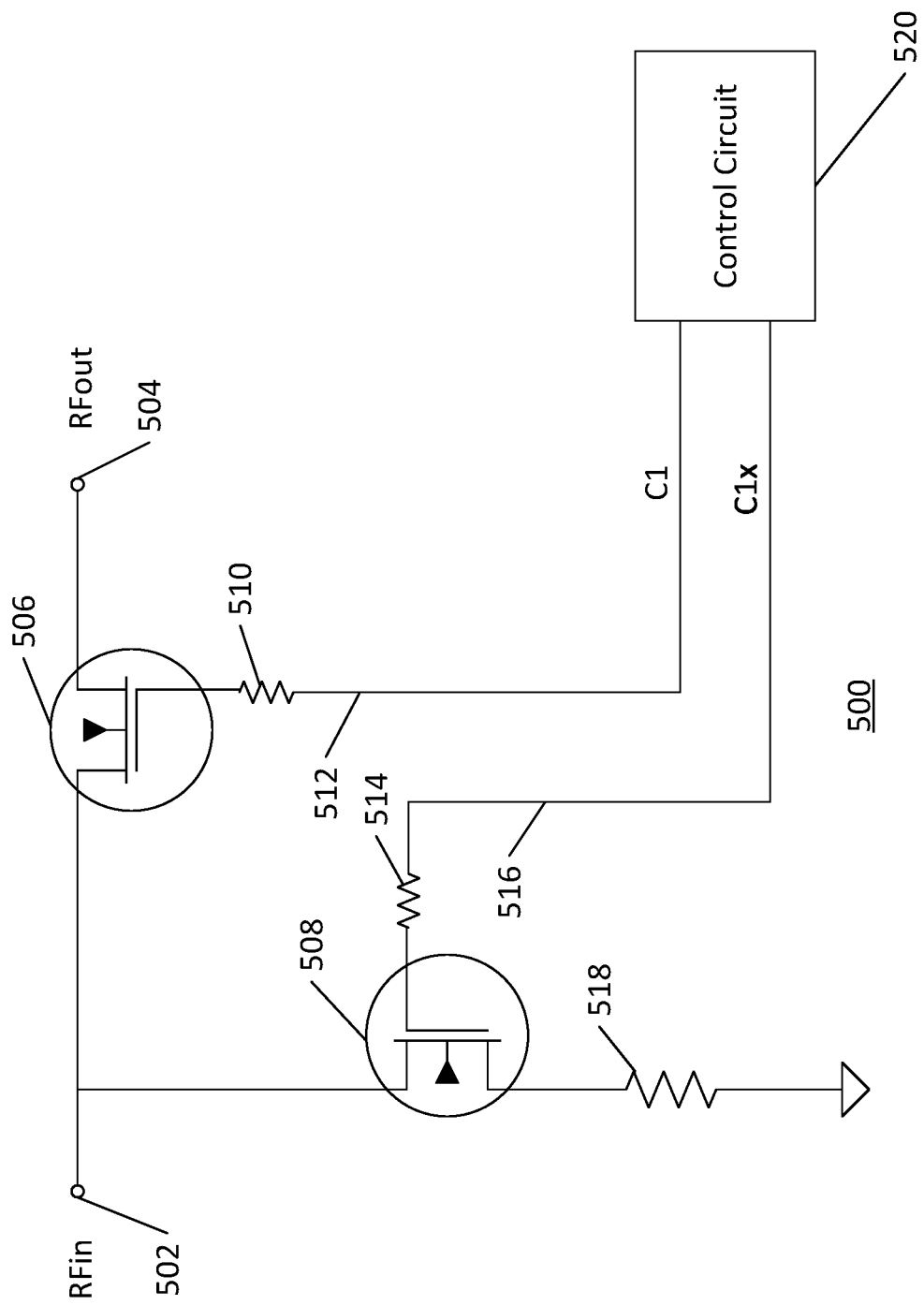
FIG. 5A is a schematic of an exemplary single pole, single throw (SPST) radio frequency (RF) switch circuit.

Exemplary Improved Performance RF Switch Implementations using ACC SOI MOSFETs in Accordance with the Present Teachings FIG. 5A shows a schematic diagram of a single pole, single throw (SPST) RF switch circuit 500. The RF switch circuit 500 is one example of a general class of well-known RF switch circuits. Similar RF switch circuits are described in the following co-pending and commonly assigned U. S. Applications and Patent: Provisional Application No. 60/651,736, filed Feb. 9, 2005, entitled "UNPOWERED SWITCH AND BLEEDER CIRCUIT;" application Ser. No. 10/922,135, filed Aug. 18, 2004, pending, which is a continuation application of application Ser. No. 10/267,531, filed Oct. 8, 2002, which issued Oct. 12, 2004 as U.S. Pat. No. 6,804,502, entitled "SWITCH CIRCUIT AND METHOD OF SWITCHING RADIO FREQUENCY SIGNALS". Application Ser. No. 10/267,531, filed Oct. 8, 2002, which issued Oct. 12, 2004 as U.S. Pat. No. 6,804,502 claims the benefit of U.S. Provisional Application No. 60/328,353, filed Oct. 10, 2001. All of the above-cited patent applications and issued patent set forth above are hereby incorporated by reference herein as if set forth in full for their teachings on RF switch circuits including SOI MOS-FET switch circuits.

Referring again to FIG. 5A, an SOI NMOSFET 506 is adapted to receive an RF input signal "RFin" at an input terminal 502. The SOI MOSFET 506 is electrically coupled to selectively couple the RFin input signal to an output terminal 504 (i.e., thereby convey an RF output signal Rfout at the output terminal 504). In the exemplary embodiment, the SOI NMOSFET 506 is controlled by a first control signal C1 that is conveyed by a control line 512 through a gate resistor 510 (optionally included for suppression of parasitic RF coupling). The control line 512 is electrically coupled to a control circuit 520, which generates the first control signal C1.

Referring again to FIG. 5A, an SOI NMOSFET 508 is adapted to receive the RF input signal RFin at its drain terminal, and to selectively shunt the input signal RFin to ground via an optional load resistor 518. The SOI NMOS-FET 508 is controlled by a second control signal C1x which is conveyed by a control line 516 through a gate resistor 514 (optionally included for suppression of parasitic RF coupling and for purposes of voltage division). The control line 516 is electrically coupled to the control circuit 520, which generates the second control signal C1x.

The first and second control signals, C1 and C1x, respectively, are generated so that the SOI NMOSFET 506 operates in an on-state when the SOI NMOSFET 508 operates in an off-state, and vice versa. These control signals provide the gate bias voltages Vg to the gate terminals of the NMOS-FETs 506 and 508. When either of the NMOSFETs 506 or 508 is biased to select the transistor off-state, the respective Vg must comprise a sufficiently large negative voltage so that the respective NMOSFET does not enter, or approach, an on-state due to the time varying applied voltages of the RF input signal RFin. The maximum power of the RF input signal RFin is thereby limited by the maximum magnitude of the gate bias voltage Vg (or, more generally, the gate-to-source operating voltage, Vgs) that the SOI NMOSFETs 506 and 508 can reliably sustain. For RF switching circuits such as those exemplified herein, Vgs(max)=Vg+Vds(max)/2, where Vds=Vd −Vs, and Vds(max) comprises the maximum Vds due to the high-power input signal voltage levels associated with the RF input signal RFin.

Exemplary bias voltages for the SOI NMOSFETs 506 and 508 may include the following: with $V_{th}$ approximately zero volts, Vg, for the on-state, of +2.5 V, and Vg, for the off-state, of −2.5 V. For these bias voltages, the SOI NMOS-FETs may eventually operate in an accumulated charge regime when placed into their off-states. In particular, and as described above with reference to FIG. 2B, when the NMOSFET 506 is in the on-state, and the NMOSFET 508 is biased in the off-state, the output signal RFout may become distorted by the nonlinear behavior of the off capacitance $C_{off}$ of the NMOSFET 508 caused by the accumulated charge. Advantageously, the improved ACC MOS-FETs made in accordance with the present teachings can be used to improve circuit performance, especially as it is adversely affected by the accumulated charge.

Figure 5B:
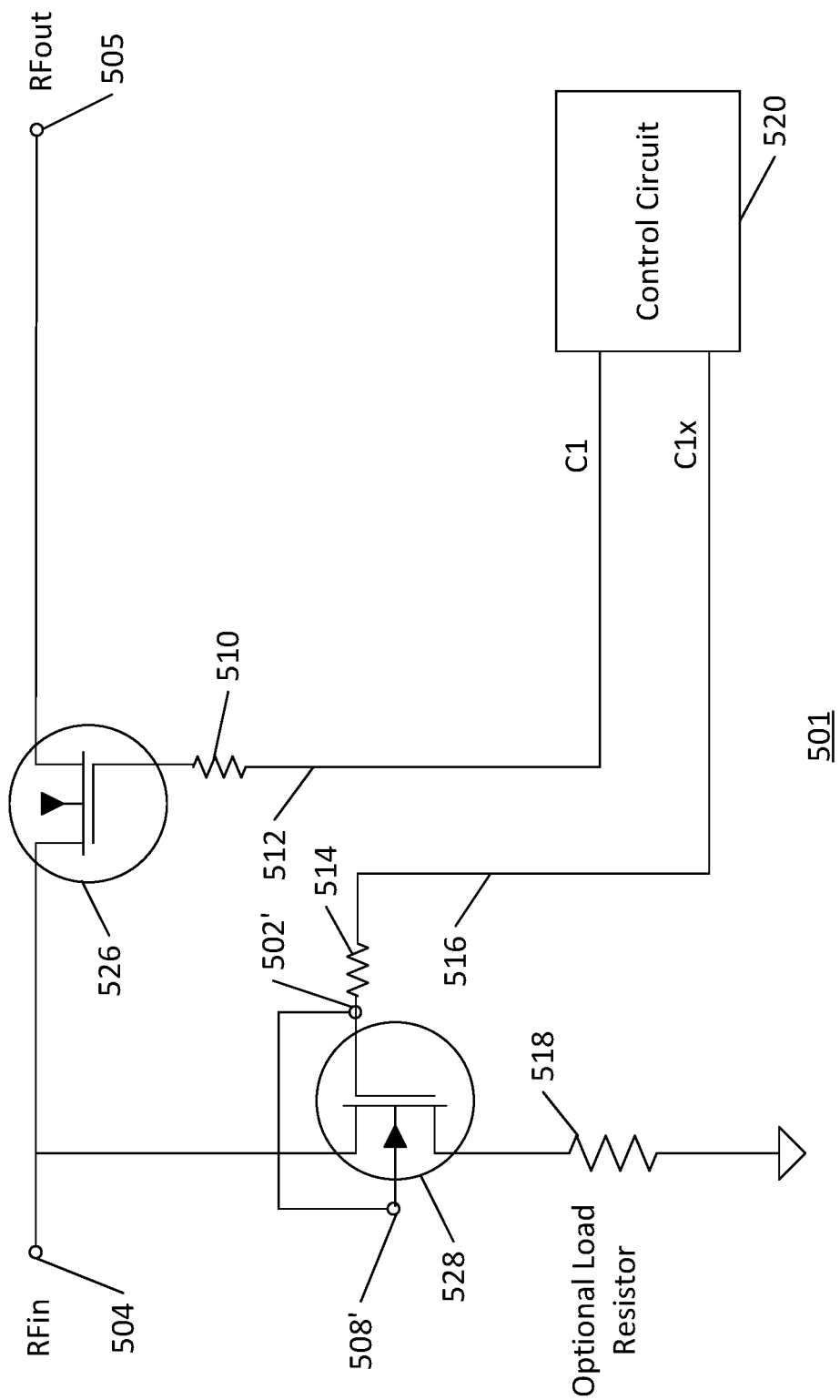
FIG. 5B is a schematic of an RF switch circuit adapted for improved performance using accumulated charge control, wherein the gate of a shunting SOI NMOSFET is coupled to an accumulated charge sink (ACS) terminal.

FIG. 5B is a schematic of an improved RF circuit 501 adapted for higher performance using the present accumulated charge reduction and control techniques. The switch circuit 501 differs from the prior art circuit 500 (FIG. 5A) in that the NMOSFET 508 is replaced by an ACC NMOSFET 528 made in accordance with the present teachings. The ACC NMOSFET 528 is analogous to the ACC NMOSFET described above with reference to FIGS. 4A and 4B. Similarly, the gate, source, drain and ACC terminals of the ACC NMOSFET 528 are analogous to the respective terminals of the ACC NMOSFET 300. With the exception of the improved switch performance afforded by the improved ACC NMOSFET 528, the operation of the RF switch circuit 501 is very similar to the operation of the RF switch circuit 500 described above with reference to FIG. 5A.

Exemplary bias voltages for the NMOSFET 526 and the ACC NMOSFET 528 may include: with $V_{th}$ approximately zero, Vg, for the on-state, of +2.5 V, and Vg, for the off-state, of −2.5 V. For these bias voltages, the SOI NMOSFETs may operate in an accumulated charge regime when placed into the off-state. However, when the NMOSFET 526 is in the on-state and the ACC NMOSFET 528 is in the off-state, the output signal RFout at the output terminal 505 will not be distorted by nonlinear behavior of the off-state capacitance $C_{off}$ of the improved ACC NMOSFET 528 due to the accumulated charge. When the ACC NMOSFET 528 operates in the accumulated charge regime, the accumulated charge is removed via the ACS terminal 508'. More specifically, because the gate terminal 502' of the ACC NMOSFET 528 is connected to the ACS terminal 508', the accumulated charge is removed or otherwise controlled as described above in reference to the simplified circuit of FIG. 4B. The control of the accumulated charge improves performance of the switch 501 by improving the linearity of the off transistor, 528, and thereby reducing the harmonic and intermodulation distortion of the RF output signal Rfout generated at the output terminal 505.

Figure 5C:
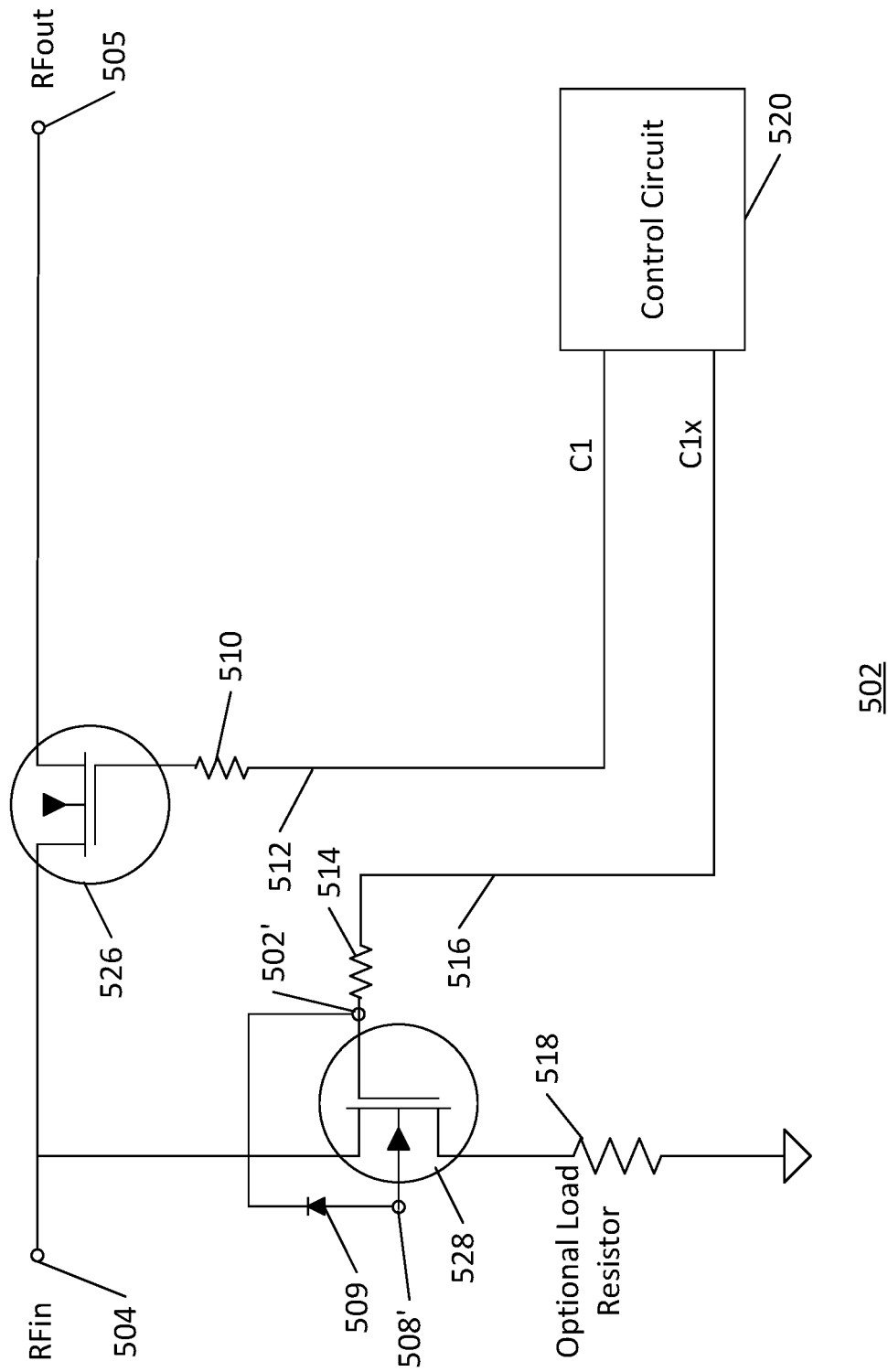
FIG. 5C is a schematic of an RF switch circuit adapted for improved performance using accumulated charge control, wherein the gate of a shunting SOI NMOSFET is coupled to an accumulated charge sink (ACS) terminal via a diode.

FIG. 5C is a schematic of another embodiment of an improved RF switch circuit 502 adapted for higher performance using the accumulated charge control techniques of the present disclosure. The switch circuit 502 differs from the prior art circuit 500 (FIG. 5A) in that the NMOSFET 508 is replaced by an ACC NMOSFET 528 made in accordance with the present teachings. The ACC NMOSFET 528 is analogous to the ACC NMOSFET 300 described above with reference to FIGS. 4A and 4C. Similarly, the gate, source, drain and ACC terminals of the ACC NMOSFET 528 are analogous to the respective terminals of the ACC NMOS-FETs 300 described above with reference to FIGS. 4A and 4C. With the exception of the improved switch performance afforded by the improved ACC NMOSFET 528, the operation of the switch circuit 502 is very similar to the operations of the switch circuits 500 and 501 described above with reference to FIGS. 5A and 5B, respectively.

Exemplary bias voltages for the NMOSFET 526 and the ACC NMOSFET 528 may include the following: with $V_{th}$ approximately zero volts, Vg, for the on-state, of +2.5 V, and Vg, for the off-state, of −2.5 V. For these bias voltages, the SOI NMOSFETs 526, 528 may operate in an accumulated charge regime when placed into an off-state. However, when the NMOSFET 526 is in the on-state and the ACC NMOS-FET 528 is in the off-state, the output signal RFout will not be distorted by nonlinear behavior of the off-state capacitance $C_{off}$ of the ACC NMOSFET 528 due to the accumulated charge. Because the gate terminal 502' of the ACC NMOSFET 528 is connected to the ACS terminal 508' via a diode 509, the accumulated charge is entirely removed, reduced or otherwise controlled, as described above with reference to FIG. 4C. Similar to the improved switch 501 described above with reference to FIG. 5B, control of the accumulated charge improves performance of the switch 502 by improving the linearity of the off transistor, 528, and thereby reducing the harmonic and intermodulation distortion of the RF output signal Rfout output of the RF output terminal 505. Connection of the diode 509 as shown may be desired in some embodiments for suppression of positive current flow into the ACC NMOSFET 528 when it is biased into an on-state, as described above with reference to FIG. 4C.

Figure 5D:
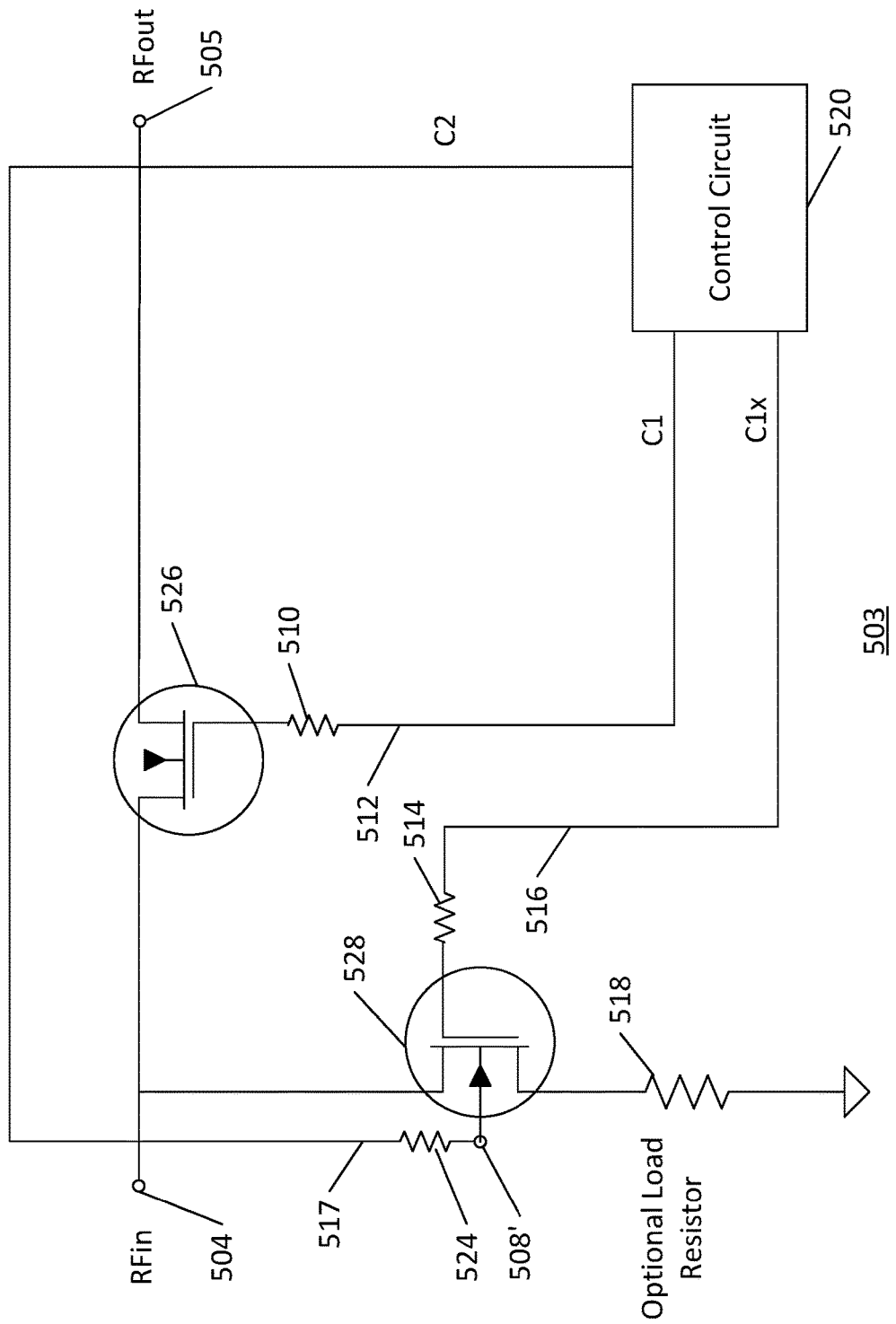
FIG. 5D is a schematic of an RF switch circuit adapted for improved performance using accumulated charge control, wherein the accumulated charge sink (ACS) terminal is coupled to a control circuit.

FIG. 5D is a schematic of another embodiment of an improved RF switch circuit 503 adapted for higher performance using the present accumulated charge control techniques. The switch circuit 503 differs from the prior art circuit 500 (FIG. 5A) in that the NMOSFET 508 of FIG. 5A is replaced by an ACC NMOSFET 528 made in accordance with the present teachings. The ACC NMOSFET 528 is analogous to the ACC NMOSFET described above with reference to FIGS. 4A and 4D. With the exception of the improved switch performance afforded by the improved ACC NMOSFET 528, the operation of the switch circuit 503 is very similar to the operations of the switch circuits 500, 501 and 502 described above with reference to FIGS. 5A-5C, respectively.

Exemplary bias voltages for the NMOSFET 526 and the ACC NMOSFET 528 may include the following: with $V_{th}$ approximately zero volts, Vg, for the on-state, of +2.5 V, and Vg, for the off-state, of −2.5 V. For these bias voltages, the SOI NMOSFETs 526, 528 may operate in an accumulated charge regime when placed into the off-state. However, when the NMOSFET 526 is in the on-state and the ACC NMOSFET 528 is in the off-state, the output signal RFout produced at the output terminal 505 will not be distorted by the nonlinear behavior of the off-state capacitance $C_{off}$ of the ACC NMOSFET 528 due to the accumulated charge. When the NMOSFET 528 operates in the accumulated charge regime, the accumulated charge is removed via the ACS terminal 508'. More specifically, because the ACS terminal 508' of the ACC NMOSFET 528 is electrically coupled to the control circuit 520 via the control line 517 (i.e., controlled by the control signal "C2" as shown), the accumulated charge can be eliminated, reduced or otherwise controlled by applying selected bias voltages to the ACS terminal 508' as described above with reference to FIG. 4D. Those skilled in the arts of electronic circuit design shall understand that a wide variety of bias voltage signals can be applied to the ACS terminal for the purpose of reducing or otherwise controlling the accumulated charge. The specific bias voltages may be adapted for use in a particular application. The control of the accumulated charge improves performance of the switch 503 by improving the linearity of the off-state transistor, 528, and thereby reducing the harmonic and intermodulation distortion of the RF output signal Rfout generated at the output terminal 505.

In the circuits described above with respect to FIGS. 5B-5D, the switching SOI MOSFETs 526 are shown and described as implemented using SOI MOSFETs of the prior art (i.e., they do not comprise ACC MOSFETs and therefore do not have an ACS terminal). Those skilled in the electronic device design arts shall understand and appreciate that in other embodiments of the disclosed method and apparatus, the prior art switching SOI MOSFETs 526 may be replaced, as required, by ACC SOI MOSFETs made in accordance with the present disclosure. For example, in some embodiments of RF switches implemented using the ACC MOSFET of the present disclosure, the RF switch comprises a single-pole double-throw RF switch. In this embodiment, the switching SOI MOSFETs (e.g., analogous to the switching ACC SOI MOSFETs 526 described above with reference to FIGS. 5B-5D) may comprise ACC SOI MOSFETs. Such an implementation prevents nonlinear behavior of the off-state switching SOI MOSFETs (which is turned off when it is not selected as an input "pole") from detrimentally affecting the output of the RF signal as switched through the selected "pole". This implementation is described in more detail below with reference to the RF switch circuit shown in FIG. 9. Many other examples will be apparent to those skilled in the arts of electronic circuits.

Exemplary RF Switch Implementation Using Stacked Transistors

In the exemplary embodiments of RF switch circuits described above, the switch circuits are implemented using a single SOI NMOSFET (e.g., the single SOI NMOSFET 506 of FIG. 5A, and the single SOI NMOSFET 526 of FIGS. 5B-5D) that selectively couples or blocks (i.e., electrically opens the circuit connection) the RF input signal to the RF output. Similarly, in the exemplary embodiments described above with reference to FIGS. 5A-5D, a single SOI NMOSFET (e.g., the single SOI NMOSFET 508 of FIG. 5A, and ACC SOI NMOSFET 528 of FIGS. 5B-5D) is used to shunt (FET in the on-state) or block (FET in the off-state) the RF input signal to ground. Commonly assigned U.S. Pat. No. 6,804,502, entitled "SWITCH CIRCUIT AND METHOD OF SWITCHING RADIO FREQUENCY SIGNALS", issued Oct. 12, 2004, describes RF switch circuits using SOI NMOSFETs implemented with stacked transistor groupings that selectively couple and block RF signals.

Figure 6:
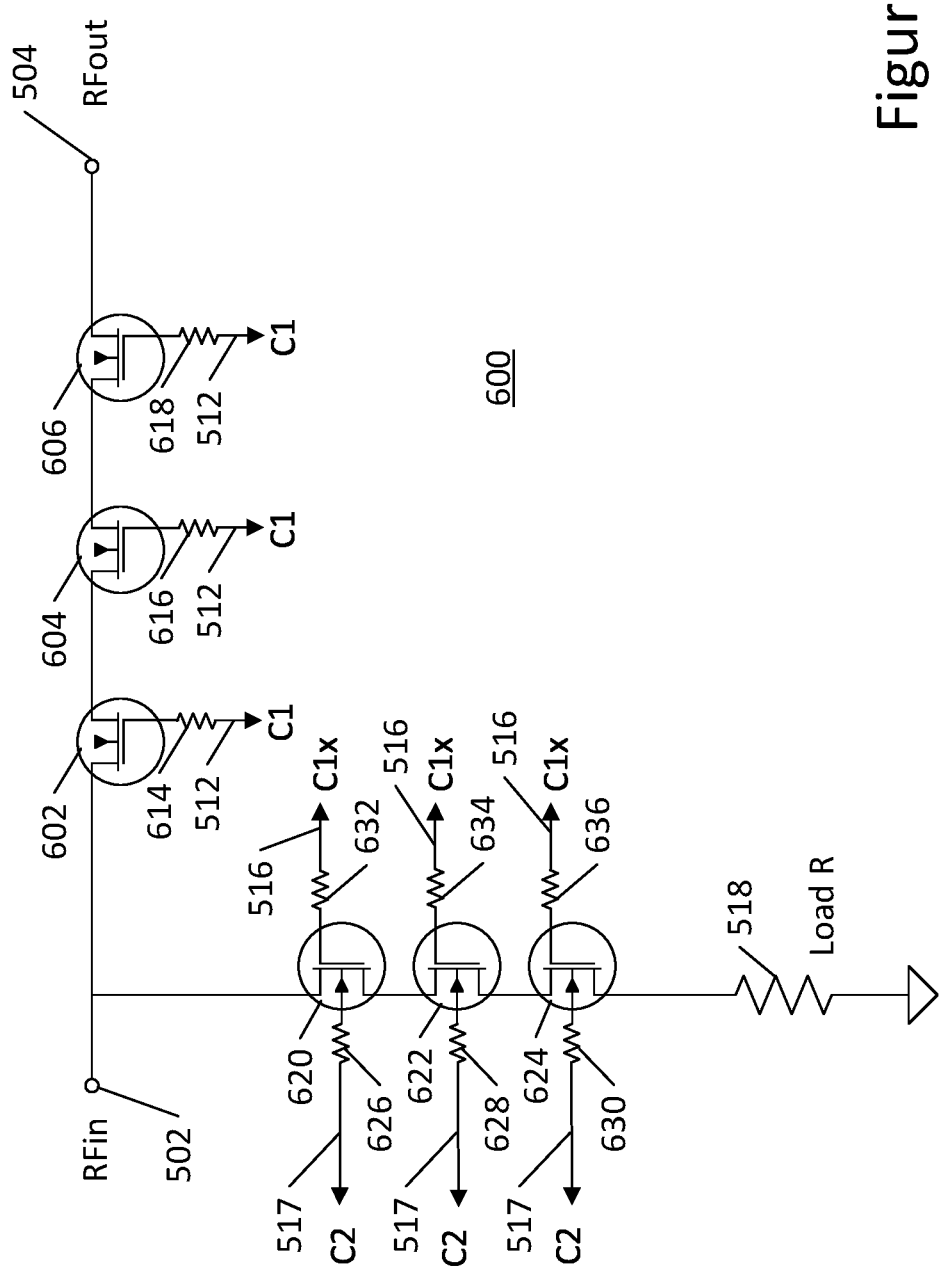
FIG. 6 is a schematic of an RF switch circuit including stacked MOSFETs, adapted for improved performance using accumulated charge control, wherein the accumulated charge sink (ACS) terminals of the shunting stacked MOSFETs are coupled to a control signal.

One example of how stacked NMOSFETs may be implemented in accordance with the teachings of the present disclosure is illustrated in FIG. 6. An RF switch circuit 600 is analogous to the RF switch circuit 503 of FIG. 5D, wherein the single SOI NMOSFET 526 is replaced by a stack of SOI NMOSFETs 602, 604 and 606. Similarly, the single ACC SOI NMOSFET 528 is replaced by a stack of ACC SOI NMOSFETs 620, 622 and 624. The control signal C2 is provided to the ACS terminals of the ACC SOI NMOSFETs 620, 622 and 624 via optional resistors 626, 628, and 630, respectively. The resistors 626, 628, and 630 may optionally be included in order to suppress parasitic RF signals between the stacked ACC SOI NMOSFETs 620, 622, and 624, respectively. The RF switch circuit 600 operates analogously to the operation of the RF switch circuit 503 described above with reference to FIG. 5D.

Three stacked ACC SOI NMOSFETs are shown in each ACC NMOSFET stack in the exemplary stacked RF switch circuit 600 of FIG. 6. A plurality of three ACC NMOSFETs is shown for illustrative purposes only, however, those skilled in the integrated circuit design arts will understand that an arbitrary plurality may be employed according to particular circuit requirements such as power handling performance, switching speed, etc. A smaller or larger plurality of stacked ACC NMOSFETs may be included in a stack to achieve a desired operating performance.

Other stacked RF switch circuits, adapted for accumulated charge control, analogous to the circuits described above with reference to FIGS. 5B-5D, may also be employed. Implementations of such circuits shall be obvious from the teachings above to those skilled in the electronic device design arts, and therefore are not described further herein.

Exemplary Method of Operation

Figure 7:
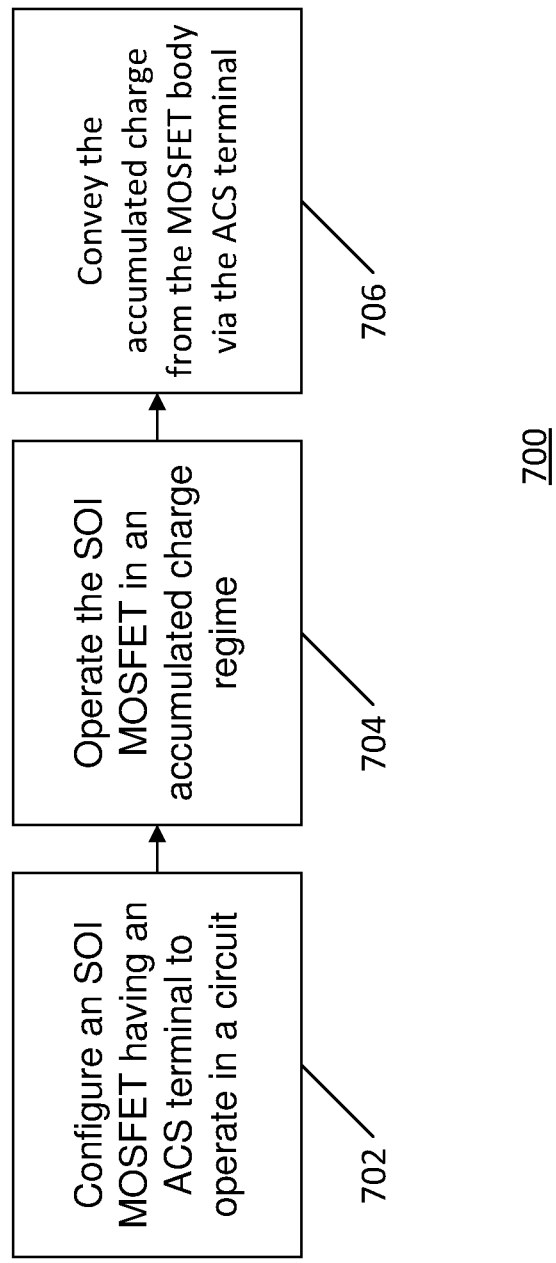
FIG. 7 shows a flowchart of an exemplary method of improving the linearity of an SOI MOSFET device using an accumulated charge sink in accordance with the present disclosure.

FIG. 7 illustrates an exemplary method 700 of improving the linearity of an SOI MOSFET having an accumulated charge sink (ACS) in accordance with the present disclosure. The method 700 begins at a STEP 702, whereat an ACC SOI MOSFET having an ACS terminal is configured to operate in a circuit. The ACS terminal may be operatively coupled to the gate of the SOI MOSFET (as described above with reference to FIGS. 4B, 4C, 5B and 5C), or to a control circuit (as described above with reference to FIGS. 4D and 5D). In other embodiments, the ACS terminal may be operatively coupled to any convenient accumulated charge sinking mechanism, circuit, or device as is convenient to the circuit or system designer. The method then proceeds to a step 704.

At the STEP 704, the ACC SOI MOSFET is controlled, at least part of the time, so that it operates in an accumulated charge regime. In most embodiments, as described above, the ACC MOSFET is operated in the accumulated charge regime by applying bias voltages that place the FET in an off-state condition. In one exemplary embodiment, the ACC SOI MOSFET comprises an ACC SOI NMOSFET that is configured as part of a shunting circuit of an RF switch. According to this exemplary embodiment, the SOI NMOSFET may be operated in an accumulated charge regime after the shunting circuit is placed into an off-state by applying a negative bias voltage to the gate terminal of the ACC NMOSFET.

The method then proceeds to a STEP 706, whereat the accumulated charge that has accumulated in the channel region of the ACC MOSFET is removed or otherwise controlled via the ACS terminal. In this embodiment, the accumulated charge is conveyed to another circuit terminal and is thereby reduced or otherwise controlled. One such exemplary circuit terminal that can be used to convey the accumulated charge from the MOSFET body comprises a gate terminal of the ACC MOSFET (see, e.g., the description above with reference to FIGS. 4B, 4C, 5B and 5C). Another exemplary circuit terminal that can be used to remove or otherwise control the accumulated charge comprises the terminal of a control circuit (see, e.g., FIGS. 4D and 5D). As described in more detail above, removing or otherwise controlling the accumulated charge in the ACC MOSFET body improves the linearity of the off-state ACC MOSFET, which reduces the harmonic distortion and IMD of signals affected by the ACC MOSFET, and which, in turn, improves circuit and system performance. In RF switch circuits, improvements (in both linearity and magnitude) are made to the off capacitance of shunting ACC MOSFET devices, which, in turn, improves the performance of the RF switch circuits. In addition to other switch performance characteristics, the harmonic and intermodulation distortions of the RF switch are reduced using the ACC method and apparatus of the present teachings.

Figure 8:
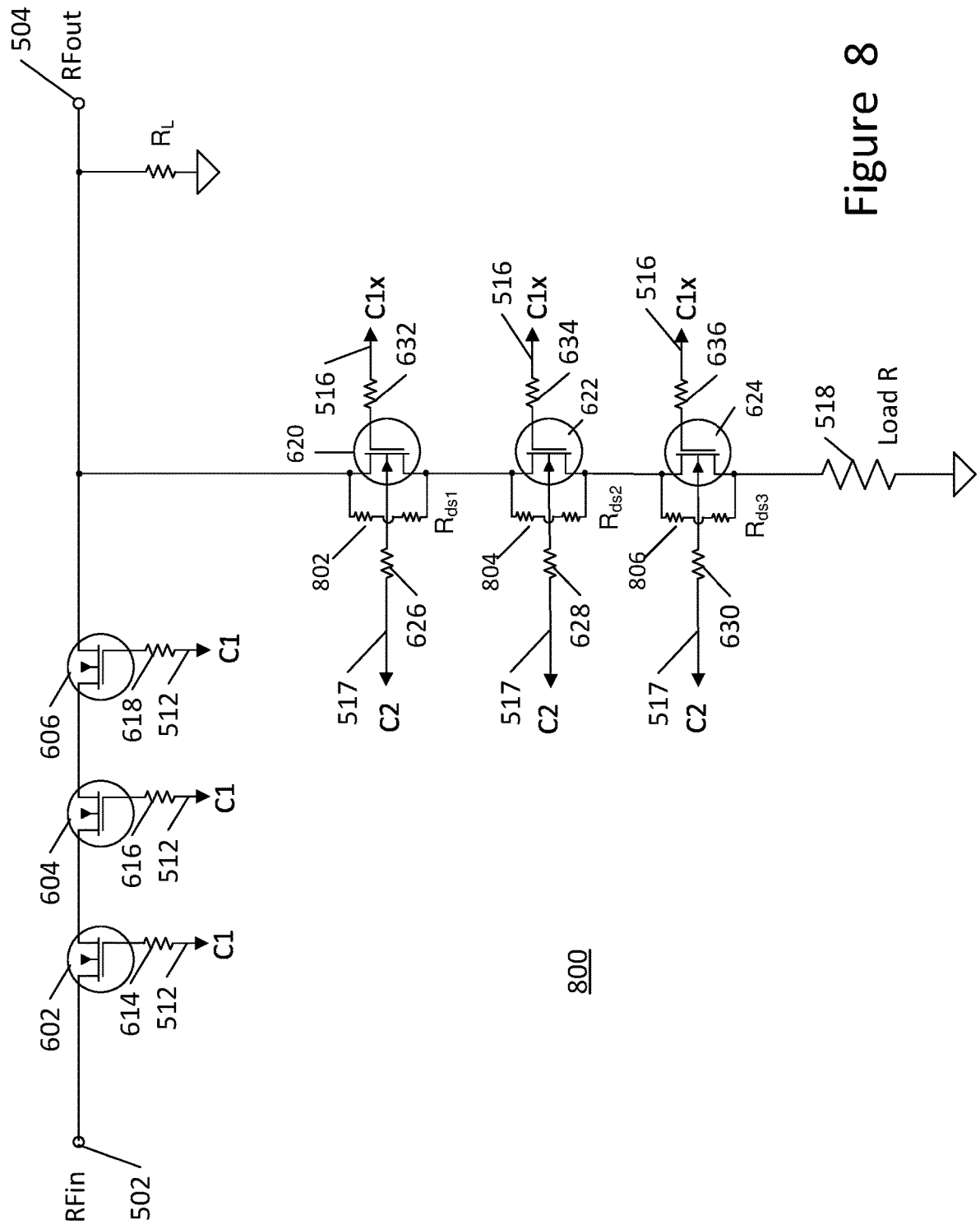
FIG. 8 shows a simplified circuit schematic of an exemplary embodiment of an RF switch circuit made in accordance with the present disclosure, wherein the RF switch circuit includes drain-to-source resistors between the drain and source of the ACC MOSFETs.
Figure 9:
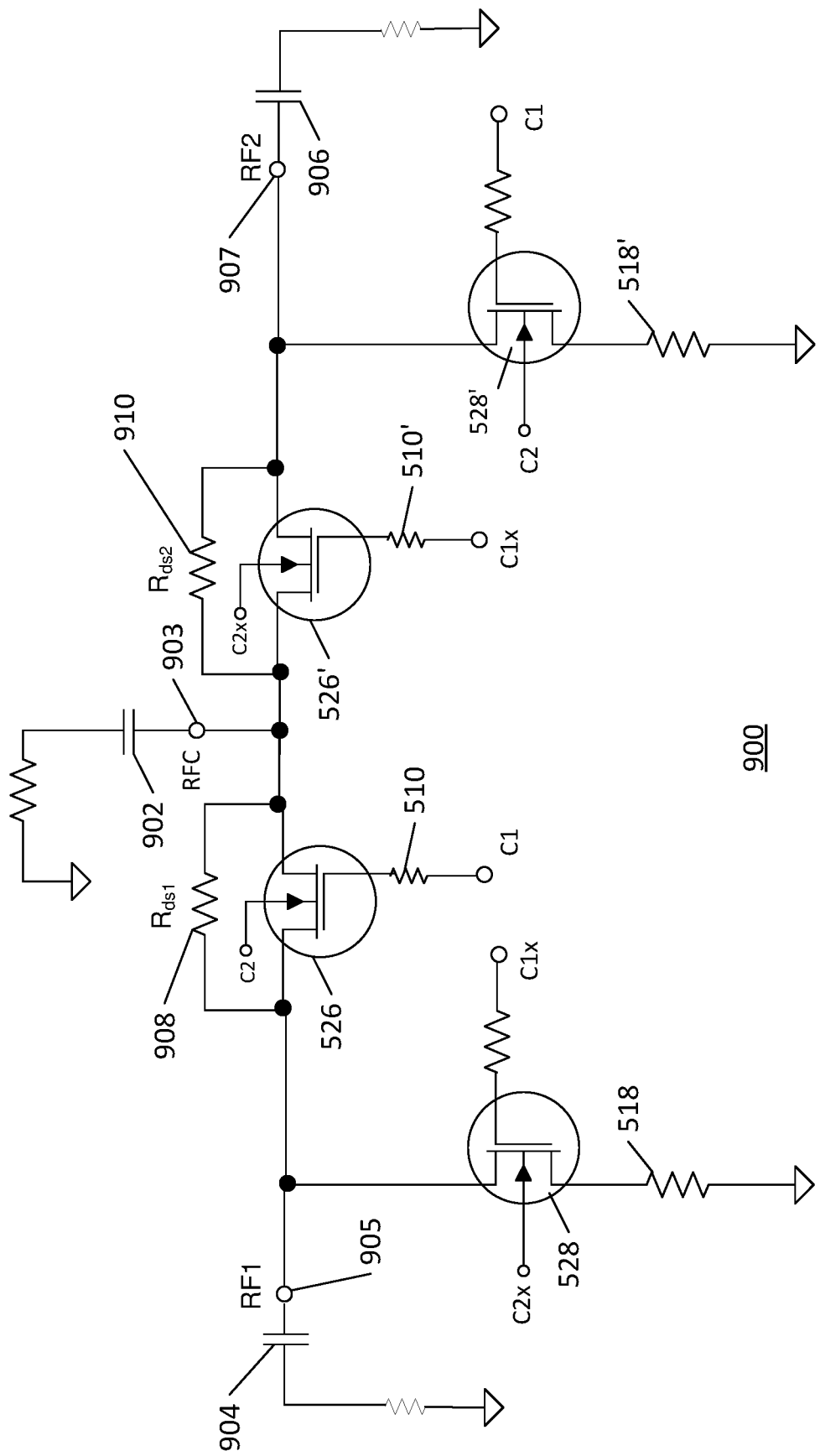
FIG. 9 shows a simplified schematic of an exemplary single-pole double-throw (SPDT) RF switch circuit made in accordance with the present disclosure, wherein drain-to-source resistors are shown across the switching ACC SOI MOSFETs.

FIGS. 8 and 9 show schematics of additional exemplary embodiments of RF switching circuits made in accordance with the disclosed method and apparatus for use in improving Linearity of MOSFETs having an ACS. As described in more detail below with reference to FIGS. 8 and 9, in some exemplary embodiments of RF switch circuits made in accordance with the present disclosure, it may be desirable to include drain-to-source resistors, $R_{ds}$, and thereby improve some switch performance characteristics when the switch is used in a particular application. These exemplary RF switch circuits are now described in more detail.

Exemplary RF Switch Implementations using Stacked Transistors having Source to Drain Resistors FIG. 8 shows one exemplary embodiment of an RF switch circuit 800 made in accordance with the present disclosure. As shown in FIG. 8, some embodiments of RF switches made in accordance with the present disclosure may include drain-to-source ($R_{ds}$) resistors electrically connected to the respective sources and drains of the ACC MOSFETs. For example, the exemplary switch 800 of FIG. 8 includes drain-to-source $R_{ds}$ resistors 802, 804, and 806 electrically connected to the respective sources and drains of the shunting ACC SOI NMOSFETs 620, 622, and 624, respectively. Motivation for use of the drain-to-source $R_{ds}$ resistors is now described.

As shall be appreciated by skilled persons from the present teachings, removal of the accumulated charge via the ACS terminal causes current to flow from the body of the ACC SOI MOSFET. For example, when a hole current flows from the body of an ACC SOI MOSFET via the ACS, an equal electron current flows to the FET source and/or drain. For some circuits (e.g., the RF switch circuit of FIG. 8), the sources and/or drains of the ACC SOI NMOSFETS are connected to other SOI NMOSFETs. Because off-state SOI NMOSFETs have a very high impedance (e.g., in the range of 1 Gohm for a 1 mm wide SOI NMOSFET), even a very small drain-to-source current (e.g., in the range of 1 nA) can result in an unacceptably large drain-to-source voltage Vds across the ACC SOI NMOSFET in satisfaction of Kirchhoff's well known current and voltage laws. In some embodiments, such as that shown in the RF switch circuits of FIGS. 8 and 9, such resultant very large drain-to-source voltages Vds undesirably impacts reliability and linearity of the ACC SOI NMOSFET. The drain-to-source resistors $R_{ds}$ provide a path between the ACC FET drain and source whereby currents associated with controlling the accumulated charge may be conducted away from the sources and drains of ACC SOI NMOSFETs when implemented in series with high impedance elements such as other ACC SOI NMOSFETs.

Exemplary operating voltages for the NMOSFETs 602-606 of FIG. 8, and the ACC NMOSFETs 620-624, may include the following: $V_{th}$ approximately zero volts, Vg, for the on-state, of +2.5 V, and Vg, for the off-state, of −2.5 V. In an exemplary embodiment, the ACC SOI NMOSFET 622 of FIG. 8 may have a width of 1 mm, and an electron-hole pair generation rate for accumulated charge producing a current of 10 pA/μm for operation in the accumulated charge regime. For the electron current supplied equally by the source and drain, and an impedance of the ACC SOI NMOSFETs 620 and 622 on the order of 1 Gohm, then an unacceptable bias of −5 V would result on the source and drain of the ACC SOI NMOSFET 622 without the presence of $R_{ds}$ resistors 802 and 806. This bias voltage would also be applied to the interior nodes of the ACC SOI NMOSFETs 620 and 624.

Even currents smaller than the exemplary currents may produce adverse affects on the operation of the RF switching circuit 800 by reducing Vgs and/or Vgd of the ACC SOI MOSFETs 620-624 in the off-state, thereby reducing the power handling capability and reliability of the circuit by increasing leakage (e.g., when either Vgs or Vgd approaches $V_{th}$), by increasing hot-carrier damage caused by excess leakage, etc. Linearity of the MOSFETs is also degraded by reducing Vgs and/or Vgd when either value approaches $V_{th}$.

Exemplary values for the $R_{ds}$ resistors 802 to 806 may be selected in some embodiments by selecting a value approximately equal to the resistance of the gate resistors 632-636 divided by the number of ACC SOI NMOSFETs in the stack (in the exemplary embodiment, there are three ACC FETs in the stack). More generally, the value of the $R_{ds}$ resistors may be equal to the gate resistor value divided by the number of ACC SOI NMOSFETs in the stack. In one example, a stack of eight ACC SOI NMOSFETs may have gate resistors of 80 kohm and $R_{ds}$ resistors of 10 kohm.

In some embodiments, the $R_{ds}$ resistors may be selected so that they do not adversely affect switch performance characteristics, such as, for example, the insertion loss of the switch 800 due to the off-state ACC SOI NMOSFETs. For example, for a net shunt resistance greater than 10 kohm, the insertion loss is increased by less than 0.02 dB.

In other embodiments, the $R_{ds}$ resistors may be implemented in circuits comprising a single ACC SOI MOSFET (as contrasted with the stacked shunting configuration exemplified in FIG. 8 by the shunting ACC FETs 620, 622 and 624). For example, such circuits may be desirable if there are other high-impedance elements configured in series with an ACC SOI MOSFET that may cause a significant bias voltage to be applied to the source or drain as a result of the current flow created when removing or otherwise controlling accumulated charge. One exemplary embodiment of such a circuit is shown in FIG. 9.

FIG. 9 shows an exemplary single-pole double-throw (SPDT) RF switch circuit 900 made in accordance with the present teachings. As shown in FIG. 9, a DC blocking capacitor 904 is connected to a first RF input node 905 that receives a first RF input signal RF1. Similarly, a DC blocking capacitor 906 is connected to a second RF input node 907 that receives a second RF input signal RF2. Further, a DC blocking capacitor 902 is electrically connected to an RF common output node 903 that provides an RF common output signal (RFC) selectively conveyed to the node RFC 903 by the switch circuit 900 from either the first RF input node 905 or the second RF input node 907 (i.e., RFC either outputs RF1 or RF2, depending upon the operation of the switch as controlled by the control signals C1 and C1x described below in more detail).

A first control signal C1 is provided to control the operating states of the ACC SOI NMOSFETs 526 and 528' (i.e., C1 selectively operates the FETs in the on-state or the off-state). Similarly, a second control signal C1x is provided to control the operating states of the ACC SOI NMOSFETs 528 and 526'. As is well known, and as described for example in the above incorporated commonly assigned U.S. Pat. No. 6,804,502, the control signals C1 and C1x are generated so that the ACC SOI NMOSFETs 526 and 528' are in an on-state when the ACC SOI NMOSFETs 528 and 526' are in an off-state, and vice versa. This configuration allows the RF switch circuit 900 to selectively convey either the signal RF1 or RF2 to the RF common output node 903.

A first ACS control signal C2 is configured to control the operation of the ACS terminals of the SOI NMOSFETs 526 and 528'. A second ACS control signal C2x is configured to control the ACS terminals of the ACC SOI NMOSFETs 528 and 526'. The first and second ACS control signals, C2 and C2x, respectively, are selected so that the ACSs of the associated and respective NMOSFETs are appropriately biased in order to eliminate, reduce, or otherwise control their accumulated charge when the ACC SOI NMOSFETs operate in an accumulated charge regime.

As shown in the RF switch circuit 900 of FIG. 9, in some embodiments, an $R_{ds}$ resistor 908 is electrically connected between the source and drain of the switching ACC NMOSFET 526. Similarly, in some embodiments, an $R_{ds}$ resistor 910 is electrically connected between the source and drain of the switching ACC NMOSFET 526'. According to this example, the circuit 900 is operated so that either the shunting ACC NMOSFET 528 or the shunting ACC NMOSFET 528' operate in an on-state at any time (i.e., at least one of the input signals RF1 at the node 905 or RF2 at the node 907 is always conveyed to the RFC node 903), thereby providing a low-impedance path to ground for the node 905 or 907, respectively. Consequently, either the $R_{ds}$ resistor 908 or the $R_{ds}$ resistor 910 provides a low-impedance path to ground from the RF common node 903, thereby preventing voltage bias problems caused as a result of ACC current flow into the nodes 903, 905 and 907 that might otherwise be caused when using the DC blocking capacitors 902, 904 and 906.

Additional Exemplary Benefits Afforded by the ACC MOSFETs of the Present Disclosure As described above, presence of the accumulated charge in the bodies of the SOI MOSFETs can adversely affect the drain-to-source breakdown voltage (BVDSS) performance characteristics of the floating body MOSFETs. This also has the undesirable affect of worsening the linearity of off-state MOSFETs when used in certain circuits such as RF switching circuits. For example, consider the shunting SOI NMOSFET 528 shown in FIG. 9. Further consider the case wherein the shunting NMOSFET 528 is implemented with a prior art SOI NMOSFET, rather than with the ACC NMOSFET made in accordance with the present teachings. Assume that the RF transmission line uses a 50-ohm system. With small signal inputs, and when the NMOSFET 528 operates in an off-state, the prior art off-state shunting NMOSFET 528 may introduce harmonic distortion and/or intermodulation distortion in the presence of multiple RF signals This will also introduce a noticeable loss of signal power.

When sufficiently large signals are input that cause the NMOSFET 528 to enter a BVDSS regime, some of the RF current is clipped, or redirected through the NMOSFET 528 to ground, resulting in a loss of signal power. This current "clipping" causes compression behavior that can be shown, for instance, in a RF switch "Pout vs. Pin" plot. This is frequently characterized by P1dB, wherein the insertion loss is increased by 1.0 dB over the small-signal insertion loss. This is an obvious indication of nonlinearity of the switch. In accordance with the present disclosed method and apparatus, removing, reducing or otherwise controlling the accumulated charge increases the BVDSS point. Increases to the BVDSS point of the NMOSFET 528 commensurately increases the large-signal power handling of the switch. As an example, for a switch, doubling the BVDSS voltage of the ACC NMOSFET increases the P1dB point by 6 dB. This is a significant accomplishment as compared with the prior art RF switch designs.

In addition, as described above in more detail, presence of the accumulated charge in SOI MOSFET body adversely impacts the magnitude of $C_{off}$ and also takes time to form when the FET is switched from an on-state to an off-state. In terms of switch performance, the nonlinearity of $C_{off}$ adversely impacts the overall switch linearity performance (as described above), and the magnitude of $C_{off}$ adversely affects the small-signal performance parameters such as insertion loss, insertion phase (or delay), and isolation. By reducing the magnitude of $C_{off}$ using the present disclosed method and apparatus, the switch (implemented with ACC MOSFETs) has reduced insertion loss due to lowered parasitic capacitance, reduced insertion phase (or delay), again due to lowered parasitic capacitance, and increased isolation due to less capacitive feedthrough.

The ACC MOSFET also improves the drift characteristic of SOI MOSFETs as pertains to the drift of the small-signal parameters over a period of time. As the SOI MOSFET takes some time to accumulate the accumulated charge when the switch is off, the $C_{off}$ capacitance is initially fairly small. However, over a period of time while operated in the accumulated charge regime, the off-state capacitance $C_{off}$ increases toward a final value. The time it takes for the NMOSFET to reach a full accumulated charge state depends on the electron-hole pair (EHP) generation mechanism. Typically, this time period is on the order of approximately hundreds of milliseconds for thermal EHP generation at room temperature, for example. During this charge-up time period, the insertion loss and insertion phase increase. Also, during this time period, the isolation deceases. As is well known, these are undesirable phenomena in standard SOI MOSFET devices. These problems are alleviated or otherwise mitigated using the ACC NMOSFETs and related circuits described above.

In addition to the above-described benefits afforded by the disclosed ACC MOSFET method and apparatus, the disclosed techniques also allow the implementation of SOI MOSFETs having improved temperature performance, improved sensitivity to Vdd variations, and improved sensitivity to process variations. Other improvements to the prior art SOI MOSFETs afforded by the present disclosed method and apparatus will be understood and appreciated by those skilled in the electronic device design and manufacturing arts.

Exemplary Fabrication Methods

In one embodiment of the present disclosure, the exemplary RF switches described above may be implemented using a fully insulating substrate silicon-on-insulator (SOI) technology. Also, as noted above, in addition to the commonly used silicon-based systems, some embodiments of the present disclosure may be implemented using silicon-germanium (SiGe), wherein the SiGe is used equivalently in place of silicon.

In some exemplary embodiments, the MOSFET transistors of the present disclosure may be implemented using "Ultra-Thin-Silicon (UTSi)" (also referred to herein as "ultrathin silicon-on-sapphire") technology. In accordance with UTSi manufacturing methods, the transistors used to implement the inventive methods disclosed herein are formed in an extremely thin layer of silicon in an insulating sapphire wafer. The fully insulating sapphire substrate enhances the performance characteristics of the inventive RF circuits by reducing the deleterious substrate coupling effects associated with non-insulating and partially insulating substrates. For example, insertion loss improvements may be realized by lowering the transistor on-state resistances and by reducing parasitic substrate conductance and capacitance. In addition, switch isolation is improved using the fully insulating substrates provided by UTSi technology. Owing to the fully insulating nature of silicon-on-sapphire technology, the parasitic capacitance between the nodes of the RF switches is greatly reduced as compared with bulk CMOS and other traditional integrated circuit manufacturing technologies.

Examples of and methods for making silicon-on-sapphire devices that can be implemented in the MOSFETs and circuits described herein, are described in U.S. Pat. No. 5,416,043 ("Minimum charge FET fabricated on an ultrathin silicon on sapphire wafer"); U.S. Pat. No. 5,492,857 ("High-frequency wireless communication system on a single ultrathin silicon on sapphire chip"); U.S. Pat. No. 5,572,040 ("High-frequency wireless communication system on a single ultrathin silicon on sapphire chip"); U.S. Pat. No. 5,596,205 ("High-frequency wireless communication system on a single ultrathin silicon on sapphire chip"); U.S. Pat. No. 5,600,169 ("Minimum charge FET fabricated on an ultrathin silicon on sapphire wafer"); U.S. Pat. No. 5,663,570 ("High-frequency wireless communication system on a single ultrathin silicon on sapphire chip"); U.S. Pat. No. 5,861,336 ("High-frequency wireless communication system on a single ultrathin silicon on sapphire chip"); U.S. Pat. No. 5,863,823 ("Self-aligned edge control in silicon on insulator"); U.S. Pat. No. 5,883,396 ("High-frequency wireless communication system on a single ultrathin silicon on sapphire chip"); U.S. Pat. No. 5,895,957 ("Minimum charge FET fabricated on an ultrathin silicon on sapphire wafer"); U.S. Pat. No. 5,920,233 ("Phase locked loop including a sampling circuit for reducing spurious side bands"); U.S. Pat. No. 5,930,638 ("Method of making a low parasitic resistor on ultrathin silicon on insulator"); U.S. Pat. No. 5,973,363 ("CMOS circuitry with shortened P-channel length on ultrathin silicon on insulator"); U.S. Pat. No. 5,973,382 ("Capacitor on ultrathin semiconductor on insulator"); and U.S. Pat. No. 6,057,555 ("High-frequency wireless communication system on a single ultrathin silicon on sapphire chip"). All of these referenced patents are incorporated herein in their entirety for their teachings on ultrathin silicon-on-sapphire integrated circuit design and fabrication.

Similarly to other bulk and SOI CMOS processes, an SOS enhancement mode NMOSFET, suitable for some embodiments of the present disclosure, may, in some embodiments, be fabricated with a p-type implant into the channel region with n-type source and drain regions, and may have a threshold voltage of approximately +500 mV. The threshold voltage is directly related to the p-type doping level, with higher doping resulting in higher thresholds. Similarly, the SOS enhancement mode PMOSFET may, in some exemplary embodiments, be implemented with a n-type channel region and p-type source and drain regions. Again, the doping level defines the threshold voltage with higher doping resulting in a more negative threshold.

In some exemplary embodiments, an SOS depletion-mode NMOSFET, suitable for some embodiments of the present disclosure, may be fabricated by applying the p-type channel-implant mask to the n-type transistor, resulting in a structure that has n-type channel, source, and drain regions and a negative threshold voltage of approximately −500 mV. Similarly, in some exemplary embodiments, a suitable depletion-mode PMOSFET may be implemented by applying the n-type channel-implant mask to the p-type transistor, resulting in a structure that has p-type channel, source, and drain regions and a positive threshold voltage of approximately +500 mV.

A reference relating to the fabrication of enhancement-mode and depletion-mode transistors in SOS is "CMOS/SOS/LSI Switching Regulator Control Device," Orndorff, R. and Butcher, D., Solid-State Circuits Conference, Digest of Technical Papers, 1978 IEEE International, Volume XXI, pp. 234-235, February 1978. The "Orndorff" reference is hereby incorporated in its entirety herein for its techniques on the fabrication of enhancement-mode and depletion-mode SOS transistors.

Embodiments of Methods and Apparatuses for Improving Gate Oxide Reliability in Accordance with the Present CIP The present CIP describes methods and devices for improving gate oxide reliability of SOI MOSFETs using ACC techniques to control accumulated charge and the adverse effects thereof. Persons skilled in the arts of electronic devices will appreciate that the teachings herein apply equally to NMOSFETs and PMOSFETs. For simplicity, the embodiments and examples presented herein for illustrative purposes include only NMOSFETs, unless otherwise noted. By making well known changes to dopants, charge carriers, polarity of bias voltages, etc., persons skilled in the arts of electronic devices will easily understand how these embodiments and examples may be adapted for use with PMOSFETs.

Impact of Accumulated Charge on Gate Oxide Reliability

Referring to FIG. 1, the inventors have observed that the accumulated charge 120 has an adverse effect on the reliability of the gate oxide 110. This is a novel observation not known according to prior art. The adverse effects are caused by electric field lines from the gate 108 (due to the bias voltages Vg, Vs and Vd) primarily terminating at the accumulated charge 120. If the accumulated charge 120 is not present, the electric field lines from the gate 108 terminate at the boundaries of the undepleted regions of the source 112 and the drain 116. The depletion regions 122 and 124 move the boundaries of the undepleted regions in the source 112 and the drain 116 away from the gate oxide. Thus, when the accumulated charge 120 is present the electric field stress on the gate oxide is much larger than when the accumulated charge 120 is prevented from forming, removed, reduced, or otherwise controlled.

Reduction or otherwise control of the accumulated charge therefore enables use of larger bias voltages for a given thickness of the gate oxide 110. Alternatively, reduction or control of the accumulated charge enables use of reduced gate oxide 110 thickness for given bias voltages. A combination of larger bias voltages and reduced gate oxide 110 thickness is also enabled by control of the accumulated charge. Larger bias voltages allow larger input voltages in the transition off-state, thereby improving power handling capability. Reduced gate oxide thickness provides improved insertion loss, thereby allowing either improvements in power handling capability, or an option of using smaller SOI NMOSFETs to control a given power level.

Although many of the examples herein relate to RF switches, persons skilled in the arts of electronic circuits will understand that the present teachings may also be applied to RF mixers, power amplifiers, level shifting circuits, negative voltage generators, oscillators, DC-DC converters and other circuits that employ SOI MOSFETs. In particular, persons skilled in the arts of RF circuits will readily understand how the present teachings may be implemented for RF power amplifiers such as described in the following U. S. Patent Applications: "STACKED TRANSISTOR METHOD AND APPARATUS," application Ser. No. 10/875,405, filed Jun. 23, 2004, pending (Docket. No. PER-006-PAP); and "INTEGRATED RF FRONT END," application Ser. No. 11/158, 597 (CIP of application Ser. No. 10/875,405, filed Jun. 23, 2004), filed Jun. 22, 2005, pending (Docket. No. PER-006-CIP). These cited applications are commonly owned by the assignee of the present application, and are hereby fully incorporated by reference herein, as though set forth in full for teachings on using SOI MOSFETs for RF power amplifiers.

Accumulated Charge Control Using Bias Voltage Pulses

In one embodiment, applying bias voltage pulses comprises an ACC technique that may be used to control the accumulated charge 120. Referring again to FIG. 1, as described above, the accumulated charge 120 results from a slow electron-hole pair generation process that occurs when the gate bias voltage Vg is negative with respect to the source bias voltage Vs and the drain bias voltage Vd. If a positive voltage pulse above $V_{th}$ is applied to the gate terminal 104, an conducting channel comprising electrons is formed in the body 114 proximate the gate oxide 110, and the accumulated charge 120 is dissipated due to drift and recombination. When the gate bias voltage Vg returns to the negative bias level present prior to the application of the positive voltage pulse, the accumulated charge 120 regenerates in a time period having a time scale that is typically in the millisecond range or longer. Consequently, the accumulated charge 120 may be controlled by applying a series of positive voltage pulses to the gate terminal 104, repeated at a rate that is sufficient to prevent the accumulated charge 120 from accumulating.

Accumulated Charge Control Using RF Signal Voltage

In one embodiment, an applied RF signal voltage comprises an ACC technique. According to this embodiment, an NMOSFET is operated with a large series resistor electrically connected to the gate in series with the gate bias source (as described below in reference to FIG. 5A). The gate resistor is sufficiently large that the AC gate voltage tracks the AC drain voltage signal at one-half the amplitude of the quickly-varying drain voltage. This occurs because the gate is coupled to the drain and source by parasitic capacitors (e.g., by capacitors 202 and 204 of FIG. 2A). Thus, a high-frequency drain voltage signal may be coupled to the gate, and the resulting gate voltage further coupled to the source, thereby dividing the voltage on the gate by a factor of two, providing that the gate resistance is sufficiently large that it does not shunt or attenuate the resulting high-frequency AC voltage induced on the gate. For example, if an applied gate bias of −2.5 V is placed on a switch gate with large series resistor, the gate voltage will vary around the −2.5 V bias level in response to an applied AC drain signal. If a 2 V amplitude high-frequency signal (i.e., a 4 V peak-to-peak RF signal) is applied to the drain as Vd, the gate voltage will be moved from the quiescent level of −2.5 V to −1.5 V at a maximum and to −3.5 V at a minimum. When the gate voltage moves to −1.5 V, the accumulated charge moves toward the level that would be present in equilibrium at −1.5 V, through diffusion to the source and drain, where the accumulated holes recombine with the large concentrations of electrons. Alternatively, the accumulated charge may recombine by other processes with other electron sources. When the gate voltage moves more negative, the accumulated charge will increase, but the time spent at the more negative voltage is too short for the accumulated charge to increase significantly before the voltage moves less negative again. I.e., the recombination process at the less negative voltage will occur more rapidly than at more negative voltages, while the generation process is largely independent of voltage. Consequently, under the dynamic conditions of the present example, the net effect of the AC voltage swing in the gate voltage is to reduce the effective level of accumulated charge relative to what it would be absent the AC signal. After many cycles of RF swing, a steady-state accumulated charge level will be present that is significantly less than would be present at the DC gate bias voltage of −2.5 V. According to the present example the effective accumulated charge may be approximately at the level that would be present for an effective gate bias of −1.5 V.

RF Switch Circuits Adapted for Improved Oxide Reliability Using Bias Voltage Pulses FIG. 5A shows a schematic diagram of a single pole, single throw (SPST) RF switch circuit 500 that may be adapted to control accumulated charge and improve gate oxide reliability, in accordance with the present CIP. In particular, as described below, the RF switch circuit 500 may be operated using bias voltage pulse techniques to reduce or otherwise control accumulated charge. The RF switch circuit 500 is one example of a general class of well-known RF switch circuits. Similar RF switch circuits are described in the following co-pending and commonly assigned U. S. Applications and Patent: Provisional Application No. 60/651,736, filed Feb. 9, 2005, entitled "UNPOWERED SWITCH AND BLEEDER CIRCUIT;" application Ser. No.

10/922,135, filed Aug. 18, 2004, pending, which is a continuation application of application Ser. No. 10/267,531, filed Oct. 8, 2002, which issued Oct. 12, 2004 as U.S. Pat. No. 6,804,502, entitled "SWITCH CIRCUIT AND METHOD OF SWITCHING RADIO FREQUENCY SIGNALS". Application Ser. No. 10/267,531, filed Oct. 8, 2002, which issued Oct. 12, 2004 as U.S. Pat. No. 6,804,502 claims the benefit of U.S. Provisional Application No. 60/328,353, filed Oct. 10, 2001. All of the above-cited applications and issued patent set forth above are hereby incorporated by reference herein as if set forth in full for their teachings on RF switch circuits including SOI MOSFET switch circuits.

Referring again to FIG. 5A, an SOI NMOSFET 506 is adapted to receive an RF input signal "RFin" at an input terminal 502. The SOI MOSFET 506 is electrically coupled to selectively couple the RFin input signal to an output terminal 504 (i.e., thereby convey an RF output signal Rfout at the output terminal 504). In the exemplary embodiment, the SOI NMOSFET 506 is controlled by a first control signal C1 that is conveyed by a control line 512 through a gate resistor 510 (optionally included for suppression of parasitic RF coupling). The control line 512 is electrically coupled to a control circuit 520, which generates the first control signal C1.

Referring again to FIG. 5A, an SOI NMOSFET 508 is adapted to receive the RF input signal RFin at its drain terminal, and to selectively shunt the input signal RFin to ground via an optional load resistor 518. The SOI NMOSFET 508 is controlled by a second control signal C1x which is conveyed by a control line 516 through a gate resistor 514 (optionally included for suppression of parasitic RF coupling and for purposes of voltage division). The control line 516 is electrically coupled to the control circuit 520, which generates the second control signal C1x.

The first and second control signals, C1 and C1x, respectively, are generated so that the SOI NMOSFET 506 operates in an on-state when the SOI NMOSFET 508 operates in an off-state, and vice versa. These control signals provide the gate bias voltages Vg to the gate terminals of the NMOSFETs 506 and 508. When either of the NMOSFETs 506 or 508 is biased to select the transistor off-state, the respective Vg must comprise a sufficiently large negative voltage so that the respective NMOSFET does not enter, or approach, an on-state due to the time varying applied voltages of the RF input signal RFin. The maximum power of the RF input signal RFin is thereby limited by the maximum magnitude of the gate bias voltage Vg (or, more generally, the gate-to-source operating voltage, Vgs) that the SOI NMOSFETs 506 and 508 can reliably sustain. For RF switching circuits such as those exemplified herein, Vgs(max)=Vg+Vds(max)/2, where Vds=Vd−Vs, and Vds(max) comprises the maximum Vds due to the high-power input signal voltage levels associated with the RF input signal RFin.

The power that can be accommodated by the SOI NMOSFETs 506, 508 is limited by insertion loss. Insertion loss can be improved by reducing gate oxide thicknesses. Therefore, as described above, the power handling performance of the SOI NMOSFETs 506, 508 can be improved using the ACC techniques of the present disclosure which allow implementation of SOI MOSFETs having thinner gate oxides. Persons skilled in the electronic device and circuit design arts shall appreciate that an appropriate combination of higher bias voltages and reduced gate oxide thicknesses can be used to improve circuit performance.

Exemplary bias voltages for the SOI NMOSFETs 506 and 508 may include the following: with $V_{th}$ approximately zero volts, Vg, for the on-state, of +2.5 V, and Vg, for the off-state, of −2.5 V. For these bias voltages, the SOI NMOSFETs may eventually operate in an accumulated charge regime when placed into their off-states. As described above in reference to FIG. 1, the maximum magnitude for the gate bias voltage Vg (or more generally, Vgs) that can be reliably sustained can be significantly improved by using the accumulated charge control techniques of the present disclosure.

Accumulated charge control may be implemented by pulsing bias voltages applied to the gates of the SOI NMOSFETs 506, 508. In reference to FIG. 5A, the control signals C1 and C1x may be selectively controlled by the control circuit 520 to provide such bias voltage pulses to the gates of the SOI NMOSFETs 506, 508. Any suitable method and components can be used to provide the bias voltage pulses. In an exemplary embodiment, a pulse generation circuit is used to generate all signals required to control the pulse process.

The gate bias voltage pulses are provided at any suitable magnitude, interval, and duration in order to reduce accumulated charge to the desired level. It is to be understood that each of these variables is dependent on the others and can be altered according to the application and preference of IC designer. For example, an individual IC may be capable of generating different pulses at different time periods and depending on any of a number of predetermined factors. By different, it is meant that the pulses may be of different magnitudes, intervals, durations, or a combination thereof. While a number of external factors can influence the nature of applied pulses according to the disclosure, recognize that one factor relevant thereto is the operating temperature of the SOI NMOSFET. At higher operating temperatures, accumulated charge builds up more rapidly. Thus, more frequent pulsing may be desirable under such conditions.

In one embodiment, a gate bias voltage pulse is applied to an off-state FET to force the FET toward an on-state. Although this gate bias voltage pulse need not exceed the threshold voltage ($V_{th}$) of the FET, exceeding $V_{th}$ is an exemplary embodiment of the present disclosure. The magnitude of the gate bias voltage pulse may be fixed or variable. For simplicity, a pulse of a fixed magnitude, to exceed $V_{th}$ by a selected value (e.g., the pulse voltage may have a maximum value of $V_{th}$+0.5 V) may be used in an exemplary embodiment.

The magnitude of the pulsed gate voltage impacts the pulse duration needed to achieve the desired effects and vice versa. In one embodiment, the FET is pulsed for a duration of approximately 5 µs or less. This meets the GSM standard switching time requirements and further provides for preferred switching times of from 1 µs to 5 µs.

At the end of a gate bias voltage pulse, the FET is maintained in an off-state by the control signal. The time period for which the FET is maintained in the off-state varies depending on the application and on the pulsed gate bias voltage applied during the last pulse. In order to control the electric field stress in the gate oxide, it is desirable to apply the gate bias pulses at a sufficient frequency to prevent a build-up of accumulated charge proximate to the gate oxide. For example, if it is known that the accumulated charge build-up time is on the order of 100 mS or more, a repetition interval for the gate bias voltage pulses may be selected to be on the order of 10 mS or less.

RF Switch Circuits Adapted for Improved Oxide Reliability Using RF Signal Voltage In another embodiment, an RF signal voltage may be used as an ACC technique. When the SOI NMOSFETs 506 and 508 are in the off-state with the exemplary applied gate bias of −2.5 V, the gate voltage will vary around the −2.5 V bias level in response to an applied AC drain signal because the resistors 510 and 514 (these resistors may have exemplary values of 10 kohm) allow the gate voltages to track the AC drain signal at one-half amplitude as described above. If a 2 V amplitude high-frequency signal (i.e., a 4 V peak-to-peak RF signal) is applied to the drain of one of the SOI NMOSFETs 506 or 508 in the off-state as Vd, the gate voltage will be moved from the quiescent level of −2.5 V to −1.5 V at a maximum and to −3.5 V at a minimum. When the gate voltage moves to −1.5 V, the accumulated charge moves toward the level that would be present in equilibrium at −1.5 V, through diffusion to the source and drain, where the accumulated holes recombine with the large concentrations of electrons. Alternatively, the accumulated charge may recombine by other processes with other electron sources. When the gate voltage moves more negative, the accumulated charge will increase, but the time spent at the more negative voltage is too short for the accumulated charge to increase significantly before the voltage moves less negative again. I.e., the recombination process at the less negative voltage will occur more rapidly than at more negative voltages, while the generation process is largely independent of voltage. Consequently, under the dynamic conditions of the present example, the net effect of the AC voltage swing in the gate voltage is to reduce the effective level of accumulated charge relative to what it would be absent the AC signal. After many cycles of RF swing, a steady-state accumulated charge level will be present that is significantly less than would be present at the DC gate bias voltage of −2.5 V. According to the present example the effective accumulated charge may be approximately at the level that would be present for an effective gate bias of −1.5 V.

Circuits Adapted for Improved Oxide Reliability Using ACC MOSFETs

In one embodiment, circuits having ACC SOI MOSFETs may be adapted for improved oxide reliability in accordance with the present CIP. The use of ACC SOI MOSFETs to control accumulated charge in RF switch circuits is described above in reference to FIGS. 5B-5D and FIG. 6, FIG. 8, and FIG. 9. The ACC techniques as described in reference to these figures may also be adapted to improve gate oxide reliability, as described below in reference to FIG. 10. In other embodiments, the exemplary circuit including the ACC SOI MOSFET may include, without limitation, an RF mixer, a power amplifier, a level shifting circuit, a negative voltage generator, an oscillator, a DC-DC converter or other circuit using SOI MOSFETs.

Methods for Using ACC Techniques to Improve Gate Oxide Reliability

Figure 10A:
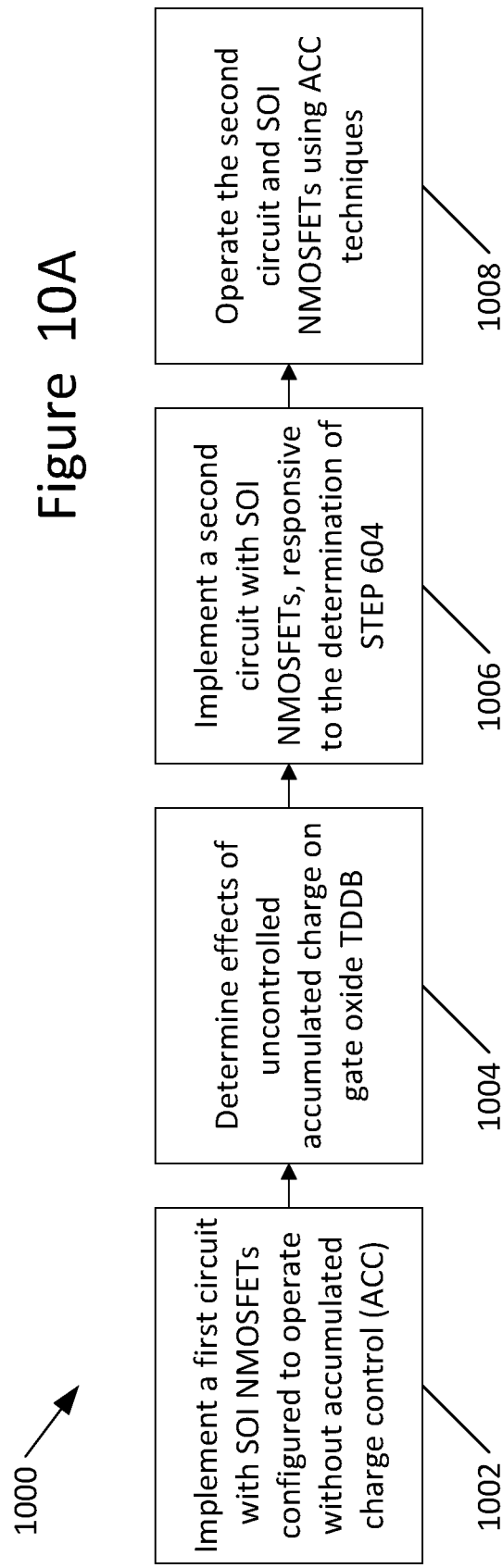
FIG. 10A is a flow chart of a first embodiment of a method of implementing SOI MOSFETs to improve gate oxide reliability using the accumulated charge control techniques of the present disclosure.

FIG. 10A is a flow chart of a method 1000 of implementing SOI MOSFETs using the ACC techniques of the present disclosure. At a STEP 1002, a first circuit including one or more SOI NMOSFETs is implemented to perform circuit functions according to the prior art (i.e., without ACC).

At a STEP 1004, the reliability of the gate oxides of the SOI NMOSFETs is determined with and without ACC. In one embodiment, the gate oxide reliability is determined by performing time dependent dielectric breakdown (TDDB) measurements on test SOI NMOSFETs corresponding to the SOI NMOSFETs included in the first circuit. The TDDB measurements provide information relating to the lifetime of the SOI NMOSFETs due to gate oxide breakdown. The results of the TDDB measurements indicate a maximum electric field, "$E_{tb}$", in the oxide that can be sustained and yet still achieve a desired lifetime (i.e., an average "time-to-breakdown" or "tb") for the SOI NMOSFETs. With a given value for $E_{tb}$, minimum gate oxide thicknesses and maximum bias voltages required to achieve the desired lifetime can be determined, as described below. The results of the TDDB measurements may also indicate a maximum gate-to-source bias voltage $V_{gs}$, that can be sustained and yet still achieve a desired lifetime for the SOI NMOSFETs. TDDB measurements are well known to persons skilled in the electronic device arts. Examples of TDDB measurement techniques are described in the above-incorporated paper by C. Hu and Q. Lu, the reference by Suchle and Chaparala, and reference by R. Bolam.

Reliability of the gate oxides is further determined with and without ACC by performing TDDB measurements of the SOI NMOSFETs operating with selected bias voltages. The measurement results provide information relating to the improved TDDB present in the gate oxides for selected bias conditions and gate oxide thicknesses. In one example of a TDDB measurement of an SOI NMOSFET, using a first gate bias $V_{g1}$=−10 V, Vs=0 V, Vd=0 V, and a gate oxide thickness $T_{ox1}$ of 8.2 nm, an average time to failure of 500 seconds was determined without ACC. With ACC, the same average time to failure of 500 seconds required $V_{g2}$ of −14V. Thus, according to this example, using ACC enables using a second $V_{g2}$ that is increased by a factor of approximately 40% over $V_{g1}$, while maintaining an equivalent TDDB lifetime. Alternatively, using ACC enables using a second $T_{ox2}$ that is equal to $T_{ox1}$ multiplied by a factor of approximately 1/1.4, without an adverse effect on TDDB lifetime.

Referring again to the method 1000 of FIG. 10A, at a STEP 1006, a second circuit, performing the same function as the first circuit, is implemented using ACC, responsive (as described in more detail below) to the determination of the reliability of the gate oxides obtained at the previous STEP 1004. In one embodiment, the second circuit may include an ACC SOI NMOSFET having an ACS, operatively coupled to elements within the second circuit according to the teachings above. In another embodiment, the ACC technique may include use of bias voltage pulse techniques, as described above in reference to FIG. 5A. The SOI NMOSFETs in the second circuit may incorporate a reduced thickness for their gate oxides, smaller body widths, or any combination thereof. Further, the second circuit may also be configured to include a lesser plurality of SOI NMOSFETs. For example, the plurality of SOI NMOSFETs included in a stacked RF switch circuit in the second circuit may be less than the plurality of SOI MOSFETs in the corresponding stack of the first circuit.

At a STEP 1008, the second circuit is operated using the present ACC techniques, as described above. In one embodiment, the second circuit may comprise an RF switch operated at higher RF power levels than the first circuit.

Figure 10B:
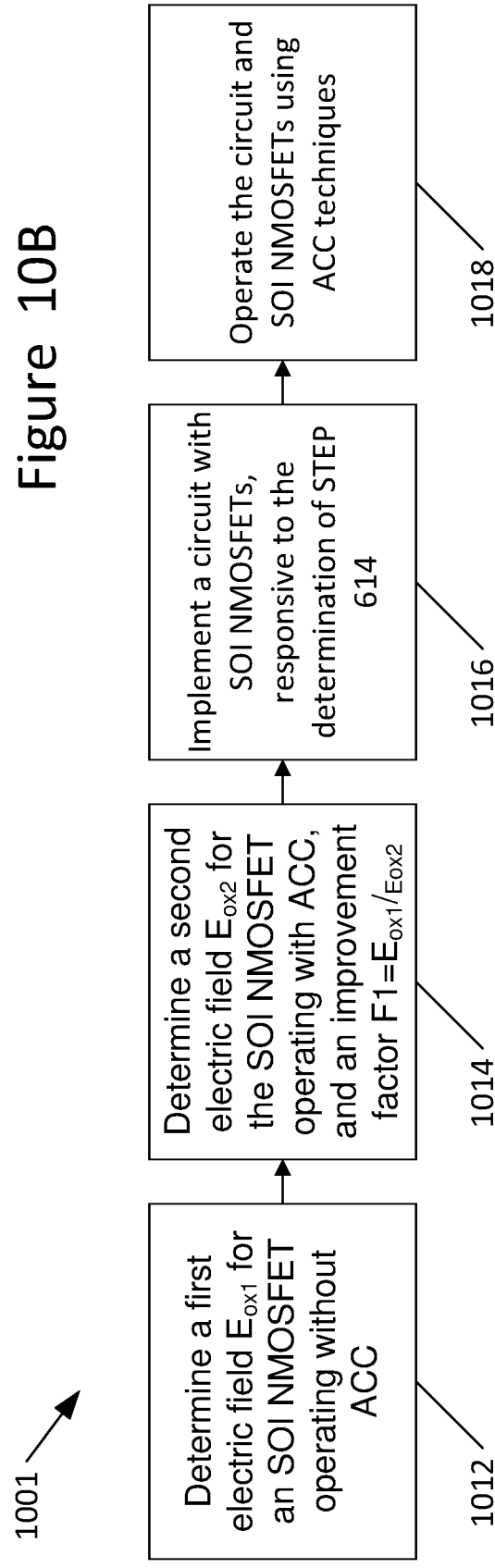
FIG. 10B is a flow chart of a second embodiment of a method of implementing SOI MOSFETs to improve gate oxide reliability using the accumulated charge control techniques of the present disclosure.

FIG. 10B is a flow chart of another embodiment of a method 1001 of implementing SOI MOSFETs using the ACC techniques of the present disclosure. At a STEP 1012, a maximum electric field in the oxide, "$E_{ox1}$", is determined using well known simulation techniques (e.g., using "Medici" simulation techniques, etc.) for an SOI NMOSFET having a given oxide thickness Tox, operated without ACC. Bias voltages for Vg, Vs and Vd are selected to correspond to a circuit implementation including the SOI NMOSFET operating in the off-state. In one example, set forth above, the following values may be selected: Vg=−5 V; Vs=0 V; Vd=0 V; and a gate oxide thickness Tox of 8.2 nm. Using these selected values, for example, a maximum electric field $E_{ox1}$=4.3 MV/cm is determined in the gate oxide for an uncontrolled accumulated charge.

Referring to the method 1001 of FIG. 10B, at a STEP 1014, a maximum electric field in the oxide, "$E_{ox2}$", is determined for the SOI NMOSFET, operated with ACC, using the same selected bias voltages used in accordance with the STEP 1012. For the illustrated example, for an accumulated charge controlled to zero value, a maximum electric field "$E_{ox2}$" of 2.1 MV/cm is determined. An improvement factor "F1", is defined according to the following expression:

$$F1 = E_{ox1}/E_{ox2}.$$

At a STEP 1016, a circuit including the SOI NMOSFET is implemented responsive to the improvement factor F1. In one embodiment of the disclosed method, the circuit is implemented by selecting a maximum gate-to-source operating voltage Vgs for the off-state and Tox in accordance with the following equation:

$$Vgs(\max)/Tox = F1 \cdot E_{tb}; \tag{1}$$

wherein $E_{tb}$ comprises the maximum oxide electric field for which a given TDDB lifetime of the SOI NMOSFET can be obtained (e.g., ~5 MV/cm for a lifetime of 10 years is a "rule of thumb" value). More generally, the SOI NMOSFET bias voltages, maximum signal voltages, and gate oxide thicknesses can be selectively improved using the ACC techniques of the present teachings. These improvements over the prior art SOI NMOSFET devices are provided according to the improvement factor F1, as shall be readily appreciated by persons skilled in the electronic device design arts. Finally, at a STEP 1018, the circuit is operated using ACC techniques as described above.

Figure 10C:
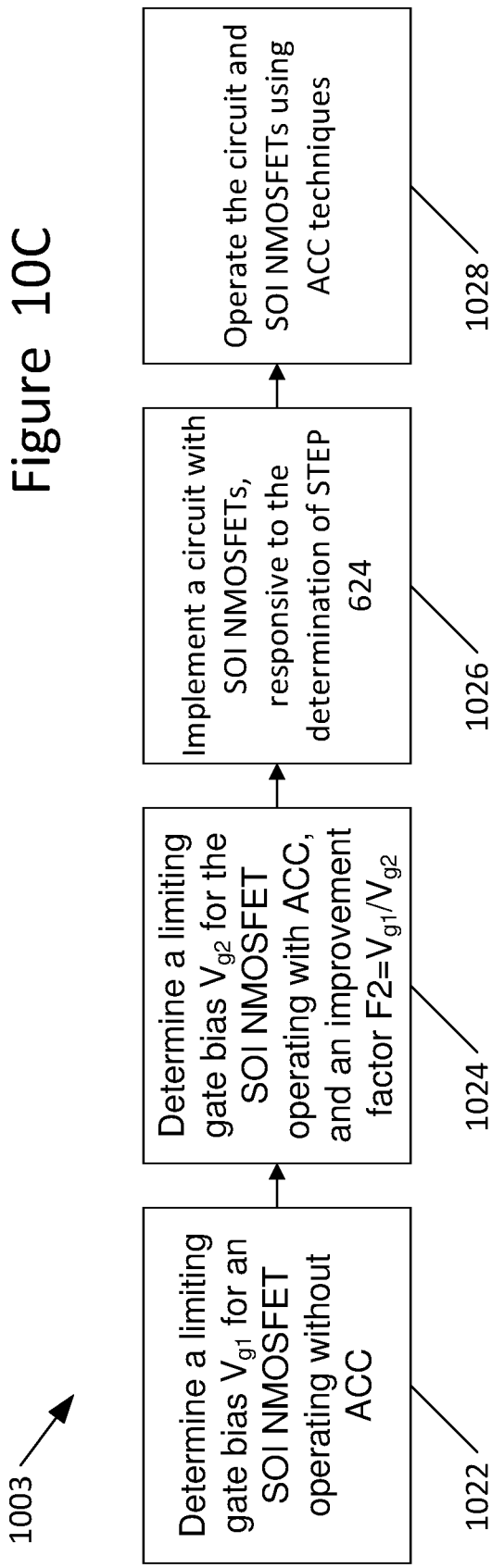
FIG. 10C is a flow chart of a third embodiment of a method of implementing SOI MOSFETs to improve gate oxide reliability using the accumulated charge control techniques of the present disclosure.

FIG. 10C is a flow chart of another embodiment of a method 1003 of implementing SOI MOSFETs using the present ACC techniques. At a STEP 1022, a limiting gate bias voltage, "$V_{g1}$", is determined using TDDB measurements for an SOI NMOSFET having a given oxide thickness, Tox, operated in the off-state without ACC. For example, for Vd=Vs=0, the limiting gate bias voltage $V_{g1}$ represents the most negative gate bias that can be sustained to obtain a desired operating lifetime without ACC.

At a STEP 1024, a limiting gate bias voltage $V_{g2}$ is determined using TDDB measurements for the SOI NMOSFET having an oxide thickness Tox, operated in the off-state with ACC. For example, for Vd=Vs=0, the limiting gate bias voltage $V_{g2}$ represents the most negative gate bias that can be sustained to obtain a desired operating lifetime with ACC. An improvement factor F2 is defined according to the following expression: $F2=V_{g1}/V_{g2}$.

At a STEP 1026, a circuit including the SOI NMOSFET is implemented responsive to the improvement factor, F2. In one embodiment of the inventive method, the circuit is implemented by selecting a maximum gate-to-source operating voltage Vgs for the off-state and Tox according to the following equation:

$$Vgs(\max)/Tox = F2 \cdot E_{tb} \tag{2}$$

More generally, the SOI NMOSFET bias voltages, maximum signal voltages, and gate oxide thicknesses can be selectively improved over the prior art according to the improvement factor F2, as shall be readily appreciated by persons skilled in the electronic device arts. Referring again to FIG. 10C, at a STEP 1028, as described above, the method terminates by operating the circuit using the disclosed ACC techniques.

A number of embodiments of the present inventive concept have been described. Nevertheless, it will be understood that various modifications may be made without departing from the scope of the inventive teachings. For example, it should be understood that the functions described as being part of one module may in general be performed equivalently in another module.

Accordingly, it is to be understood that the concepts described herein are not to be limited by the specific illustrated embodiments, but only by the scope of the appended claims.

What is claimed is:

1. A system comprising:
   a first port;
   a second port;
   a third port;
   a switch configured to selectively provide a signal received at the first port to the second port or the third port based on a first switch control signal and a second switch control signal, wherein the switch comprises:
   a first transistor coupled between the first port and the second port and configured to be in an on state or an off state based on the first switch control signal, wherein the switch is configured to provide the signal received at the first port to the second port via at least the first transistor; and
   a second transistor coupled between the first port and the third port and configured to be in an on state or an off state based on the second switch control signal, wherein the switch is configured to provide the signal received at the first port to the third port via at least the second transistor; and
   a first accumulated charge sink (ACS) coupled to the first transistor and configured to receive a first bias signal during at least a portion of a duration when the first transistor is in the off state to prevent charge from accumulating in a body of the first transistor.

2. The system of claim 1, wherein the signal is a radio frequency (RF) signal, wherein the switch is configured to provide the signal received at the first port to the second port via at least the first transistor when the first transistor is in the on state and the second transistor is in the off state.

3. The system of claim 1, wherein the switch is configured to provide the signal received at the first port to the third port via at least the second transistor when the first transistor is in the off state and the second transistor is in the on state.

4. The system of claim 1, further comprising a second ACS coupled to the second transistor and configured to receive a second bias signal during at least a portion of a duration when the second transistor is in the off state to prevent charge from accumulating in a body of the second transistor, and wherein the first port is an input port of the system, the second port is an output port of the system, and the third port is connected to ground.

5. The system of claim 1, wherein the first ACS is coupled to a gate and the body of the first transistor.

6. The system of claim 1, wherein the first bias signal has a voltage level equal to or more negative than a voltage level of a bias signal applied to a source of the first transistor and a voltage level of a bias signal applied to a drain of the first transistor.

7. The system of claim 1, wherein, during the portion of the duration, the first transistor is configured to be electrically biased to have a voltage level substantially more negative than a lowest voltage level of the following: ground, a voltage level associated with a source of the first transistor, and a voltage level associated with a drain of the first transistor.

8. The system of claim 1, further comprising a semiconductor-on-insulator substrate, wherein the switch is formed in a layer of semiconductor material.

9. The system of claim 1, wherein the switch further comprises at least one additional transistor, wherein the first transistor and the at least one additional transistor are coupled together in a stacked configuration, and wherein the stacked configuration is coupled between the first port and the second port.

10. The system of claim 1, wherein the switch further comprises at least one additional transistor, and wherein the second transistor and the at least one additional transistor are coupled together in a stacked configuration.

11. The system of claim 1, further comprising a diode coupled between the first ACS and a gate of the first transistor.

12. A method comprising:
selectively providing a signal received at a first port to a second port or a third port based on a first switch control signal and a second switch control signal, wherein the selectively providing comprises:
selectively providing the signal received at the first port to the second port via at least a first transistor, wherein the first transistor is coupled between the first port and the second port and is in an on state or an off state based on the first switch control signal; and
selectively providing the signal received at the first port to the third port via at least a second transistor, wherein the second transistor is coupled between the first port and the third port and is in an on state or an off state based on the second switch control signal; and
receiving, by a first accumulated charge sink (ACS) coupled to the first transistor, a first bias signal during at least a portion of a duration when the first transistor is in the off state to prevent charge from accumulating in a body of the first transistor.

13. The method of claim 12, wherein the selectively providing the signal received at the first port to the second port comprises selectively providing the signal received at the first port to the second port via the first transistor and at least one additional transistor, and wherein the charge is associated with carriers having a polarity opposite a polarity of carriers associated with a source of the first transistor and a drain of the first transistor.

14. The method of claim 12, further comprising receiving, by a second ACS coupled to the second transistor, a second bias signal during at least a portion of a duration when the second transistor is in the off state to prevent charge from accumulating in a body of the second transistor, wherein the first port is an input port, the second port is an output port, and the third port is connected to ground.

15. The method of claim 12, further comprising preventing current flow into the body of the first transistor when the first transistor is in the on state.

16. The method of claim 12, wherein the signal is a radio frequency (RF) signal.

17. A system comprising:
means for selectively providing a signal received at a first port to a second port or a third port based on a first switch control signal and a second switch control signal received by the means for selectively providing, wherein the means for selectively providing the signal comprises:
means for selectively providing the signal received at the first port to the second port based on the first switch control signal; and
means for selectively providing the signal received at the first port to the third port based on the second switch control signal; and
means for accumulated charge sinking to prevent charge from accumulating in a first portion of the means for selectively providing the signal received at the first port to the second port based on a first bias signal received during at least a portion of a duration when the first portion is associated with an off state.

18. The system of claim 17, further comprising means for accumulated charge sinking to prevent charge from accumulating in a second portion of the means for selectively providing the signal received at the first port to the third port based on a second bias signal received during at least a portion of a duration when the second portion is associated with an off state.

19. The system of claim 17, further comprising means for preventing current flow into the first portion when the first portion is associated with the on state.

20. The system of claim 17, wherein the signal is a radio frequency (RF) signal.

* * * * *